(12) United States Patent
Yoshida et al.

(10) Patent No.: US 11,990,434 B2
(45) Date of Patent: May 21, 2024

(54) SEMICONDUCTOR DEVICE AND METHOD OF MANUFACTURING SEMICONDUCTOR DEVICE

(71) Applicant: ROHM CO., LTD., Kyoto (JP)

(72) Inventors: Kazuki Yoshida, Kyoto (JP); Hajime Kataoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/714,830

(22) Filed: Apr. 6, 2022

(65) Prior Publication Data

US 2022/0328437 A1 Oct. 13, 2022

(30) Foreign Application Priority Data

Apr. 9, 2021 (JP) ................................. 2021-066371

(51) Int. Cl.
*H01L 23/00* (2006.01)
*H01L 23/31* (2006.01)
*H01L 23/495* (2006.01)

(52) U.S. Cl.
CPC .......... *H01L 24/05* (2013.01); *H01L 23/3107* (2013.01); *H01L 23/49513* (2013.01); *H01L 23/4952* (2013.01); *H01L 23/49524* (2013.01); *H01L 23/49562* (2013.01); *H01L 24/03* (2013.01); *H01L 2224/02166* (2013.01); *H01L 2224/02181* (2013.01); *H01L 2224/02185* (2013.01); *H01L 2224/0219* (2013.01); *H01L 2224/03013* (2013.01); *H01L 2224/03848* (2013.01); *H01L 2924/07025* (2013.01)

(58) Field of Classification Search
None
See application file for complete search history.

(56) References Cited

U.S. PATENT DOCUMENTS

2020/0373227 A1* 11/2020 Futamura ................ H01L 24/06
2021/0336017 A1* 10/2021 Ueda .................... C23C 18/1642

FOREIGN PATENT DOCUMENTS

JP 2005-72253 A 3/2005

* cited by examiner

*Primary Examiner* — Nishath Yasmeen
(74) *Attorney, Agent, or Firm* — XSENSUS LLP

(57) ABSTRACT

A semiconductor device includes: a semiconductor element that includes an element main body having an element main surface facing one side in a thickness direction, and a first electrode arranged on the element main surface; a first insulating layer that is arranged over a peripheral edge portion of the first electrode and the element main surface and includes a first annular portion formed in an annular shape when viewed in the thickness direction; and a second insulating layer that is laminated on the first insulating layer, is made of a resin material, and includes a second annular portion overlapping with the first annular portion when viewed in the thickness direction.

16 Claims, 35 Drawing Sheets

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2021-066371, filed on Apr. 9, 2021, the entire contents of which are incorporated herein by reference.

TECHNICAL FIELD

The present disclosure relates to a semiconductor device and a method of manufacturing the semiconductor device.

BACKGROUND

Various configurations have been proposed for semiconductor devices equipped with semiconductor elements. In the related art, an example of a conventional semiconductor device is disclosed. In the semiconductor device disclosed in the related art, a peripheral edge portion of an electrode formed on the surface of a semiconductor element is covered with an insulating film (a passivation film 5 and a polyimide film 11). A portion of the electrode on the semiconductor element, which is located inside the insulating film and is exposed from the insulating film, is referred to as an electrode pad portion.

In the manufacture of the semiconductor device, when a portion made of a resin material such as polyimide is formed, the resin material portion shrinks. When such shrinkage of the resin material portion occurs, it may affect the surroundings.

SUMMARY

Some embodiments of the present disclosure provide a semiconductor device suitable for suppressing an influence of shrinkage of a resin material portion, and a method of manufacturing the semiconductor device.

According to an embodiment of the present disclosure, there is provided a semiconductor device including: a semiconductor element that includes an element main body having an element main surface facing one side in a thickness direction, and a first electrode arranged on the element main surface; a first insulating layer that is arranged over a peripheral edge portion of the first electrode and the element main surface and includes a first annular portion formed in an annular shape when viewed in the thickness direction; and a second insulating layer that is laminated on the first insulating layer, is made of a resin material, and includes a second annular portion overlapping with the first annular portion when viewed in the thickness direction, wherein the first annular portion includes a first outer end boundary line extending in a first direction orthogonal to the thickness direction, and a second outer end boundary line connected to the first outer end boundary line and extending in a second direction orthogonal to both the thickness direction and the first direction, wherein the second annular portion includes a third outer end boundary line located outside the first outer end boundary line in the second direction and a fourth outer end boundary line located outside the second outer end boundary line in the first direction, when viewed in the thickness direction, wherein an end portion of the third outer end boundary line near the fourth outer end boundary line protrudes outward in the second direction as compared with a center portion in the first direction, and wherein an end portion of the fourth outer end boundary line near the third outer end boundary line protrudes outward in the first direction as compared with a center portion in the second direction.

According to another embodiment of the present disclosure, there is provided a method of manufacturing a semiconductor device including: providing a substrate that includes a semiconductor layer having a main surface facing one side in a thickness direction, and a first electrode arranged on the main surface; forming a first insulating layer on the side of the main surface of the substrate; and forming a second insulating layer on the side of the main surface of the substrate, wherein in the forming the first insulating layer, a first annular portion arranged over a peripheral edge portion of the first electrode and the main surface and formed in an annular shape when viewed in the thickness direction is formed, wherein the forming the second insulating layer includes arranging a second annular portion that is formed in an annular portion overlapping with the first annular portion when viewed in the thickness direction and is made of a resin material; and heating the second annular portion, wherein the first annular portion includes a first outer end boundary line extending in the first direction orthogonal to the thickness direction, and a second outer end boundary line connected to the first outer end boundary line and extending in a second direction orthogonal to both the thickness direction and the first direction, wherein the second annular portion includes a third outer end boundary line located outside the first outer end boundary line in the second direction, and a fourth outer end boundary line located outside the second outer end boundary line in the first direction, when viewed in the thickness direction, wherein a first distance, which is a distance between the first outer end boundary line and the third outer end boundary line in the second direction, is set to be larger at an end portion near the fourth outer end boundary line than a center portion in the first direction, and wherein a second distance, which is a distance between the second outer end boundary line and the fourth outer end boundary line in the first direction, is set to be larger at an end portion near the third outer end boundary line than a center portion in the second direction.

Other features and advantages of the present disclosure will become more apparent with the detailed description given below with reference to the accompanying drawings.

DETAILED DESCRIPTION

Figure 1:
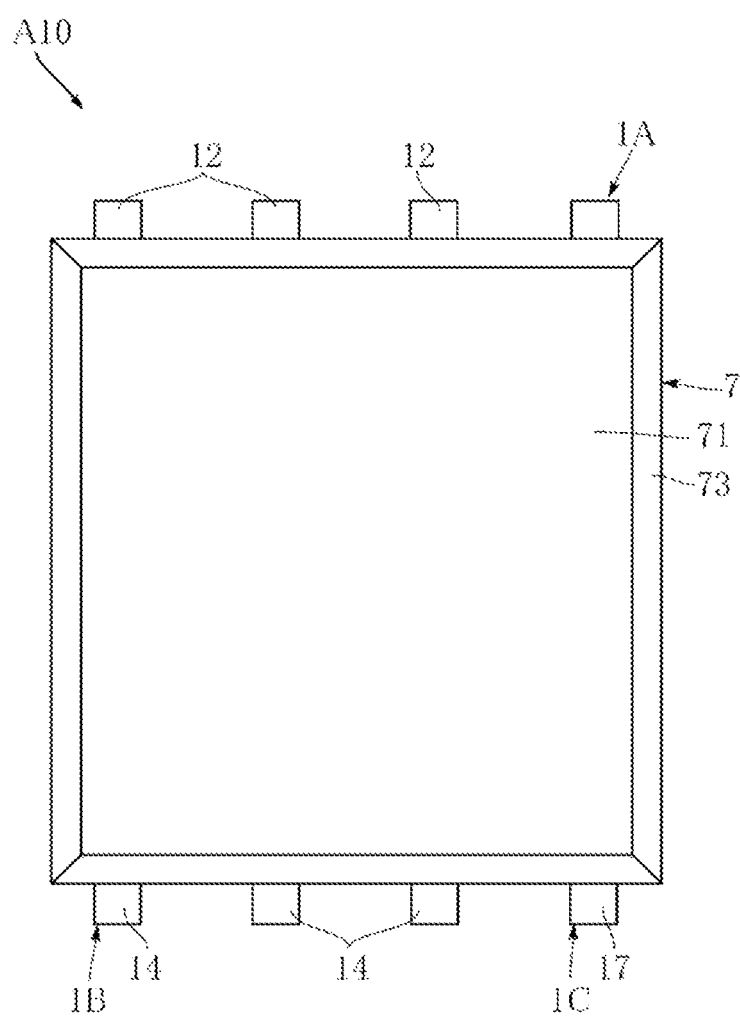
FIG. 1 is a plan view showing a semiconductor device according to a first embodiment of the present disclosure.

Preferred embodiments of the present disclosure will be now described in detail with reference to the drawings.

In the present disclosure, the terms "first," "second," "third," etc. are used merely as labels, and are not necessarily intended to order their objects.

In the present disclosure, the phases "a certain thing A is formed in a certain thing B" and "a certain thing A is formed on a certain thing B" include, unless otherwise specified, "a certain thing A is directly formed in a certain thing B" and "a certain thing A is formed in a certain thing B with another thing interposed between the certain thing A and the certain thing B." Similarly, the phases "a certain thing A is arranged in a certain thing B" and "a certain thing A is arranged on a certain thing B" include, unless otherwise specified, "a certain thing A is directly arranged in a certain thing B" and "a certain thing A is arranged in a certain thing B with another thing interposed between the certain thing A and the certain thing B." Similarly, the phase "a certain thing A is located on a certain thing B" includes, unless otherwise specified, "a certain thing A is located on the certain thing B with the certain thing A being in contact with the certain thing B" and "a certain thing A is located on a certain thing B with another thing interposed between the certain thing A and the thing B." In addition, the phase "a certain thing A overlaps with a certain thing B when viewed in a certain direction" includes, unless otherwise specified, "a certain thing A overlaps entirely with a certain thing B" and "a certain thing A overlaps partially with a certain thing B."

First Embodiment

A semiconductor device A10 according to a first embodiment of the present disclosure will be described with reference to FIGS. 1 to 10. The semiconductor device A10 includes a first lead 1A, a second lead 1B, a third lead 1C, a semiconductor element 2, an insulating portion 3, a metal laminated portion 4, a conductive member 5, a first conductive bonding material 61, a second conductive bonding material 62, a third conductive bonding material 63, and a sealing resin 7.

Figure 2:
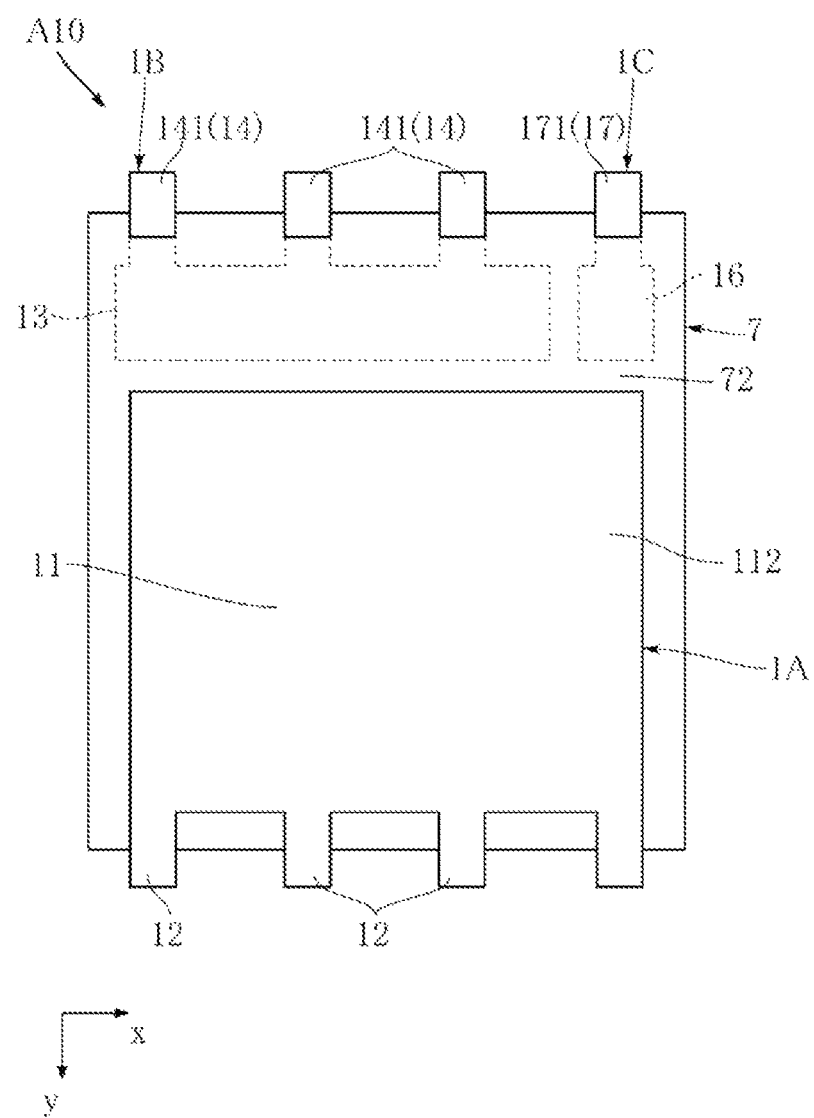
FIG. 2 is a bottom view of the semiconductor device shown in FIG. 1.
Figure 3:
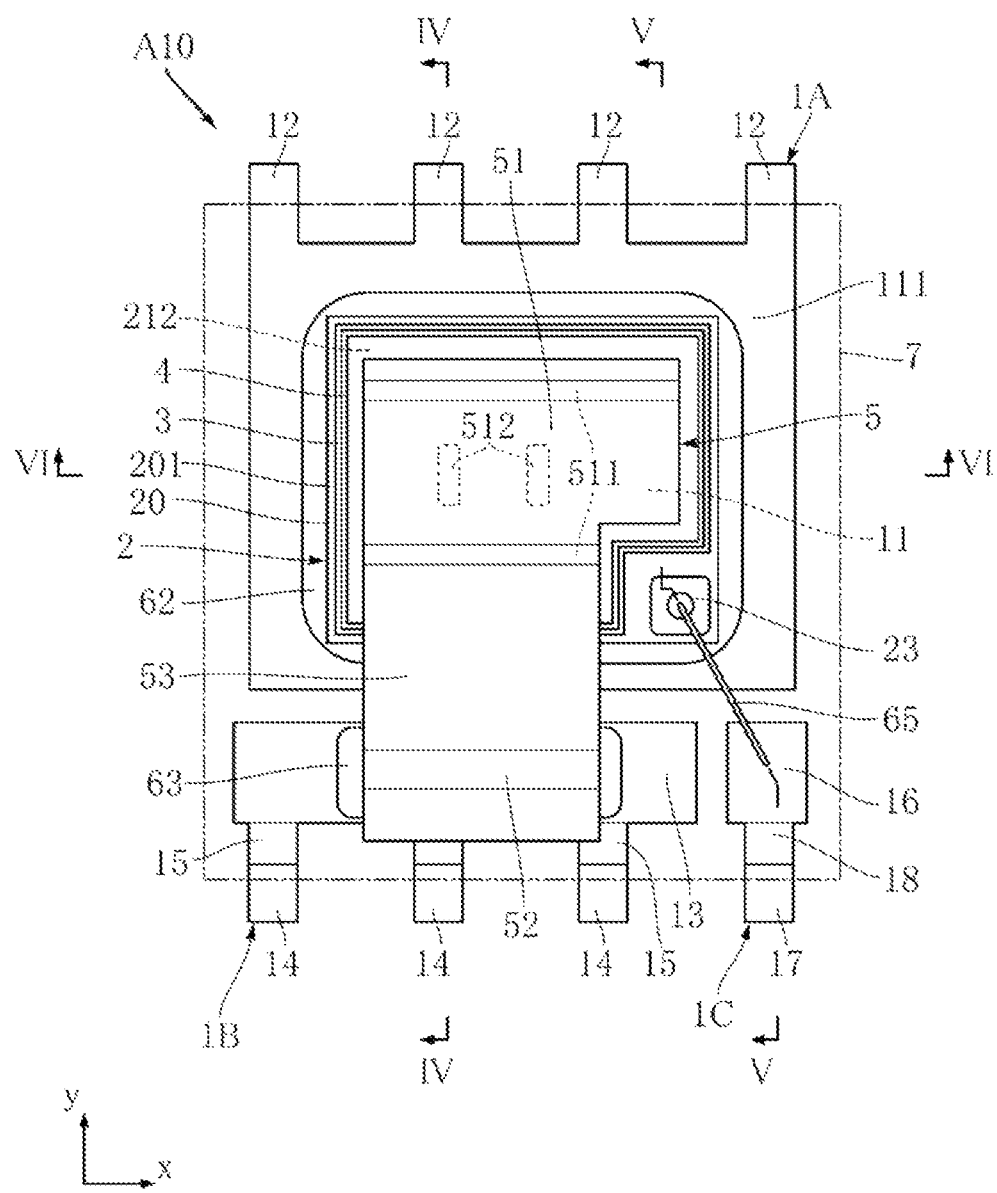
FIG. 3 is a plan view (a sealing resin is transparent) of the semiconductor device shown in FIG. 1.
Figure 4:
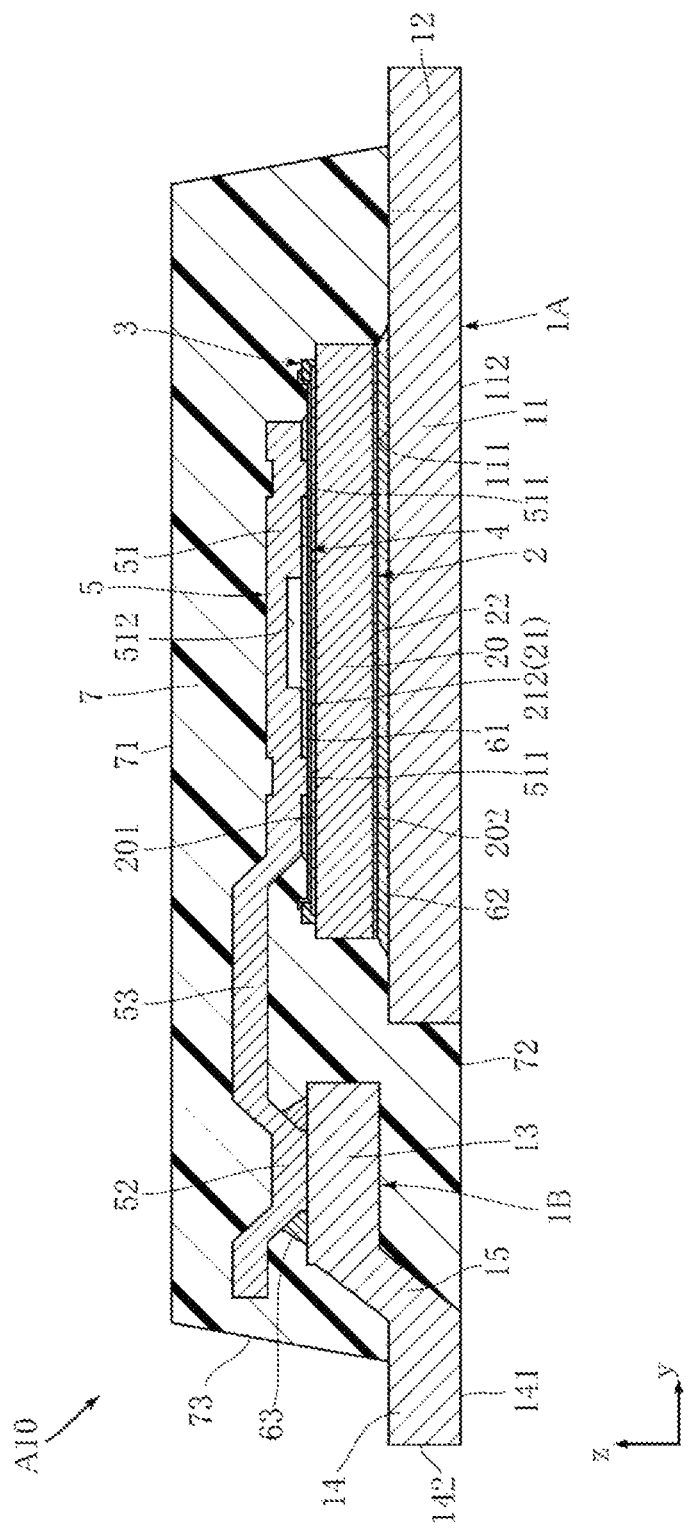
FIG. 4 is a cross-sectional view taken along line IV-IV of FIG. 3.
Figure 5:
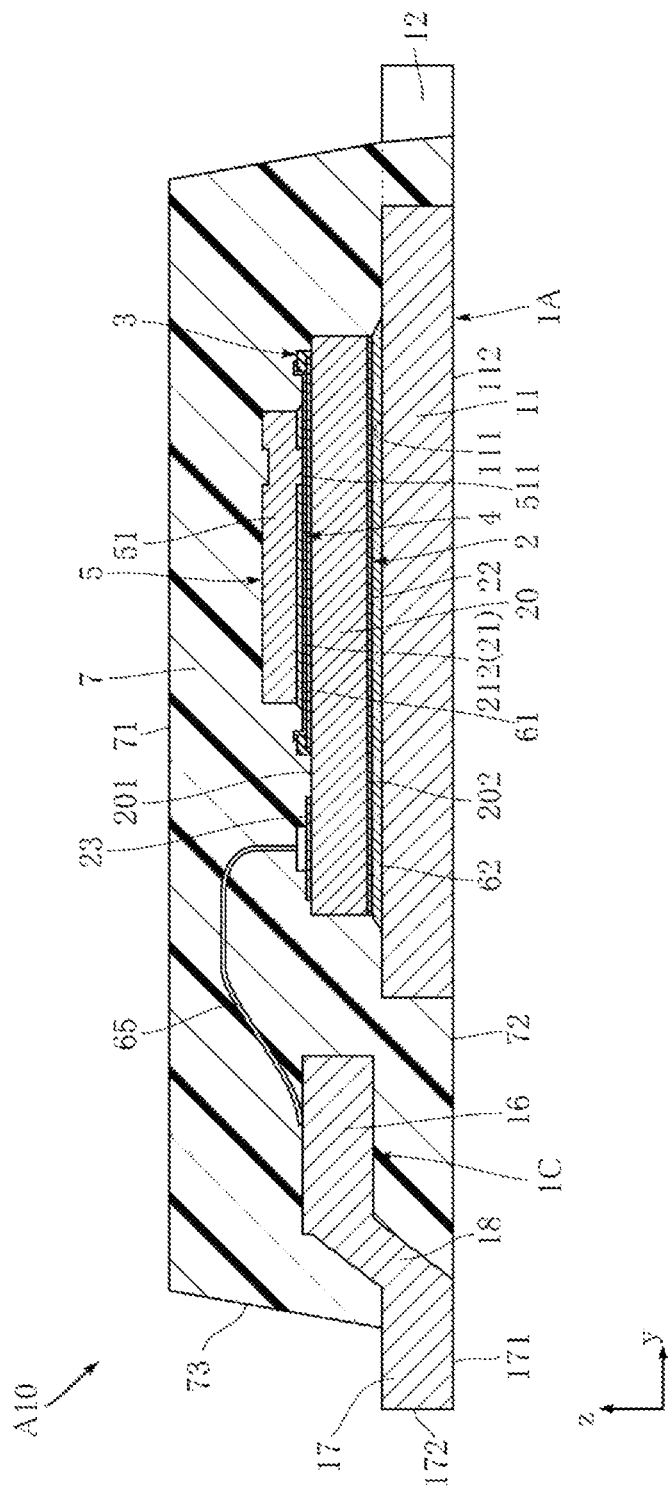
FIG. 5 is a cross-sectional view taken along line V-V of FIG. 3.
Figure 6:
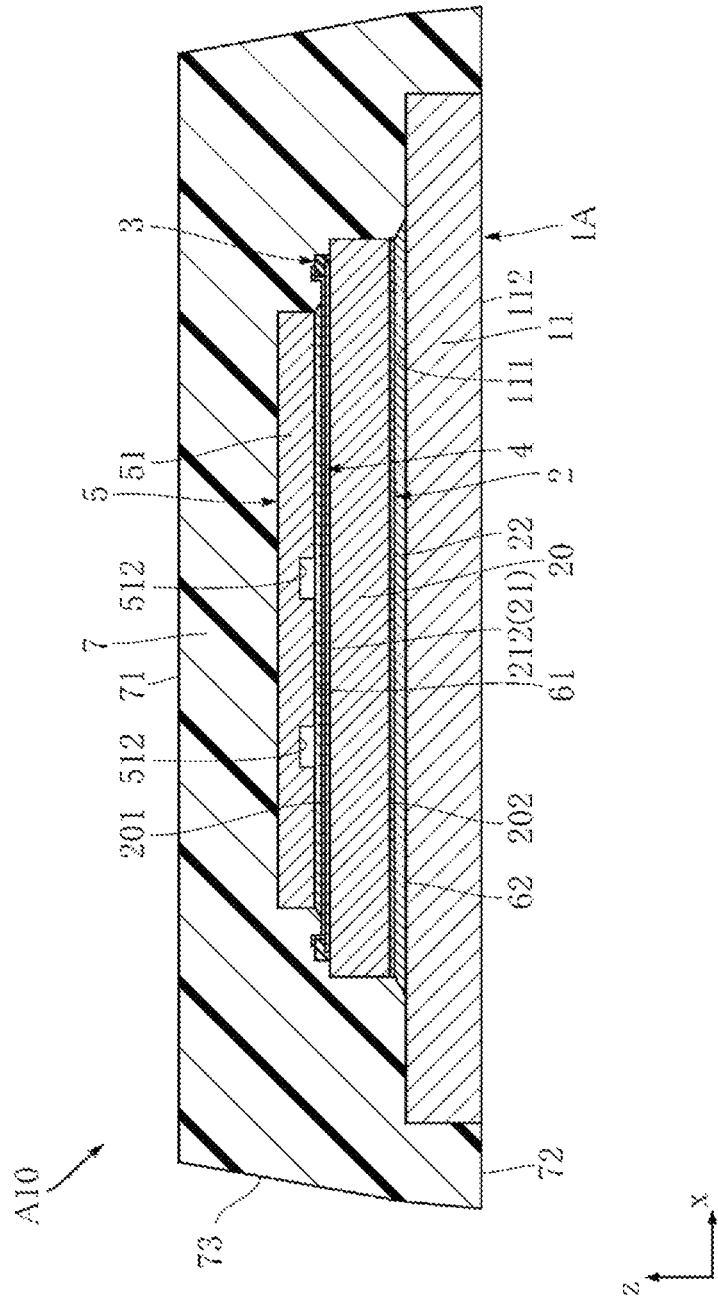
FIG. 6 is a cross-sectional view taken along VI-VI line of FIG. 3.
Figure 7:
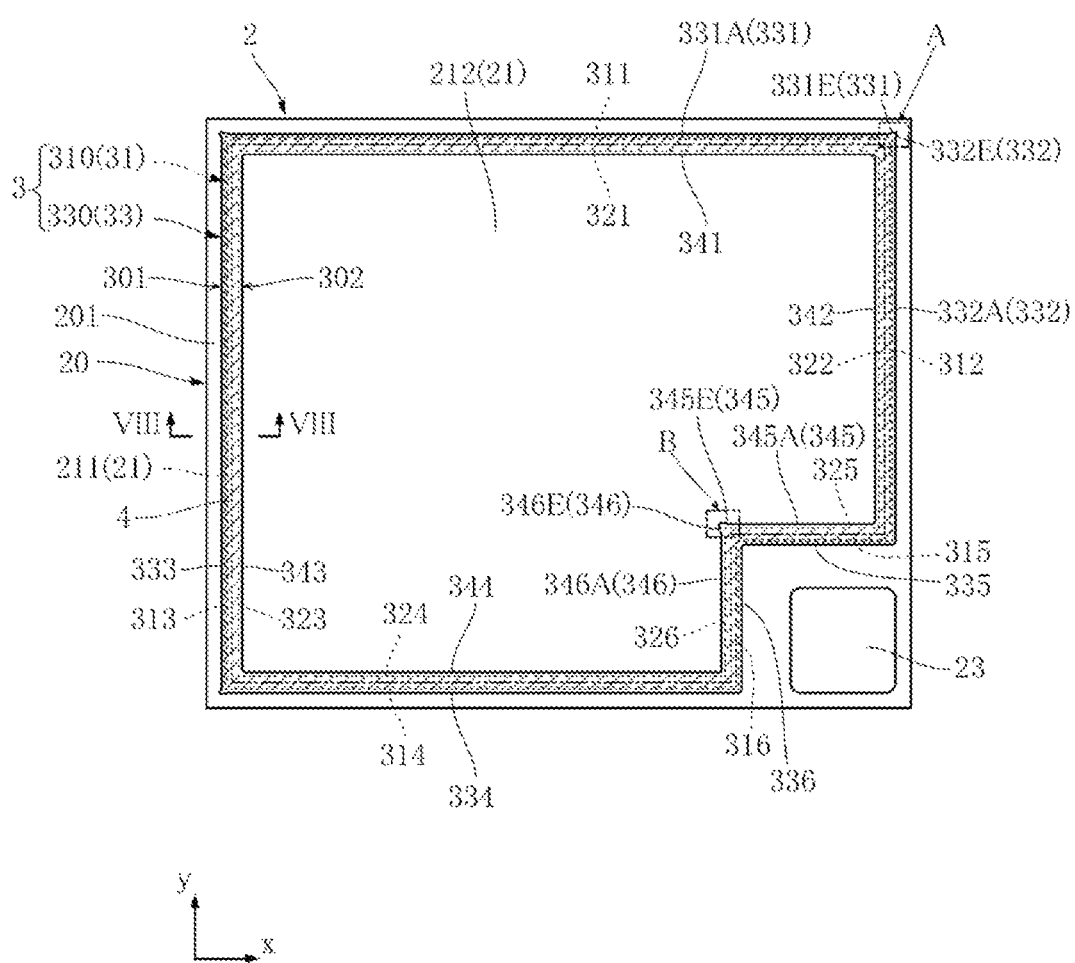
FIG. 7 is a plan view of a semiconductor element.
Figure 8:
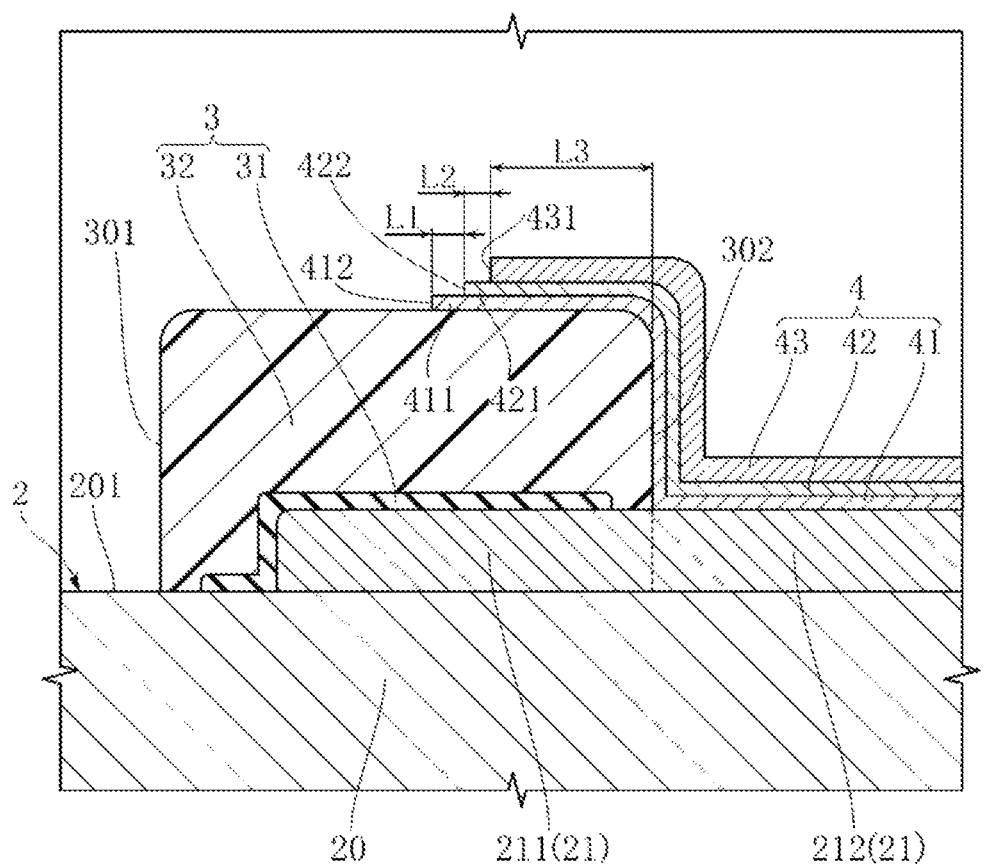
FIG. 8 is an enlarged cross-sectional view taken along line VIII-VIII of FIG. 7.
Figure 9:
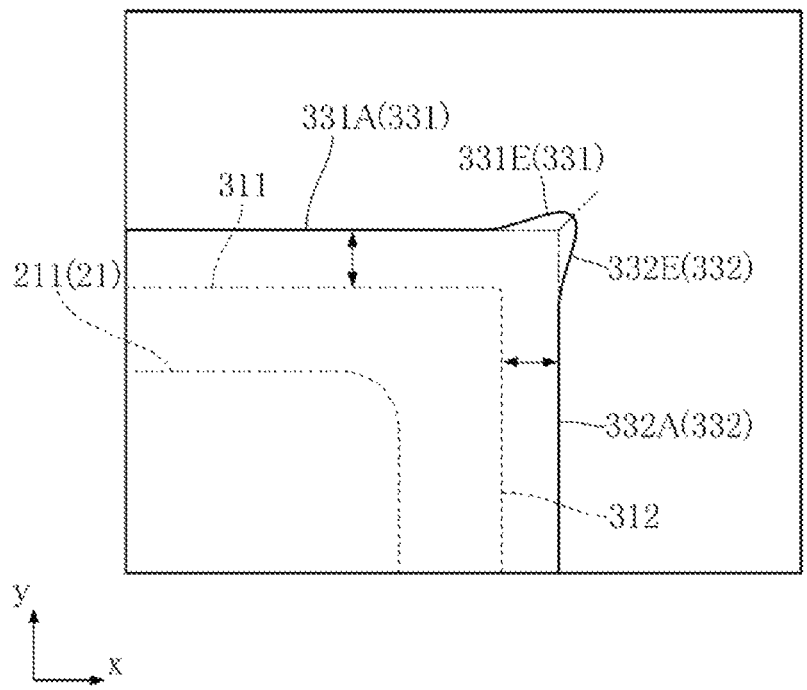
FIG. 9 is an enlarged view of portion A in FIG. 7.
Figure 10:
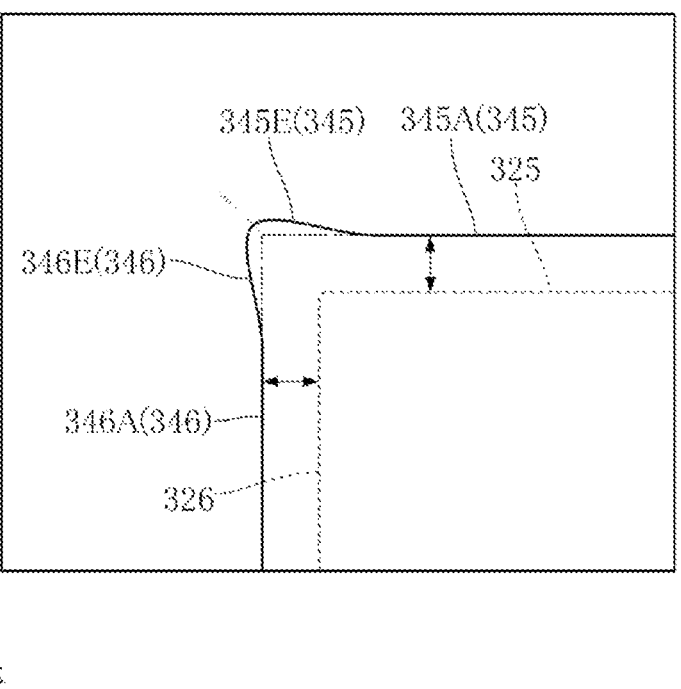
FIG. 10 is an enlarged view of portion B in FIG. 7.

FIG. 1 is a plan view showing the semiconductor device A10. FIG. 2 is a bottom view showing the semiconductor device A10. FIG. 3 is a plan view showing the semiconductor device A10. FIG. 4 is a cross-sectional view taken along line IV-IV of FIG. 3. FIG. 5 is a cross-sectional view taken along line V-V of FIG. 3. FIG. 6 is a cross-sectional view taken along line VI-VI of FIG. 3. FIG. 7 is a plan view showing the semiconductor element. FIG. 8 is an enlarged cross-sectional view taken along line VIII-VIII of FIG. 7. FIG. 9 is an enlarged view of portion A of FIG. 7. FIG. 10 is an enlarged view of portion B of FIG. 7. In FIG. 3, the sealing resin 7 is transparent for the sake of convenience of understanding. In FIG. 7, the metal laminated portion 4 is transparent.

In the description of the semiconductor device A10, a thickness direction of the semiconductor element 2 is referred to as a "thickness direction z." A direction orthogonal to the thickness direction z is referred to as a "first direction x." A direction orthogonal to both the thickness direction z and the first direction x is referred to as a "second direction y." As shown in FIGS. 1 and 2, the semiconductor device A10 has substantially a rectangular shape when viewed in the thickness direction z. Further, in the description of the semiconductor device A10, for the sake of convenience, in FIG. 1, the right side in the figure is referred to as "one side in the first direction x," and the left side in the figure is referred to as "the other side in the first direction x." In FIG. 1, the upper side in the figure is referred to as "one side in the second direction y," and the lower side in the figure is referred to as "the other side in the second direction y." In FIG. 4, the upper side in the figure is referred to as "one side in the thickness direction z," and the lower side in the figure is referred to as "the other side in the thickness direction z." The size of the semiconductor device A10 is not particularly limited. In the present embodiment, for example, the dimension in the first direction x is 2.6 mm to 3.6 mm, the dimension in the second direction y is 2.6 mm to 3.6 mm, and the dimension in the thickness direction z is 0.5 mm to 1.0 mm.

The first lead 1A, the second lead 1B, and the third lead 1C are formed, for example, by subjecting a metal plate to a punching process or a bending process. The constituent materials of the first lead 1A, the second lead 1B, and the third lead 1C may include, for example, either copper (Cu) or nickel (Ni), or an alloy thereof. The thicknesses of the first lead 1A, the second lead 1B, and the third lead 1C are, for example, 0.1 mm to 0.3 mm.

As shown in FIG. 3, the first lead 1A is arranged apart from the second lead 1B and the third lead 1C in the second direction y. The second lead 1B and the third lead 1C are arranged in the first direction x. The first lead 1A, the second lead 1B, and the third lead 1C are arranged apart from one another when viewed in the thickness direction z. The size of the first lead 1A is the largest and the size of the third lead 1C is the smallest when viewed in the thickness direction z.

As shown in FIGS. 3 to 6, the first lead 1A includes an element bonding portion 11 and a plurality of (four in the present embodiment) terminal-shaped extending portions 12. The element bonding portion 11 has a rectangular shape, for example, when viewed in the thickness direction z. The element bonding portion 11 has an element mounting surface 111 and a back surface mounting portion 112. The element mounting surface 111 faces one side in the thickness direction z, and the back surface mounting portion 112 faces an opposite side of the element mounting surface 111 (the other side in the thickness direction z). The semiconductor element 2 is mounted on the element mounting surface 111. As shown in FIGS. 2, 4, and the like, the back surface mounting portion 112 is exposed from the sealing resin 7. The back surface mounting portion 112 is a portion to be bonded by a bonding material such as solder when the semiconductor device A10 is mounted on a circuit board (not shown).

As shown in FIGS. 3 and 4, the second lead 1B includes a bonding portion 13, a plurality of (three in the present embodiment) terminal portions 14, and a plurality of (three in the present embodiment) bent portions 15. The bonding portion 13 is located on one side in the thickness direction z (the upper side of FIG. 4) with respect to the plurality of terminal portions 14. Further, the bonding portion 13 is located inward in the second direction y with respect to the plurality of terminal portions 14. Each of the plurality of terminal portions 14 includes a back surface mounting portion 141. The back surface mounting portion 141 faces the other side in the thickness direction z (the lower side of FIG. 4). The back surface mounting portion 141 is exposed from the sealing resin 7. The back surface mounting portion 141 is a portion to be bonded by a bonding material such as solder when the semiconductor device A10 is mounted on a circuit board (not shown). The plurality of bent portions 15 separately connect the bonding portion 13 and the plurality of terminal portions 14, respectively, and have a bent shape when viewed in the first direction x.

As shown in FIGS. 3 and 5, the third lead 1C includes a wire bonding portion 16, a terminal portion 17, and a bent portion 18. The wire bonding portion 16 is located on one side in the thickness direction z (the upper side of FIG. 5) with respect to the terminal portion 17. Further, the wire bonding portion 16 is located inward in the second direction y with respect to the terminal portion 17. The terminal portion 17 includes a back surface mounting portion 171. The back surface mounting portion 171 faces the other side in the thickness direction z (the lower side of FIG. 5). The back surface mounting portion 171 is exposed from the sealing resin 7. The back surface mounting portion 171 is a portion to be bonded by a bonding material such as solder when the semiconductor device A10 is mounted on a circuit board (not shown). The bent portion 18 connects the wire bonding portion 16 and the terminal portion 17, and has a bent shape when viewed in the first direction x.

The semiconductor element 2 is an element that exhibits an electrical function of the semiconductor device A10. The type of the semiconductor element 2 is not particularly limited. In the present embodiment, the semiconductor element 2 is configured as a transistor. As shown in FIGS. 3 to 5, the semiconductor element 2 has an element main body 20, a first electrode 21, a second electrode 22, and a third electrode 23.

The element main body 20 has a rectangular shape when viewed in the thickness direction z. The element main body 20 has an element main surface 201 and an element back surface 202. The element main surface 201 and the element back surface 202 face opposite to each other in the thickness direction z. The element main surface 201 faces the same side as the element mounting surface 111 of the element bonding portion 11 in the thickness direction z. Therefore, the element back surface 202 faces the element mounting surface 111.

The first electrode 21 and the third electrode 23 are arranged on the element main surface 201. The second electrode 22 is arranged on the element back surface 202. The constituent materials of the first electrode 21, the second electrode 22, and the third electrode 23 may include, for example, either copper or aluminum (Al), or an alloy thereof. In the present embodiment, the first electrode 21 is a source electrode, the second electrode 22 is a drain electrode, and the third electrode 23 is a gate electrode.

In the present embodiment, the first electrode 21 covers most of the element main surface 201. Specifically, the first electrode 21 is arranged in a region of the rectangular element main surface 201 excluding the peripheral edge portion and one corner portion (the lower right corner portion of FIG. 3) of the element main surface 201. The first electrode 21 includes a first electrode pad portion 212. The first electrode pad portion 212 is located inside the insulating portion 3 when viewed in the thickness direction z. The third electrode 23 is arranged at one corner portion of the element main surface 201 (the lower right corner portion of FIG. 3). The second electrode 22 covers substantially the entire surface of the element back surface 202.

The second electrode 22 is electrically bonded to the element mounting surface 111 (the element bonding portion 11) via the second conductive bonding material 62. The second conductive bonding material 62 conductively bonds the element bonding portion 11 and the second electrode 22. The second conductive bonding material 62 is, for example, solder.

The semiconductor device A10 includes a wire 65. The wire 65 is electrically bonded to the third electrode 23 and the wire bonding portion 16 of the third lead 1C. The wire 65 conductively bonds the third electrode 23 and the third lead 1C.

As shown in FIGS. 7 and 8, the insulating portion 3 is arranged over the first electrode 21 and the element main surface 201. The insulating portion 3 has an annular shape such that it overlaps with an outer peripheral edge of the first electrode 21 when viewed in the thickness direction z. An outer end edge 301 of the insulating portion 3 is located near an outer peripheral edge of the element main surface 201 when viewed in the thickness direction z. In the first electrode 21, a region located inside an inner end edge 302 of the insulating portion 3 when viewed in the thickness direction z is referred to as the first electrode pad portion 212.

In the present embodiment, the insulating portion 3 includes a first insulating layer 31 and a second insulating layer 33. In the present embodiment, the first insulating layer 31 is arranged over a peripheral edge portion 211 of the first electrode 21, and the element main surface 201. In FIG. 7, diagonal lines are added to a region in which the first insulating layer 31 is formed. The first insulating layer 31 is made of, for example, nitride such as SiN. The thickness of the first insulating layer 31 is, for example, 0.1 μm to 2 μm. Other insulating materials such as SiON and SiO$_2$ may be adopted as the constituent material of the first insulating layer 31.

The first insulating layer 31 includes a first annular portion 310. The first annular portion 310 has an annular shape corresponding to the outer peripheral edge of the first electrode 21. In the present embodiment, the first annular portion 310 includes a plurality of strip-shaped portions each extending in the first direction x or the second direction y with a substantially constant width. In the present embodiment, the first annular portion 310 has outer end boundary lines 311, 312, 313, 314, 315, and 316 and inner end boundary lines 321, 322, 323, 324, 325, and 326. Each of the outer end boundary lines 311, 312, 313, 314, 315, and 316 is a portion of an outer peripheral contour line of the first annular portion 310 when viewed in the thickness direction z. Each of the inner end boundary lines 321, 322, 323, 324, 325, and 326 is a portion of an inner peripheral contour line of the first annular portion 310 when viewed in the thickness direction z.

FIG. 7 shows only the first annular portion 310 corresponding to the first electrode 21, as the first insulating layer 31, but the present disclosure is not limited thereto. The first insulating layer 31 may include, for example, another annular portion having an annular shape corresponding to the outer peripheral edge of the third electrode 23.

The outer end boundary line 311 is located on one side in the second direction y in the first annular portion 310 and extends in the first direction x. The outer end boundary line 312 is located on one side in the first direction x in the first annular portion 310 and extends in the second direction y. One side end of the outer end boundary line 312 in the second direction y is connected to one side end in the outer end boundary line 311 in the first direction x. The outer end boundary line 313 is located on the other side in the first direction x in the first annular portion 310 and extends in the second direction y. One side end of the outer end boundary line 313 in the second direction y is connected to the other side end of the outer end boundary line 311 in the first direction x. The outer end boundary line 314 is located on the other side in the second direction y in the first annular portion 310 and extends in the first direction x. The other side end of the outer end boundary line 314 in the first direction x is connected to the other side end of the outer end boundary line 313 in the second direction y. The outer end boundary line 311 and the outer end boundary line 314 correspond to a "first outer end boundary line" of the present disclosure. The outer end boundary line 312 and the outer end boundary line 313 correspond to a "second outer end boundary line" of the present disclosure.

In the present disclosure, "the outer end boundary line 311 (314) extends in the first direction x" means that the outer end boundary line 311 (314) extends in the first direction x as a whole. Therefore, in a case where most of the outer end boundary line 311 (314) extends along the first direction x, the outer end boundary line 311 (314) may include a portion extending in a direction different from the first direction xl. In the present disclosure, "the outer end boundary line 312 (313) extends in the second direction y" means that the outer end boundary line 312 (313) extends in the second direction y as a whole. Therefore, in a case where most of the outer end boundary line 312 (313) extends along the second direction y, the outer end boundary line 312 (313) may include a portion extending in a direction different from the second direction y.

The inner end boundary line 321 is located on one side in the second direction y in the first annular portion 310 and extends in the second direction y. The inner end boundary line 321 corresponds to the outer end boundary line 311 and is located inside the outer end boundary line 311 in the second direction y when viewed in the thickness direction z. The inner end boundary line 322 is located on one side in the first direction x in the first annular portion 310 and extends in the second direction y. One side end of the inner end boundary line 322 in the second direction y is connected to one side end of the inner end boundary line 321 in the first direction x. The inner end boundary line 322 corresponds to the outer end boundary line 312 and is located inside the outer end boundary line 312 in the first direction x when viewed in the thickness direction z. The inner end boundary line 323 is located on the other side in the first direction x in the first annular portion 310 and extends in the second direction y. One side end of the inner end boundary line 323 in the second direction y is connected to the other side end of the inner end boundary line 321 in the first direction x. The inner end boundary line 323 corresponds to the outer end boundary line 313 and is located inside the outer end boundary line 313 in the first direction x when viewed in the thickness direction z. The inner end boundary line 324 is located on the other side in the second direction y in the first annular portion 310 and extends in the first direction x. The other side end of the inner end boundary line 324 in the first direction x is connected to the other side end in the inner end boundary line 323 in the second direction y. The inner end boundary line 324 corresponds to the outer end boundary line 314 and is located inside the outer end boundary line 314 in the second direction y when viewed in the thickness direction z. The inner end boundary line 321 and the inner end boundary line 324 correspond to a "first inner end boundary line" of the present disclosure. The inner end boundary line 322 and the inner end boundary line 323 correspond to a "second inner end boundary line" of the present disclosure.

In the present disclosure, "the inner end boundary line 321 (324) extends in the first direction x" means that the inner end boundary line 321 (324) extends in the first direction x as a whole. Therefore, in a case where most of the inner end boundary line 321 (324) extends along the first direction x, the inner end boundary line 321 (324) may include a portion extending in a direction different from the first direction xl. In the present disclosure, "the inner end boundary line 322 (323) extends in the second direction y" means that the inner end boundary line 322 (323) extends in the second direction y as a whole. Therefore, in a case where most of the inner end boundary line 322 (323) extends along the second direction y, the inner end boundary line 322 (323) may include a portion extending in a direction different from the second direction y.

The inner end boundary line 325 is located near one side in the first direction x and near the other side in the second direction y in the first annular portion 310, and extends in the first direction x. One side end of the inner end boundary line 325 in the first direction x is connected to the other side end of the inner end boundary line 322 in the second direction y. The inner end boundary line 325 is located inside the inner end boundary line 322 in the first direction x when viewed in the thickness direction z. The inner end boundary line 326 is located near one side in the first direction x and near the other side in the second direction y in the first annular portion 310, and extends in the second direction y. The other side end of the inner end boundary line 326 in the second direction y is connected to the other side end of the inner end boundary line 325 in the first direction x. The inner end boundary line 326 is located on the opposite side of the inner end boundary line 321 with respect to the inner end boundary line 325 in the second direction y when viewed in the thickness direction z. Further, in the present embodiment, the inner end boundary line 326 is connected to the inner end boundary line 324. The inner end boundary line 325 corresponds to a "fifth inner end boundary line" of the present disclosure. The inner end boundary line 326 corresponds to a "sixth inner end boundary line" of the present disclosure. In the present disclosure, "the inner end boundary line 325 extends in the first direction x" means that the inner end boundary line 325 extends in the first direction x as a whole. Therefore, in a case where most of the inner end boundary line 325 extends along the first direction x, the inner end boundary line 325 may include a portion extending in a direction different from the first direction xl. In the present disclosure, "the inner end boundary line 326 extends in the second direction y" means that the inner end boundary line 326 extends in the second direction y as a whole. Therefore, in a case where most of the inner end boundary line 326 extends along the second direction y, the inner end boundary line 326 may include a portion extending in a direction different from the second direction y.

The outer end boundary line 315 is located near one side in the first direction x and near the other side in the second direction y in the first annular portion 310, and extends in the first direction x. One side end of the outer end boundary line 315 in the first direction x is connected to the other side end of the outer end boundary line 312 in the second direction y. The outer end boundary line 315 corresponds to the inner end boundary line 325 and is located outside the inner end boundary line 325 in the second direction y when viewed in the thickness direction z. The outer end boundary line 316 is located near one side in the first direction x and near the other side in the second direction y in the first annular portion 310, and extends in the second direction y. The other side end of the outer end boundary line 316 in the second direction y is connected to the other side end of the outer end boundary line 315 in the first direction x. The outer end boundary line 316 corresponds to the inner end boundary line 326 and is located outside the inner end boundary line 326 in the first direction x when viewed in the thickness direction z. Further, in the present embodiment, the outer end boundary line 316 is connected to the outer end boundary line 314. The outer end boundary line 315 corresponds to a "fifth outer end boundary line" of the present disclosure. The outer end boundary line 316 corresponds to a "sixth outer end boundary line" of the present disclosure. In the present disclosure, "the outer end boundary line 315 extends in the first direction x" means that the outer end boundary line 315 extends in the first direction x as a whole. Therefore, in a case where most of the outer end boundary line 315 extends along the first direction x, the outer end boundary line 315 may include a portion extending in a direction different from the first direction xl. In the present disclosure, "the outer end boundary line 316 extends in the second direction y" means that the outer end boundary line 316 extends in the second direction y as a whole. Therefore, in a case where most of the outer end boundary line 316 extends along the second direction y, the outer end boundary line 316 may include a portion extending in a direction different from the second direction y.

As shown in FIGS. 7 and 8, the second insulating layer 33 is laminated on the first insulating layer 31. In the present embodiment, the second insulating layer 33 covers the entire first insulating layer 31 and a portion of each of the first electrode 21 and the element main surface 201. In the present embodiment, the second insulating layer 33 shown in FIG. 8 includes the outer end edge 301 and the inner end edge 302 in the insulating portion 3.

The constituent material of the second insulating layer 33 is not particularly limited. In the present embodiment, the second insulating layer 33 is made of, for example, a resin material such as a polyimide resin. The thickness of the second insulating layer 33 is larger than the thickness of the first insulating layer 31. In some embodiments, the thickness of the second insulating layer 33 may be five to fifty times the thickness of the first insulating layer 31. The thickness of the second insulating layer 33 is, for example, 5 μm to 10 μm.

As shown in FIG. 7, the second insulating layer 33 includes a second annular portion 330. The second annular portion 330 has an annular shape corresponding to the first annular portion 310, and covers the entire first annular portion 310. In the present embodiment, the second annular portion 330 includes a plurality of strip-shaped portions each extending approximately in the first direction x or the second direction y. In the present embodiment, the second annular portion 330 includes outer end boundary lines 331, 332, 333, 334, 335, and 336 and inner end boundary lines 341, 342, 343, 344, 345, and 346. Each of the outer end boundary lines 331, 332, 333, 334, 335, and 336 is a portion of an outer peripheral contour line of the second annular portion 330 when viewed in the thickness direction z. Each of the inner end boundary lines 341, 342, 343, 344, 345, and 346 is a portion of an inner peripheral contour line of the second annular portion 330 when viewed in the thickness direction z.

FIG. 7 shows only the second annular portion 330 corresponding to the first annular portion 310 (the first electrode 21), as the second insulating layer 33, but the present disclosure is not limited thereto. The second insulating layer 33 may include, for example, another annular portion having an annular shape corresponding to the outer peripheral edge of the third electrode 23.

The outer end boundary line 331 is located on one side in the second direction y in the second annular portion 330 and extends in the first direction x. The outer end boundary line 331 is located outside the outer end boundary line 311 in the second direction y when viewed in the thickness direction z.

The outer end boundary line 332 is located on one side in the first direction x in the second annular portion 330 and extends in the second direction y. One side end of the outer end boundary line 332 in the second direction y is connected to one side end of the outer end boundary line 331 in the first direction x. The outer end boundary line 332 is located outside the outer end boundary line 312 in the first direction x when viewed in the thickness direction z.

As shown in FIG. 9, in the present embodiment, the outer end boundary line 331 includes an outer end boundary line first portion 331A and an outer end boundary line overhanging portion 331E. The outer end boundary line first portion 331A extends linearly along the first direction x and occupies most of the outer end boundary line 331 except for the end portion thereof. The outer end boundary line overhanging portion 331E is connected to the outer end boundary line first portion 331A and is located at the end portion near the outer end boundary line 332. The outer end boundary line overhanging portion 331E is located outside the outer end boundary line first portion 331A in the second direction y. Therefore, in the outer end boundary line 331, an end portion (the outer end boundary line overhanging portion 331E) near the outer end boundary line 332 protrudes outward in the second direction y as compared with a center portion in the first direction x (the outer end boundary line first portion 331A).

The outer end boundary line 332 includes an outer end boundary line first portion 332A and an outer end boundary line overhanging portion 332E. The outer end boundary line first portion 332A extends linearly along the second direction y and occupies most of the outer end boundary line 332 except for the end portion thereof. The outer end boundary line overhanging portion 332E is connected to the outer end boundary line first portion 332A and is located at the end portion near the outer end boundary line 331. The outer end boundary line overhanging portion 332E is located outside the outer end boundary line first portion 332A in the first direction x. Therefore, in the outer end boundary line 332, an end portion (the outer end boundary line overhanging portion 332E) near the outer end boundary line 331 protrudes outward in the first direction x as compared with a center portion in the second direction y (the outer end boundary line first portion 332A). Further, the outer end boundary line overhanging portion 332E is connected to the outer end boundary line overhanging portion 331E. In FIG. 9, a two-dot chain line inclined at an angle of 45 degrees with respect to the first direction x and the second direction y indicates a boundary between the outer end boundary line overhanging portion 331E and the outer end boundary line overhanging portion 332E. As a result, a corner portion (the outer end boundary line overhanging portion 331E and the outer end boundary line overhanging portion 332E) of the outer end boundary line 331 and the outer end boundary line 332 has a shape protruding outward in both the first direction x and the second direction y.

As shown in FIG. 7, the outer end boundary line 333 is located on the other side in the first direction x in the second annular portion 330 and extends in the second direction y. One side end of the outer end boundary line 313 in the second direction y is connected to the other side end of the outer end boundary line 311 in the first direction x. The outer end boundary line 333 is located outside the outer end boundary line 313 in the first direction x when viewed in the thickness direction z.

Although detailed illustration and description are omitted, in the outer end boundary line 333, the end portion near the outer end boundary line 331 protrudes outward in the first direction x as compared with the center portion in the second direction y. As a result, a corner portion of the outer end boundary line 331 and the outer end boundary line 333 (the upper left corner portion in FIG. 7) has a shape that protrudes outward in both the first direction x and the second direction y, similarly to the corner portion of the outer end boundary line 331 and the outer end boundary line 332.

The outer end boundary line 334 is located on the other side in the second direction y in the second annular portion 330 and extends in the first direction x. The other side end of the outer end boundary line 334 in the first direction x is connected to the other side end of the outer end boundary line 333 in the second direction y. The outer end boundary line 334 is located outside the outer end boundary line 314 in the second direction y when viewed in the thickness direction z.

Although detailed illustration and description are omitted, in the outer end boundary line 334, the end portion near the outer end boundary line 333 protrudes outward in the second direction y as compared with the center portion in the first direction x. Further, in the outer end boundary line 333, the end portion near the outer end boundary line 334 protrudes outward in the first direction x as compared with the center portion in the second direction y. The end portion of the outer end boundary line 334 near the outer end boundary line 333 is connected to the end portion of the outer end boundary line 333 near the outer end boundary line 334. As a result, the corner portion of the outer end boundary line 333 and the outer end boundary line 334 (the lower left corner portion in FIG. 7) has a shape that protrudes outward in both the first direction x and the second direction y, similarly to the corner portion of the outer end boundary line 331 and the outer end boundary line 332. The outer end boundary line 331 and the outer end boundary line 334 correspond to a "third outer end boundary line" of the present disclosure. The outer end boundary line 332 and the outer end boundary line 333 correspond to a "fourth outer end boundary line" of the present disclosure.

In the present disclosure, "the outer end boundary line 331 (334) extends in the first direction x" means that the outer end boundary line 331 (334) extends in the first direction x as a whole. Therefore, in a case where most of the outer end boundary line 331 (334) extends along the first direction x, the outer end boundary line 331 (334) may include a portion extending in a direction different from the first direction xl. In the present disclosure, "the outer end boundary line 332 (333) extends in the second direction y" means that the outer end boundary line 332 (333) extends in the second direction y as a whole. Therefore, in a case where most of the outer end boundary line 332 (333) extends along the second direction y, the outer end boundary line 332 (333) may include a portion extending in a direction different from the second direction y.

The inner end boundary line 341 is located on one side in the second direction y in the second annular portion 330 and extends in the first direction x. The inner end boundary line 341 is located inside the inner end boundary line 321 in the second direction y when viewed in the thickness direction z. The inner end boundary line 342 is located on one side in the first direction x in the second annular portion 330 and extends in the second direction y. One side end of the inner end boundary line 342 in the second direction y is connected to one side end of the inner end boundary line 341 in the first direction x. The inner end boundary line 342 is located inside the inner end boundary line 322 in the first direction x when viewed in the thickness direction z. The inner end boundary line 343 is located on the other side in the first direction x in the second annular portion 330 and extends in the second direction y. One side end of the inner end boundary line 343 in the second direction y is connected to the other side end of the inner end boundary line 341 in the first direction x. The inner end boundary line 343 is located inside the inner end boundary line 323 in the first direction x when viewed in the thickness direction z. The inner end boundary line 344 is located on the other side in the second direction y in the second annular portion 330 and extends in the first direction x. The other side end of the inner end boundary line 344 in the first direction x is connected to the other side end of the inner end boundary line 343 in the second direction y. The inner end boundary line 344 is located inside the inner end boundary line 324 in the second direction y when viewed in the thickness direction z. The inner end boundary line 341 and the inner end boundary line 344 correspond to a "third inner end boundary line" of the present disclosure. The inner end boundary line 342 and the inner end boundary line 343 correspond to a "fourth inner end boundary line" of the present disclosure.

In the present disclosure, "the inner end boundary line 341 (344) extends in the first direction x" means that the inner end boundary line 341 (344) extends in the first direction x as a whole. Therefore, in a case where most of the inner end boundary line 341 (344) extends along the first direction x, the inner end boundary line 341 (344) may include a portion extending in a direction different from the first direction xl. In the present disclosure, "the inner end boundary line 342 (343) extends in the second direction y" means that the inner end boundary line 342 (343) extends in the second direction y as a whole. Therefore, in a case where most of the inner end boundary line 342 (343) extends along the second direction y, the inner end boundary line 342 (343) may include a portion extending in a direction different from the second direction y.

The inner end boundary line 345 is located near one side in the first direction x and near the other side in the second direction y in the second annular portion 330, and extends in the first direction x. One side end of the inner end boundary line 345 in the first direction x is connected to the other side end of the inner end boundary line 342 in the second direction y. The inner end boundary line 345 is located inside the inner end boundary line 325 in the second direction y when viewed in the thickness direction z. The inner end boundary line 346 is located near one side in the first direction x and near the other side in the second direction y in the second annular portion 330, and extends in the second direction y. The other side end of the inner end boundary line 346 in the second direction y is connected to the other side end of the inner end boundary line 345 in the first direction x. The inner end boundary line 346 is located inside the inner end boundary line 326 in the first direction x when viewed in the thickness direction z. Further, in the present embodiment, the inner end boundary line 346 is connected to the inner end boundary line 344.

As shown in FIG. 10, in the present embodiment, the inner end boundary line 345 includes an inner end boundary line first portion 345A and an inner end boundary line overhanging portion 345E. The inner end boundary line first portion 345A extends linearly along the first direction x and occupies most of the inner end boundary line 345 except for the end portion thereof. The inner end boundary line overhanging portion 345E is connected to the inner end boundary line first portion 345A and is located at the end portion near the inner end boundary line 346. The inner end boundary line overhanging portion 345E is located inside the inner end boundary line first portion 345E in the second direction y. Therefore, in the inner end boundary line 345, an end portion (the inner end boundary line overhanging portion 345E) near the inner end boundary line 346 protrudes inward in the second direction y as compared with a center portion in the first direction x (the inner end boundary line first portion 345A).

The inner end boundary line 346 includes an inner end boundary line first portion 346A and an inner end boundary line overhanging portion 346E. The inner end boundary line first portion 346A extends linearly along the second direction y and occupies most of the inner end boundary line 346 except for the end portion thereof. The inner end boundary line overhanging portion 346E is connected to the inner end boundary line first portion 346A and is located at the end portion near the inner end boundary line 345. The inner end boundary line overhanging portion 346E is located inside the inner end boundary line first portion 346A in the first direction x. Therefore, in the inner end boundary line 346, an end portion (the inner end boundary line overhanging portion 346E) near the inner end boundary line 345 protrudes inward in the first direction x as compared with a center portion in the second direction y (the inner end boundary line first portion 346A). Further, the inner end boundary line overhanging portion 346E is connected to the inner end boundary line overhanging portion 345E. In FIG. 10, a two-dot chain line inclined at an angle of 45 degrees with respect to the first direction x and the second direction y indicates a boundary between the inner end boundary line overhanging portion 345E and the inner end boundary line overhanging portion 346E. As a result, the corner portion (the inner end boundary line overhanging portion 345E and the inner end boundary line overhanging portion 346E) of the inner end boundary line 345 and the inner end boundary line 346 has a shape that protrudes inward in both the first direction x and the second direction y. The inner end boundary line 345 corresponds to a "seventh inner end boundary line" of the present disclosure. The inner end boundary line 346 corresponds to an "eighth inner end boundary line" of the present disclosure. In the present disclosure, "the inner end boundary line 345 extends in the first direction x" means that the inner end boundary line 345 extends in the first direction x as a whole. Therefore, in a case where most of the inner end boundary line 345 extends along the first direction x, the inner end boundary line 345 may include a portion extending in a direction different from the first direction xl. In the present disclosure, "the inner end boundary line 346 extends in the second direction y" means that the inner end boundary line 346 extends in the second direction y as a whole. Therefore, in a case where most of the inner end boundary line 346 extends along the second direction y, the inner end boundary line 346 may include a portion extending in a direction different from the second direction y.

As shown in FIG. 7, the outer end boundary line 335 is located near one side in the first direction x and near the other side in the second direction y in the second annular portion 330, and extends in the first direction x. One side end of the outer end boundary line 335 in the first direction x is connected to the other side end of the outer end boundary line 332 in the second direction y. The outer end boundary line 335 is located outside the outer end boundary line 315 in the second direction y when viewed in the thickness direction z. The outer end boundary line 336 is located near one side in the first direction x and near the other side in the second direction y in the second annular portion 330, and extends in the second direction y. The other side end of the outer end boundary line 336 in the second direction y is connected to the other side end of the outer end boundary line 335 in the first direction x. The outer end boundary line 336 is located outside the outer end boundary line 316 in the first direction x when viewed in the thickness direction z. Further, in the present embodiment, the outer end boundary line 336 is connected to the outer end boundary line 334. The outer end boundary line 335 corresponds to a "seventh outer end boundary line" of the present disclosure. The outer end boundary line 336 corresponds to an "eighth outer end boundary line" of the present disclosure. In the present disclosure, "the outer end boundary line 335 extends in the first direction x" means that the outer end boundary line 335 extends in the first direction x as a whole. Therefore, in a case where most of the outer end boundary line 335 extends along the first direction x, the outer end boundary line 335 may include a portion extending in a direction different from the first direction xl. In the present disclosure, "the outer end boundary line 336 extends in the second direction y" means that the outer end boundary line 336 extends in the second direction y as a whole. Therefore, in a case where most of the outer end boundary line 336 extends along the second direction y, the outer end boundary line 336 may include a portion extending in a direction different from the second direction y.

As shown in FIGS. 7 and 8, the metal laminated portion 4 is arranged over the first electrode 21 and the insulating portion 3, and has a structure in which a plurality of metal layers are laminated. In the present embodiment, the metal laminated portion 4 includes a first metal layer 41, a second metal layer 42, and a third metal layer 43.

The first metal layer 41 is arranged over the first electrode 21 and the insulating portion 3 (the second insulating layer 33). Specifically, the first metal layer 41 covers the first electrode pad portion 212 of the first electrode 21, which is located inside the inner end edge 302 of the insulating portion 3 (the second insulating layer 33) when viewed in the thickness direction z, and a portion of the second insulating layer 33 (the second annular portion 330). The first metal layer 41 includes a first extending portion 411 located on the outer peripheral portion when viewed in the thickness direction z. A first end edge 412, which is the outer peripheral edge of the first metal layer 41, is located between the outer end edge 301 and the inner end edge 302 of the insulating portion 3 (the second insulating layer 33) when viewed in the thickness direction z. The constituent material of the first metal layer 41 includes titanium (Ti). The thickness of the first metal layer 41 is, for example, 0.1 μm to 0.5 μm.

The second metal layer 42 is laminated on the first metal layer 41. The second metal layer 42 overlaps both the first electrode 21 and the insulating portion 3 when viewed in the thickness direction z. The second metal layer 42 covers a region located inside the first extending portion 411 except for the outer peripheral portion (the first extending portion 411) of the first metal layer 41 when viewed in the thickness direction z. As a result, the first extending portion 411 of the first metal layer 41 is not covered with the second metal layer 42, but is exposed from the second metal layer 42. The second metal layer 42 includes a second extending portion 421 located on the outer peripheral portion when viewed in the thickness direction z. A second end edge 422, which is the outer peripheral edge of the second metal layer 42, is located between the first end edge 412 of the first metal layer 41 and the inner end edge 302 of the insulating portion 3 (the second insulating layer 33) when viewed in the thickness direction z. The constituent material of the second metal layer 42 includes nickel. The thickness of the second metal layer 42 is, for example, 0.1 μm to 0.5 μm.

The third metal layer 43 is laminated on the second metal layer 42. The third metal layer 43 overlaps both the first electrode 21 and the insulating portion 3 when viewed in the thickness direction z. The third metal layer 43 covers a region located inside the second extending portion 421 except for the outer peripheral portion (the second extending portion 421) of the second metal layer 42 when viewed in the thickness direction z. As a result, the second extending portion 421 of the second metal layer 42 is not covered with the third metal layer 43, but is exposed from the third metal layer 43. A third end edge 431, which is the outer peripheral edge of the third metal layer 43, is located between the second end edge 422 of the second metal layer 42 and the inner end edge 302 of the insulating portion 3 (the second insulating layer 33) when viewed in the thickness direction z. The constituent material of the third metal layer 43 includes silver (Ag). The thickness of the third metal layer 43 is larger than either the thickness of the first metal layer 41 or the thickness of the second metal layer 42. The thickness of the third metal layer 43 is, for example, 0.5 μm to 1.5 μm.

As can be seen from FIG. 8 and the above description, the second end edge 422 of the second metal layer 42 is located closer to the inner end edge 302 of the insulating portion 3 (the second insulating layer 33) than the first end edge 412 of the first metal layer 41. The third end edge 431 of the third metal layer 43 is located closer to the inner end edge 302 than the second end edge 422 of the second metal layer 42. As a result, the first metal layer 41, the second metal layer 42, and the third metal layer 43 are laminated in a stepped manner. In the configuration shown in FIG. 8, when viewed in the thickness direction z, a first dimension L1, which is a distance between the first end edge 412 and the second end edge 422, is, for example, ten to fifty times the thickness of the first metal layer 41. When viewed in the thickness direction z, a second dimension L2, which is a distance between the second end edge 422 and the third end edge 431, is, for example, ten to fifty times the thickness of the second metal layer 42. When viewed in the thickness direction z, a third dimension L3, which is a distance between the third end edge 431 and the inner end edge 302, is, for example, one to five times the thickness of the third metal layer 43.

As shown in FIGS. 3 and 4, the conductive member 5 is bonded to the first electrode 21 of the semiconductor element 2, and the second lead 1B. The conductive member 5 is made of a metal plate material. The metal is copper or a copper alloy. The conductive member 5 is a metal plate material that has been punched or bent. In the present embodiment, the conductive member 5 includes an element side bonding portion 51, a lead side bonding portion 52, and an intermediate portion 53. As shown in FIG. 4, the element side bonding portion 51, the lead side bonding portion 52, and the intermediate portion 53 are appropriately bent and connected when viewed in the first direction x.

The element side bonding portion 51 is bonded to the first electrode pad portion 212 of the first electrode 21 via the first conductive bonding material 61. The first conductive bonding material 61 conductively bonds the element side bonding portion 51 (the conductive member 5) and the first electrode pad portion 212. The first conductive bonding material 61 is, for example, solder.

As shown in FIGS. 4 to 6, a protruding portion 511 and a concave portion 512 are formed in the element side bonding portion 51. The protruding portion 511 protrudes downward (the other side in the thickness direction z) from the lower surface of the element side bonding portion 51 (a surface facing the element main surface 201). In the depicted example, two protruding portions 511 are provided at an interval in the second direction y, and each protruding portion 511 extends in the first direction x with a constant width. The concave portion 512 is a portion that is partially recessed upward (one side in the thickness direction z) from the lower surface of the element side bonding portion 51. In the depicted example, two concave portions 512 are provided at an interval in the first direction x, and each concave portion 512 extends in the second direction y with a constant width.

At the time of bonding the first electrode pad portion 212 and the element side bonding portion 51, while the protruding portion 511 is pressed against the first electrode pad portion 212 side, a sufficient amount of first conductive bonding material 61 is present around the protruding portion 511. As a result, the conduction between the element side bonding portion 51 and the first electrode pad portion 212 is appropriately maintained. Further, the concave portion 512 is provided on the lower surface of the element side bonding portion 51. As a result, even in a case where voids (vacancy) are present in the first conductive bonding material 61, the voids may be accommodated in the concave portion 512. Therefore, the voids in the first conductive bonding material 61 may be suppressed. Instead of the depicted concave portion 512, a through-hole may be formed through the element side bonding portion 51 in the thickness direction z to suppress the voids.

The lead side bonding portion 52 is bonded to the bonding portion 13 of the second lead 1B via the third conductive bonding material 63. The third conductive bonding material 63 conductively bonds the lead side bonding portion 52 (the conductive member 5) and the bonding portion 13 (the second lead 1B). The third conductive bonding material 63 is, for example, solder. As shown in FIG. 4, the lead side bonding portion 52 includes a convex portion located on the other side (the lower side of the figure) of the thickness direction z from the periphery. At the time of bonding the bonding portion 13 and the lead side bonding portion 52, while the convex portion is pressed against the bonding portion 13, a sufficient amount of third conductive bonding material 63 is present around the convex portion. As a result, the conduction between the lead side bonding portion 52 and the bonding portion 13 is appropriately maintained.

The intermediate portion 53 is located between the element side bonding portion 51 and the lead side bonding portion 52 in the second direction y. The intermediate portion 53 is connected to both the element side bonding portion 51 and the lead side bonding portion 52.

The sealing resin 7 covers a portion of each of the first lead 1A, the second lead 1B, and the third lead 1C, the semiconductor element 2, the insulating portion 3, the metal laminated portion 4, the conductive member 5, and the wire 65. The sealing resin 7 is made of, for example, a black epoxy resin.

As shown in FIGS. 1, 2, 4, and 6, the sealing resin 7 has a sealing resin main surface 71, a sealing resin back surface 72, and a sealing resin side surface 73. The sealing resin main surface 71 and the sealing resin back surface 72 face opposite sides in the thickness direction z. The sealing resin main surface 71 faces the same side as the element main surface 201 and the element mounting surface 111. The sealing resin back surface 72 faces the same side as the element back surface 202 and the back surface mounting portion 112. The sealing resin side surface 73 is connected to the sealing resin main surface 71 and the sealing resin back surface 72, and is slightly inclined with respect to the thickness direction z.

Next, an example of a method of manufacturing the semiconductor device A10 will be described below with reference to FIGS. 11 to 29. Each of FIGS. 12, 14, 16, and 20 to 29 is a cross-sectional view showing one step of the method of manufacturing the semiconductor device A10 and is the same cross-sectional view as the partially enlarged cross-sectional view shown in FIG. 8.

Figure 11:
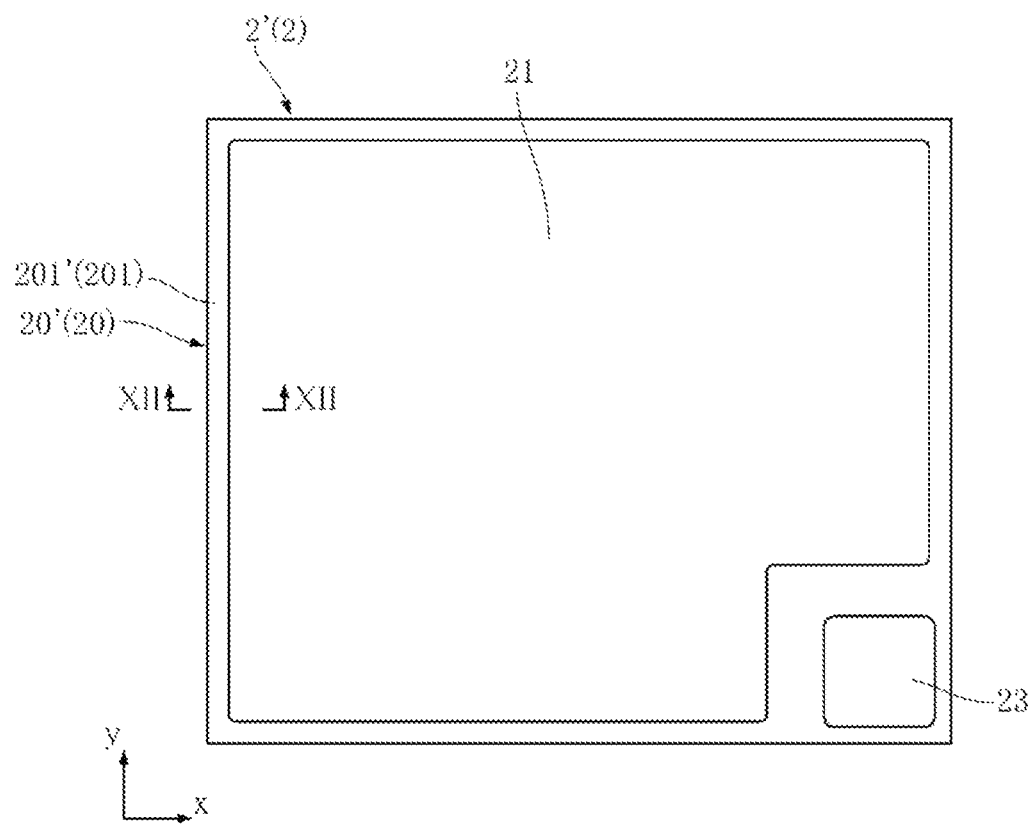
FIG. 11 is a plan view showing one step of an example of a method of manufacturing a semiconductor device according to the first embodiment of the present disclosure.
Figure 12:
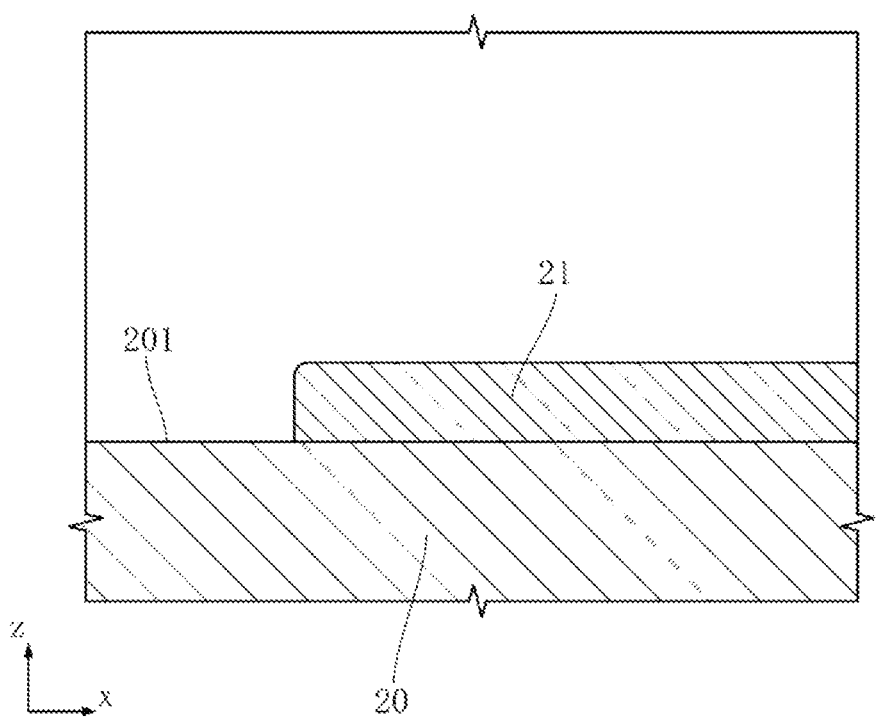
FIG. 12 is an enlarged cross-sectional view taken along line XII-XII of FIG. 11.

First, as shown in FIG. 11, a substrate 2' is provided. The substrate 2' includes a semiconductor layer 20', a first electrode 21, and a third electrode 23. The semiconductor layer 20' is a member that becomes the element main body 20 of the semiconductor element 2. In the present embodiment, the semiconductor layer 20' has a size that may be divided into a plurality of element main bodies 20 (the semiconductor element 2), for example by cutting the semiconductor layer 20' (the substrate 2') in a subsequent step. In the plan views after FIG. 11, a region corresponding to one element main body 20 (the semiconductor element 2) to be divided is shown. The semiconductor layer 20' has a main surface 201'. The main surface 201' faces one side in the thickness direction z. The first electrode 21 and the third electrode 23 are arranged on the main surface 201'. Although not shown, a plurality of first electrodes 21 and a plurality of third electrodes 23 are arranged on the main surface 201' with a distance in each of the first direction x and the second direction y. In the plan views after FIG. 11, a region corresponding to the element main surface 201 of one element main body 20 (the semiconductor element 2) to be divided is represented as the main surface 201'. This step corresponds to a "step of providing a substrate" of the present disclosure. In addition, unlike the example shown in FIG. 11, when the semiconductor element 2 including a single element main body 20 corresponding to the semiconductor layer 20' is provided as the substrate 2', it also corresponds to the "step of providing a substrate" of the present disclosure.

Figure 13:
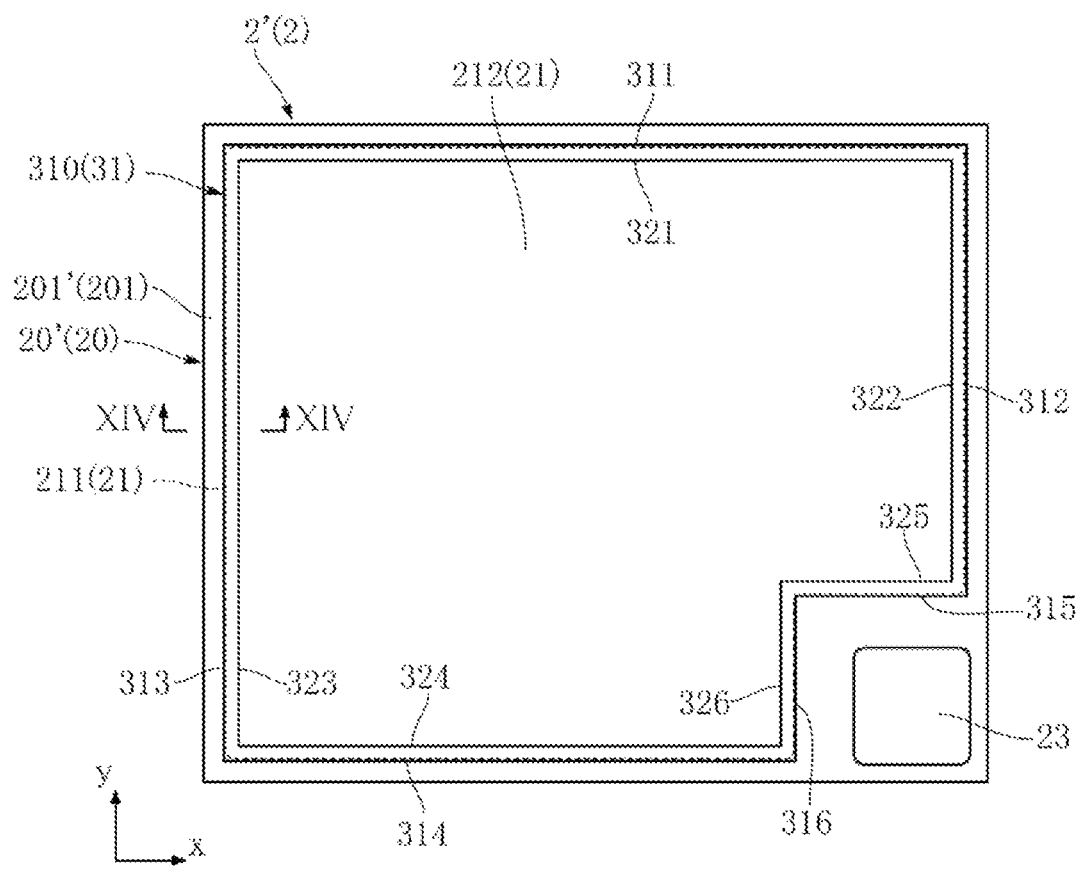
FIG. 13 is a plan view showing a step following FIG. 11.
Figure 14:
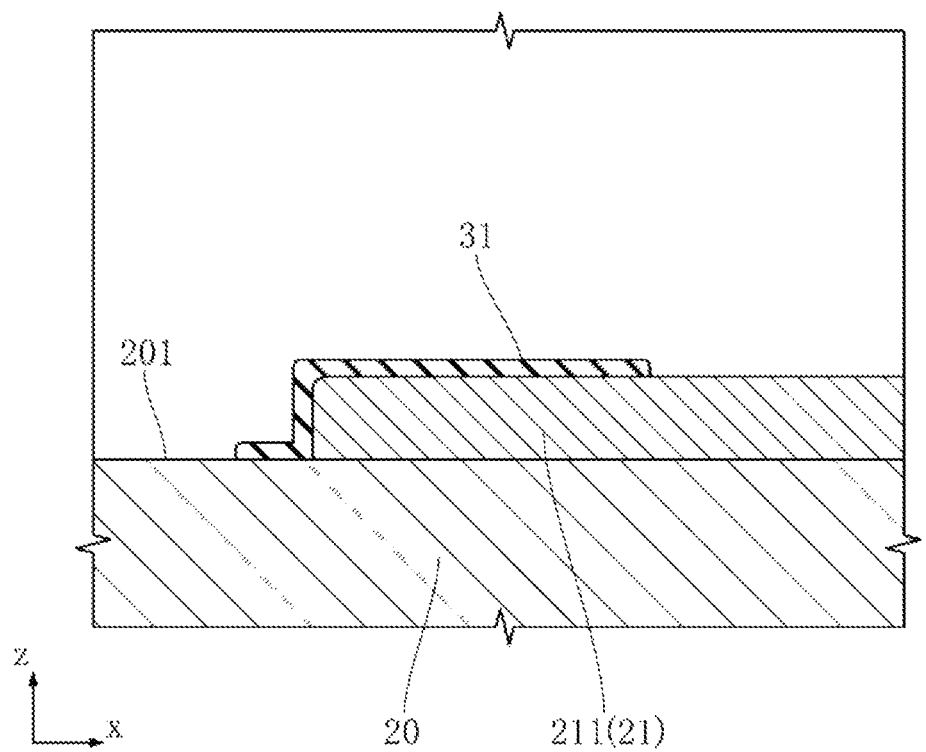
FIG. 14 is an enlarged cross-sectional view taken along line XIV-XIV of FIG. 13.

Next, as shown in FIG. 13, the first insulating layer 31 is formed on the main surface 201' side of the substrate 2'. The first insulating layer 31 may be formed by, for example, a thin film forming technique such as CVD (chemical vapor deposition). In the formation of the first insulating layer 31, for example, a mask including an opening corresponding to the first annular portion 310 is arranged on the substrate 2' to form a thin film made of SiN, and then the mask is removed. As a result, the first insulating layer 31 including the first annular portion 310 is formed. Here, the first annular portion 310 is arranged over the peripheral edge portion 211 of the first electrode 21, and the main surface 201'. The first annular portion 310 includes outer end boundary lines 311, 312, 313, 314, 315, and 316 and inner end boundary lines 321, 322, 323, 324, 325, and 326, similar to the configuration described with reference to FIG. 7.

Figure 15:
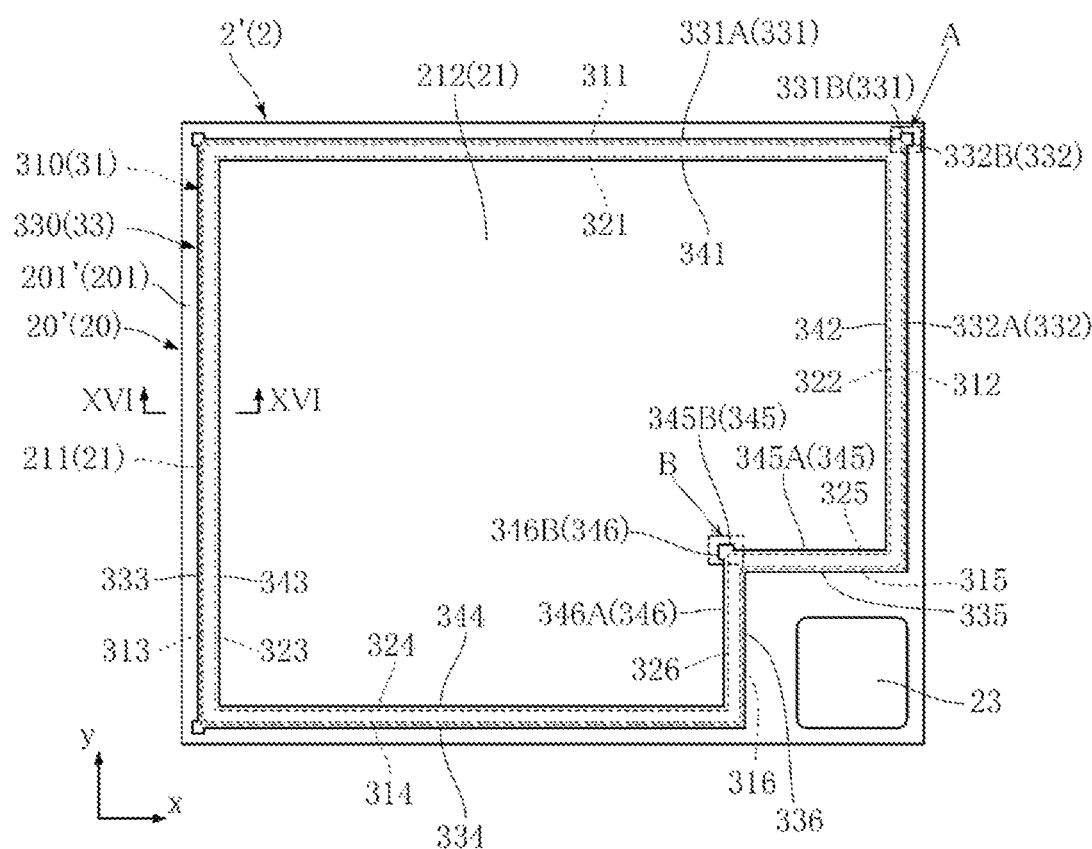
FIG. 15 is a plan view showing a step following FIG. 13.
Figure 16:
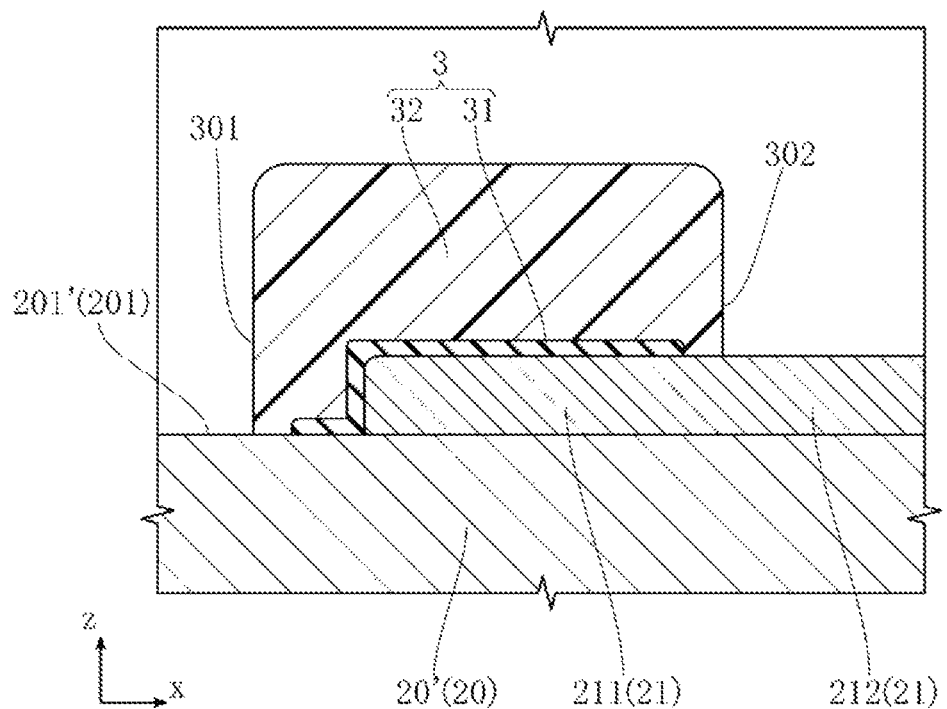
FIG. 16 is an enlarged cross-sectional view taken along line XVI-XVI of FIG. 15.

Next, as shown in FIG. 15, the second insulating layer 33 is formed on the main surface 201' side of the substrate 2'. The formation of the second insulating layer 33 may be performed, for example by arranging a polyamic acid (resin material) by coating, and heating it. In the formation of the second insulating layer 33, for example, a mask including an opening corresponding to the second annular portion 330 is first arranged on the substrate 2', the polyamic acid (resin material) is coated on the mask, and then the mask is removed. As a result, the second annular portion 330 made of a resin material is arranged. The second annular portion 330 overlaps with the first annular portion 310 when viewed in the thickness direction z. Here, the second annular portion 330 includes outer end boundary lines 331, 332, 333, 334, 335, and 336 and inner end boundary lines 341, 342, 343, 344, 345, and 346. The second annular portion 330 is similar to the configuration described with reference to FIG. 7. On the other hand, the second annular portion 330 shown in FIG. 15 is different from the configuration shown in FIG. 7 in the shape of the corner portion of the outer end boundary line 331 and the outer end boundary line 332 (the upper right corner portion of FIG. 15), the shape of the corner portion of the outer end boundary line 331 and the outer end boundary line 333 (the upper left corner portion of FIG. 15), the shape of the corner portion of the outer end boundary line 333 and the outer end boundary line 334 (the lower left corner portion of FIG. 15), and the shape of the corner portion of the inner end boundary line 345 and the inner end boundary line 346.

Figure 17:
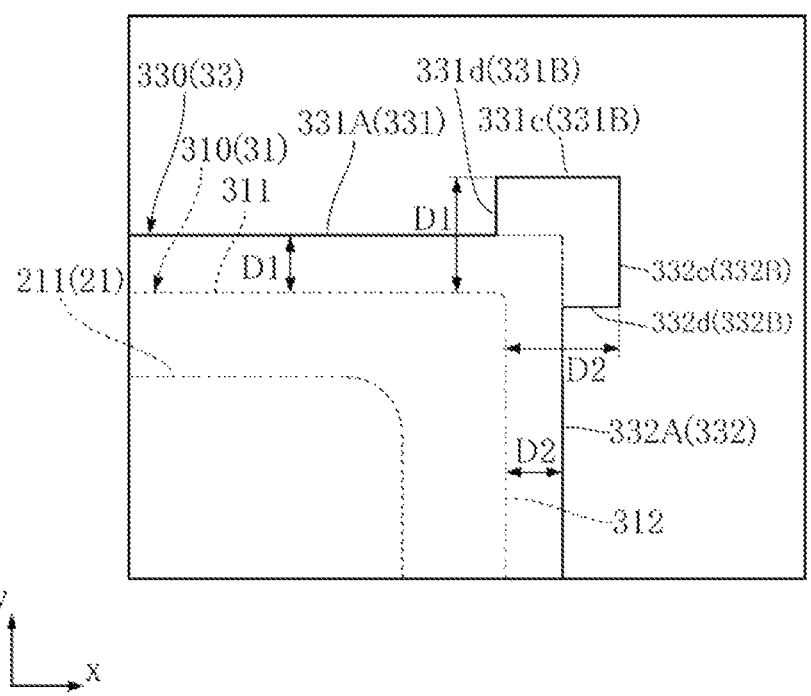
FIG. 17 is an enlarged view of portion A of FIG. 15.

As shown in FIG. 17, the outer end boundary line 331 includes an outer end boundary line first portion 331A and an outer end boundary line second portion 331B. The outer end boundary line second portion 331B is connected to the outer end boundary line first portion 331A and is located at the end portion near the outer end boundary line 332. The outer end boundary line second portion 331B is located outside the outer end boundary line first portion 331A in the second direction y. In the depicted example, the outer end boundary line second portion 331B includes an outer end boundary line straight line portion 331c and an outer end boundary line connecting portion 331d. The outer end boundary line straight line portion 331c extends linearly along the first direction x. The outer end boundary line connecting portion 331d is connected to both the outer end boundary line first portion 331A and the outer end boundary line straight line portion 331c. Therefore, with respect to the outer end boundary line 311 of the first annular portion 310 and the outer end boundary line 331 of the second annular portion 330, a distance (first distance D1) between the outer end boundary line 311 and the outer end boundary line 331 in the second direction y is set to be larger at an end portion near the outer end boundary line 332 than a center portion in the first direction x. The first distance D1 is not particularly limited. In the present embodiment, for example, the first distance D1 at the center portion in the first direction x (a distance between the outer end boundary line 311 and the outer end boundary line first portion 331A in the second direction y) is about 10 μm to 20 μm, and the first distance D1 at the end portion near the outer end boundary line 332 (a distance between the outer end boundary line 311 and the outer end boundary line straight line portion 331c in the second direction y) is about 15 μm to 35 μm.

The outer end boundary line 332 includes an outer end boundary line first portion 332A and an outer end boundary line second portion 332B. The outer end boundary line second portion 332B is connected to both the outer end boundary line first portion 332A and the outer end boundary line straight line portion 331c (the outer end boundary line second portion 331B) and is located at the end portion near the outer end boundary line 331. The outer end boundary line second portion 332B is located outside the outer end boundary line first portion 332A in the first direction x. In the depicted example, the outer end boundary line second portion 332B includes an outer end boundary line straight line portion 332c and an outer end boundary line connecting portion 332d. The outer end boundary line straight line portion 332c extends linearly along the second direction y. The outer end boundary line connecting portion 332d is connected to both the outer end boundary line first portion 332A and the outer end boundary line straight line portion 332c. Therefore, with respect to the outer end boundary line 312 of the first annular portion 310 and the outer end boundary line 332 of the second annular portion 330, a distance (second distance D2) between the outer end boundary line 312 and the outer end boundary line 332 in the first direction x is set to be larger at the end portion near the outer end boundary line 331 than the center portion in the second direction y. The second distance D2 is not particularly limited. In the present embodiment, for example, the second distance D2 at the center portion in the second direction y (a distance between the outer end boundary line 312 and the outer end boundary line first portion 332A in the first direction x) is about 10 μm to 20 μm, and the second distance D2 at the end portion near the outer end boundary line 331 (a distance between the outer end boundary line 312 and the outer end boundary line straight line portion 332c in the first direction x) is about 15 μm to 35 μm.

Further, the outer end boundary line second portion 332B is also connected to the outer end boundary line second portion 331B. As a result, the corner portion (the outer end boundary line second portion 331B and the outer end boundary line second portion 332B) of the outer end boundary line 331 and the outer end boundary line 332 has a shape that protrudes outward in both the first direction x and the second direction y. The corner portion (the outer end boundary line second portion 331B and the outer end boundary line second portion 332B) of the outer end boundary line 331 and the outer end boundary line 332 shown in FIG. 17 protrudes outward from the corner portion (the outer end boundary line overhanging portion 331E and the outer end boundary line overhanging portion 332E) of the outer end boundary line 331 and the outer end boundary line 332 shown in FIG. 9.

Although detailed illustration and description are omitted, the end portion of the outer end boundary line 331 near the outer end boundary line 333 is located on the outside in the second direction y, similarly to the end portion (the outer end boundary line second portion 331B) of the outer end boundary line 331 near the outer end boundary line 332. Further, the end portion of the outer end boundary line 333 near the outer end boundary line 331 is located on the outside in the first direction x, similarly to the end portion (the outer end boundary line second portion 332B) of the outer end boundary line 332 near the outer end boundary line 331. As a result, the corner portion of the outer end boundary line 331 and the outer end boundary line 333 (the upper left corner portion of FIG. 15) has a shape that protrudes outward in both the first direction x and the second direction y, similarly to the corner portion of the outer end boundary line 331 and the outer end boundary line 332.

Although detailed illustration and description are omitted, the end portion of the outer end boundary line 334 near the outer end boundary line 333 is located on the outside in the second direction y, similarly to the end portion (the outer end boundary line second portion 331B) of the outer end boundary line 331 near the outer end boundary line 332. Further, the end portion of the outer end boundary line 333 near the outer end boundary line 334 is located on the outside in the first direction x, similarly to the end portion (the outer end boundary line second portion 332B) of the outer end boundary line 332 near the outer end boundary line 331. As a result, the corner portion of the outer end boundary line 333 and the outer end boundary line 334 (the lower left corner portion of FIG. 15) has a shape that protrudes outward in both the first direction x and the second direction y, similarly to the corner portion of the outer end boundary line 331 and the outer end boundary line 332.

Figure 18:
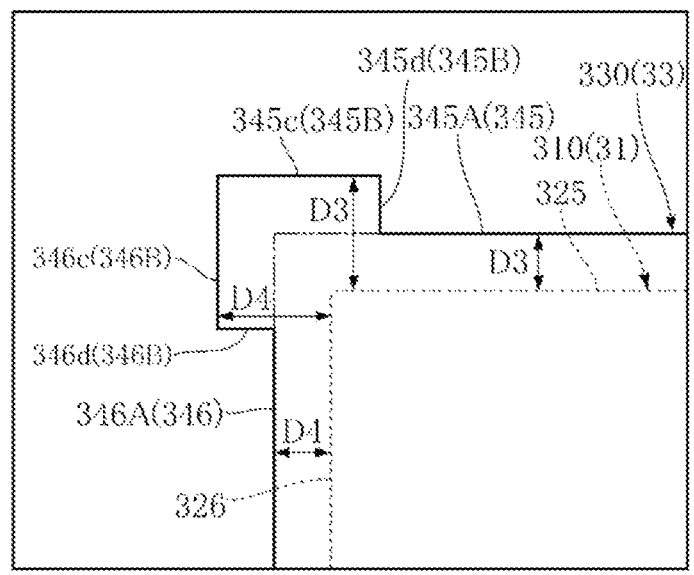
FIG. 18 is an enlarged view of portion B in FIG. 15.
Figure 18:
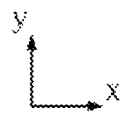

As shown in FIG. 18, the inner end boundary line 345 includes an inner end boundary line first portion 345A and an inner end boundary line second portion 345B. The inner end boundary line second portion 345B is connected to the inner end boundary line first portion 345A and is located at the end portion near the inner end boundary line 346. The inner end boundary line second portion 345B is located inside the inner end boundary line first portion 345A in the second direction y. In the depicted example, the inner end boundary line second portion 345B includes an inner end boundary line straight line portion 345c and an inner end boundary line connecting portion 345d. The inner end boundary line straight line portion 345c extends linearly along the first direction x. The inner end boundary line connecting portion 345d is connected to both the inner end boundary line first portion 345A and the inner end boundary line straight line portion 345c. Therefore, with respect to the inner end boundary line 325 of the first annular portion 310 and the inner end boundary line 345 of the second annular portion 330, a distance (third distance D3) between the inner end boundary line 325 and the inner end boundary line 345 in the second direction y is set to be larger at an end portion near the inner end boundary line 346 than a center portion in the first direction x. The third distance D3 is not particularly limited. In the present embodiment, for example, the third distance D3 at the center portion in the first direction x (a distance between the inner end boundary line 325 and the inner end boundary line first portion 345A in the second direction y) is about 20 μm to 30 μm, and the third distance D3 at the end portion near the inner end boundary line 346 (a distance between the inner end boundary line 325 and the inner end boundary line straight line portion 345c in the second direction y) is about 30 μm to 50 μm.

The inner end boundary line 346 includes an inner end boundary line first portion 346A and an inner end boundary line second portion 346B. The inner end boundary line second portion 346B is connected to both the inner end boundary line first portion 346A and the inner end boundary line straight line portion 345c (the inner end boundary line second portion 345B) and is located at the end portion near the inner end boundary line 345. The inner end boundary line second portion 346B is located inside the inner end boundary line first portion 346A in the first direction x. In the depicted example, the inner end boundary line second portion 346B includes an inner end boundary line straight line portion 346c and an inner end boundary line connecting portion 346d. The inner end boundary line straight line portion 346c extends linearly along the second direction y. The inner end boundary line connecting portion 346d is connected to both the inner end boundary line first portion 346A and the inner end boundary line straight line portion 346c. Therefore, with respect to the inner end boundary line 326 of the first annular portion 310 and the inner end boundary line 346 of the second annular portion 330, a distance (fourth distance D4) between the inner end boundary line 326 and the inner end boundary line 346 in the first direction x is set to be larger at the end portion near the inner end boundary line 345 than the center portion in the second direction y. The fourth distance D4 is not particularly limited. In the present embodiment, for example, the fourth distance D4 at the center portion in the second direction y (a distance between the inner end boundary line 326 and the inner end boundary line first portion 346A in the first direction x) is about 20 μm to 30 μm, and the fourth distance D4 at the end portion near the inner end boundary line 345 (a distance between the inner end boundary line 326 and the inner end boundary line straight line portion 346c in the first direction x) is about 30 μm to 50 μm.

Further, the inner end boundary line second portion 346B is also connected to the inner end boundary line second portion 345B. As a result, the corner portion (the inner end boundary line second portion 345B and the inner end boundary line second portion 346B) of the inner end boundary line 345 and the inner end boundary line 346 has a shape that protrudes inward in both the first direction x and the second direction y. The corner portion (the inner end boundary line second portion 345B and the inner end boundary line second portion 346B) of the inner end boundary line 345 and the inner end boundary line 346 shown in FIG. 18 protrudes inward from the corner portion (the inner end boundary line overhanging portion 345E and the inner end boundary line overhanging portion 346E) of the inner end boundary line 345 and the inner end boundary line 346 shown in FIG. 10.

Figure 19:
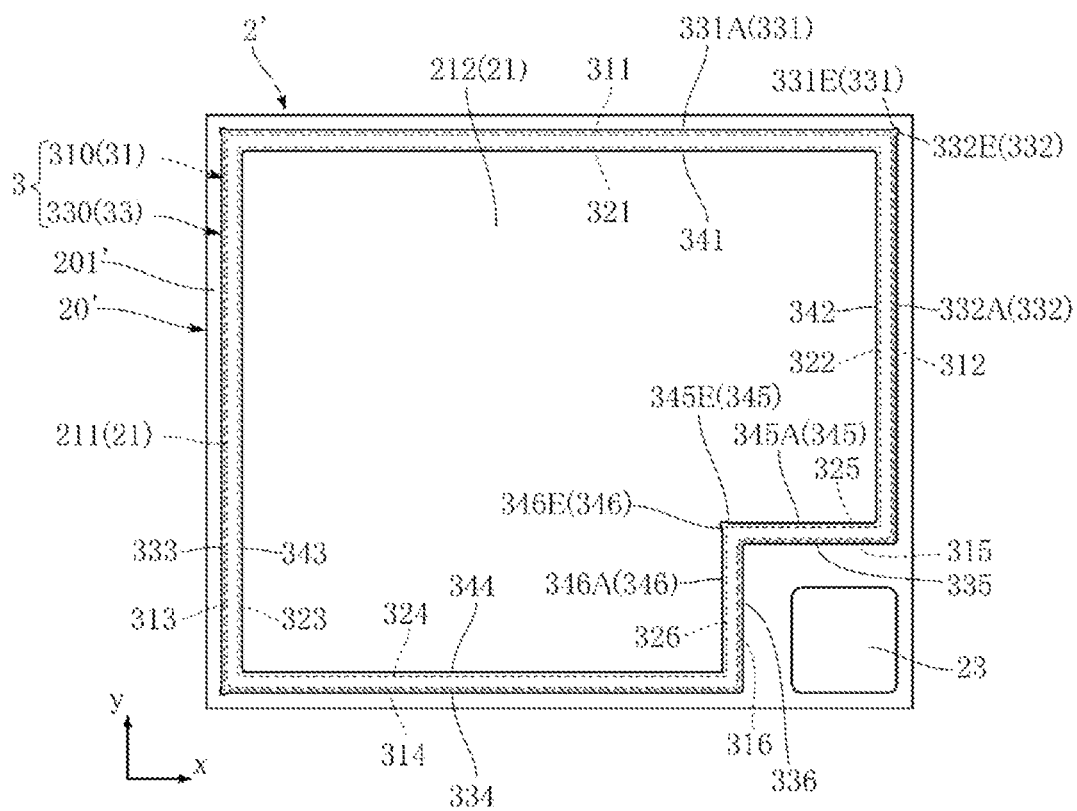
FIG. 19 is a plan view showing a step following FIG. 15.
Figure 19:

FIG. 19 shows the second annular portion 330 after being heat-treated. Here, the second annular portion 330 (the second insulating layer 33) made of a polyimide resin is formed. The heat-treated second annular portion 330 shrinks as compared with the non-heat-treated second annular portion 330 shown in FIG. 15. The shrinkage of the resin material portion is remarkable at the corner portion of the outer end boundary line 331 and the outer end boundary line 332, the corner portion of the inner end boundary line 345 and the inner end boundary line 346, and the like. As shown in FIG. 19, the outer end boundary line overhanging portion 331E and the outer end boundary line overhanging portion 332E are formed at the corner portion of the outer end boundary line 331 and the outer end boundary line 332, and the inner end boundary line overhanging portion 345E and the inner end boundary line overhanging portion 346E are formed at the corner portion of the inner end boundary line 345 and the inner end boundary line 346. In this way, the insulating portion 3 including the first insulating layer 31 and the second insulating layer 33 is formed.

Figure 20:
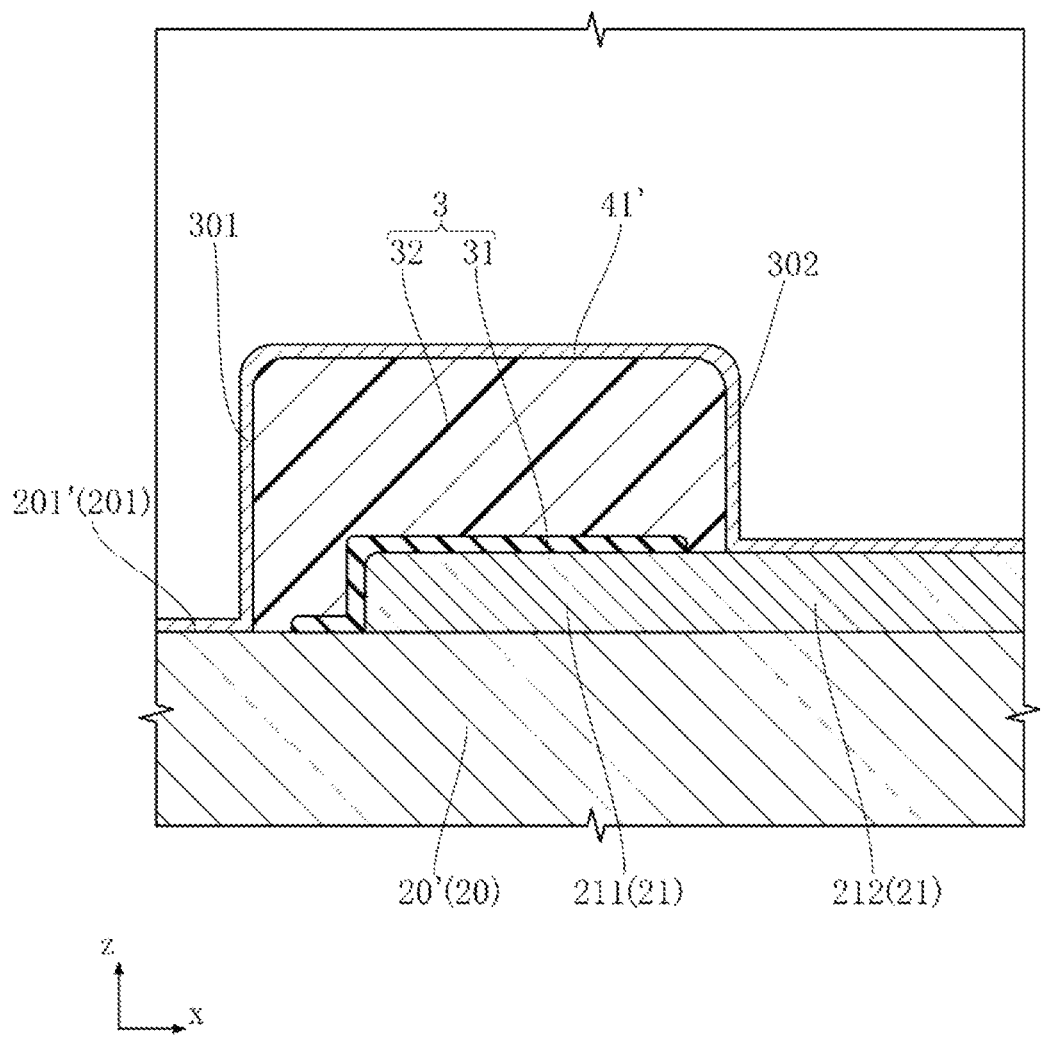
FIG. 20 is a partially enlarged cross-sectional view showing a step after FIG. 19.

Next, as shown in FIG. 20, a first metal layer material 41' is formed. The first metal layer material 41' is formed on at least the insulating portion 3 and the first electrode 21. The first metal layer material 41' is a metal layer formed by a thin film forming technique such as sputtering. The first metal layer material 41' is, for example, a Ti layer.

Figure 21:
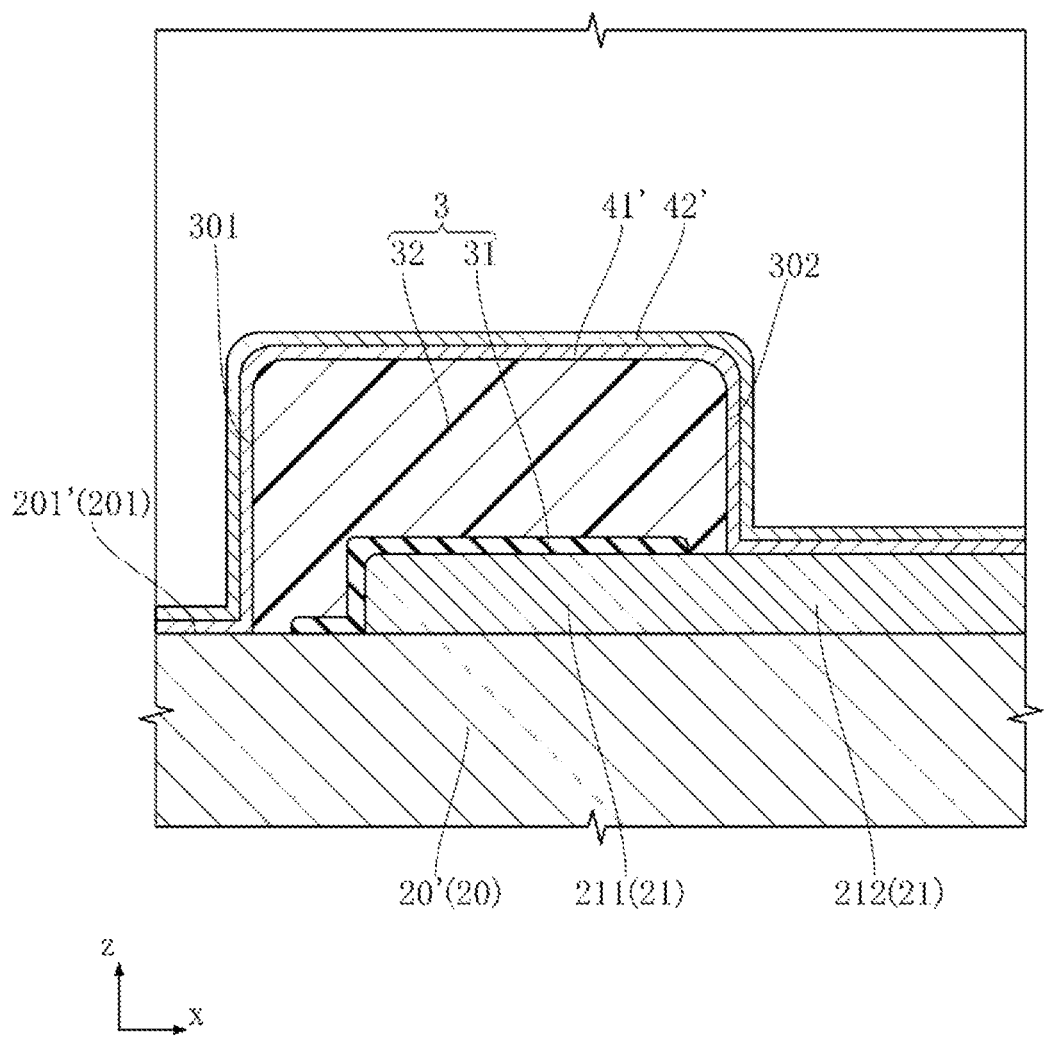
FIG. 21 is a partially enlarged cross-sectional view showing a step following FIG. 20.

Next, as shown in FIG. 21, a second metal layer material 42' is formed. The second metal layer material 42' is formed on the first metal layer material 41'. The second metal layer material 42' is a metal layer formed by a thin film forming technique such as sputtering. The second metal layer material 42' is formed of a metal material different from the first metal layer material 41', and is, for example, a Ni layer.

Figure 22:
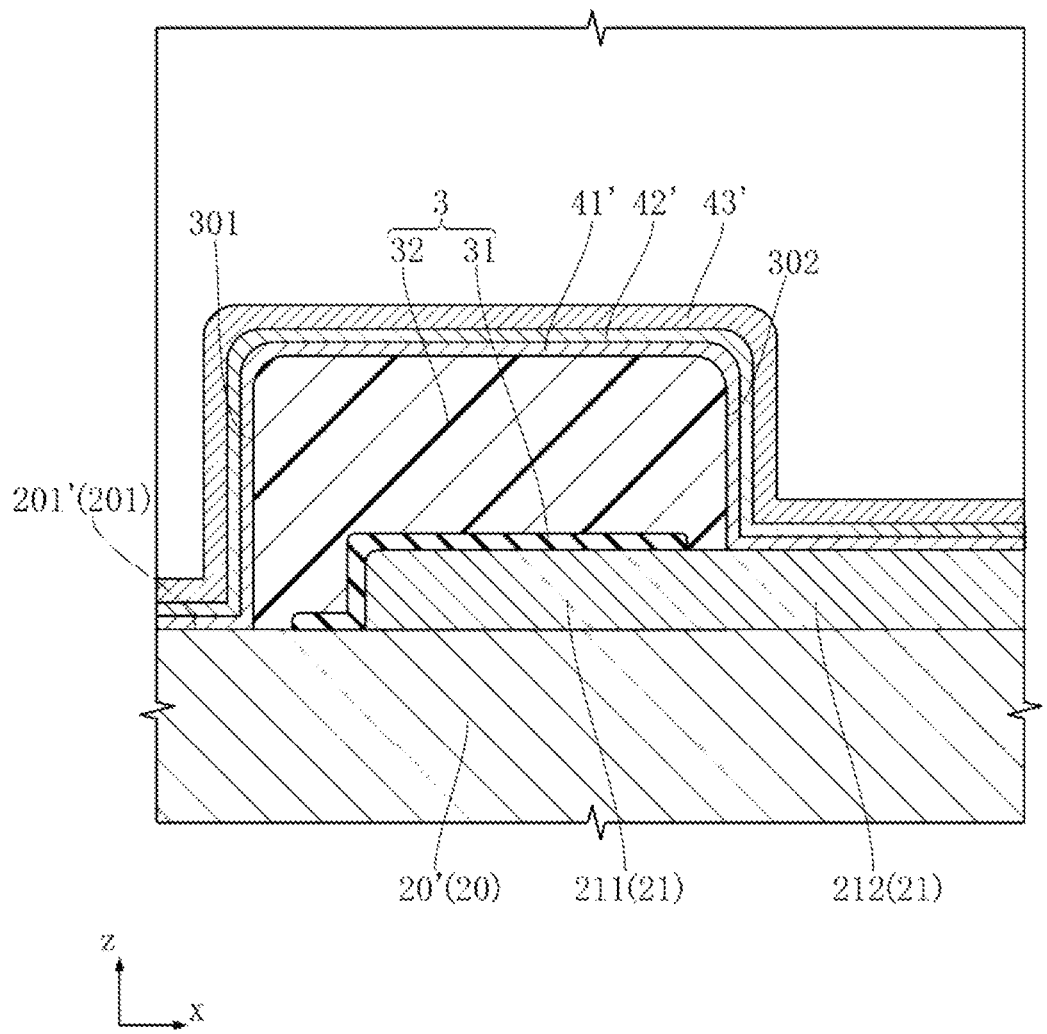
FIG. 22 is a partially enlarged cross-sectional view showing a step following FIG. 21.

Next, as shown in FIG. 22, a third metal layer material 43' is formed. The third metal layer material 43' is formed on the second metal layer material 42'. The third metal layer material 43' is a metal layer formed by a thin film forming technique such as sputtering. The third metal layer material 43' is formed of a metal material different from any of the first metal layer material 41' and the second metal layer material 42', and is, for example, an Ag layer.

Figure 23:
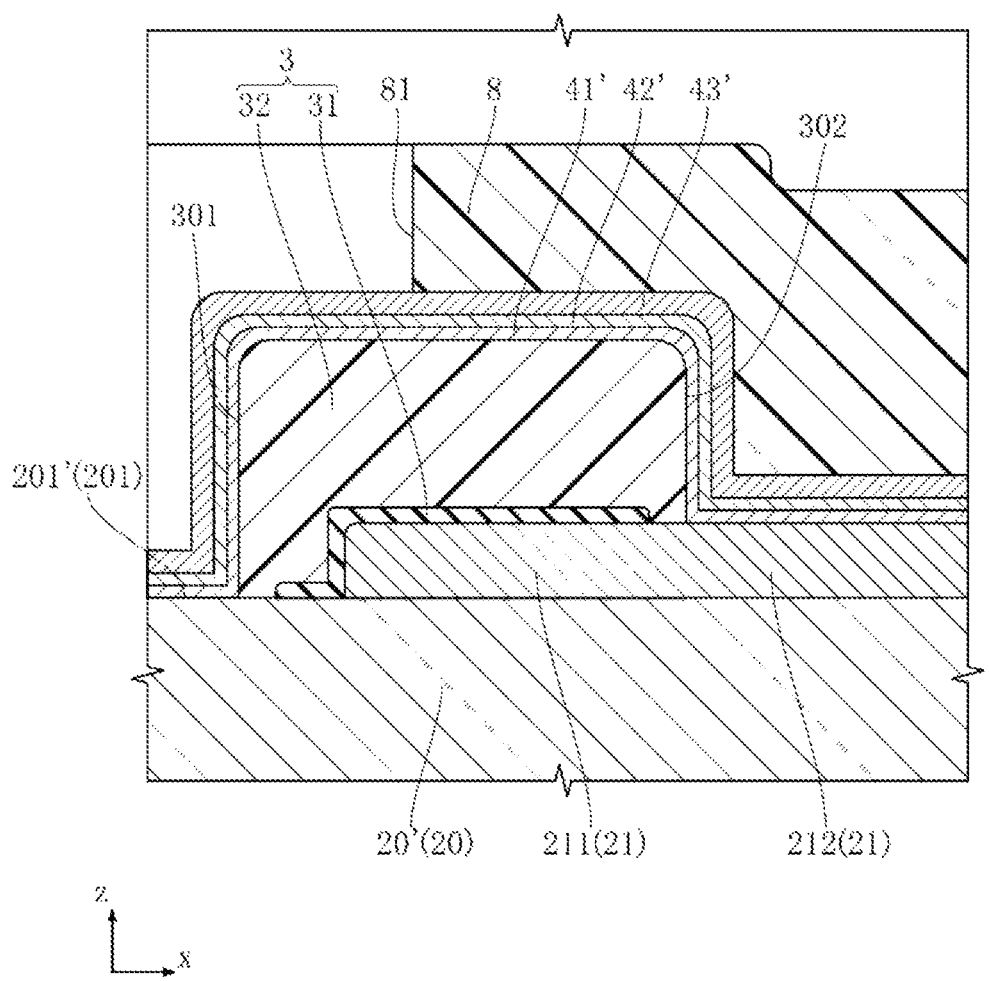
FIG. 23 is a partially enlarged cross-sectional view showing a step following FIG. 22.

Next, as shown in FIG. 23, a resist 8 is formed. The resist 8 can be formed, for example by exposure/development by a photolithography technique. In the formation of the resist 8, a photosensitive material is coated on the third metal layer material 43', and is subjected to an exposing/developing process of a predetermined pattern. As a result, the resist 8 including an opening 81 is formed. The opening 81 overlaps with a portion of the insulating portion 3 (a portion on the side of the outer end edge 301) when viewed in the thickness direction z. Here, since the thickness of the second insulating layer 33 is relatively large, the thickness of the resist 8 formed over the first electrode pad portion 212 and the second insulating layer 33 is increased so that a large step does not occur in the resist 8. Further, the amount of exposure to the photosensitive material may be twice or more the usual amount and the development of the photosensitive material may be performed a plurality of times to appropriately form the opening 81 in the resist 8 having a large thickness.

Figure 24:
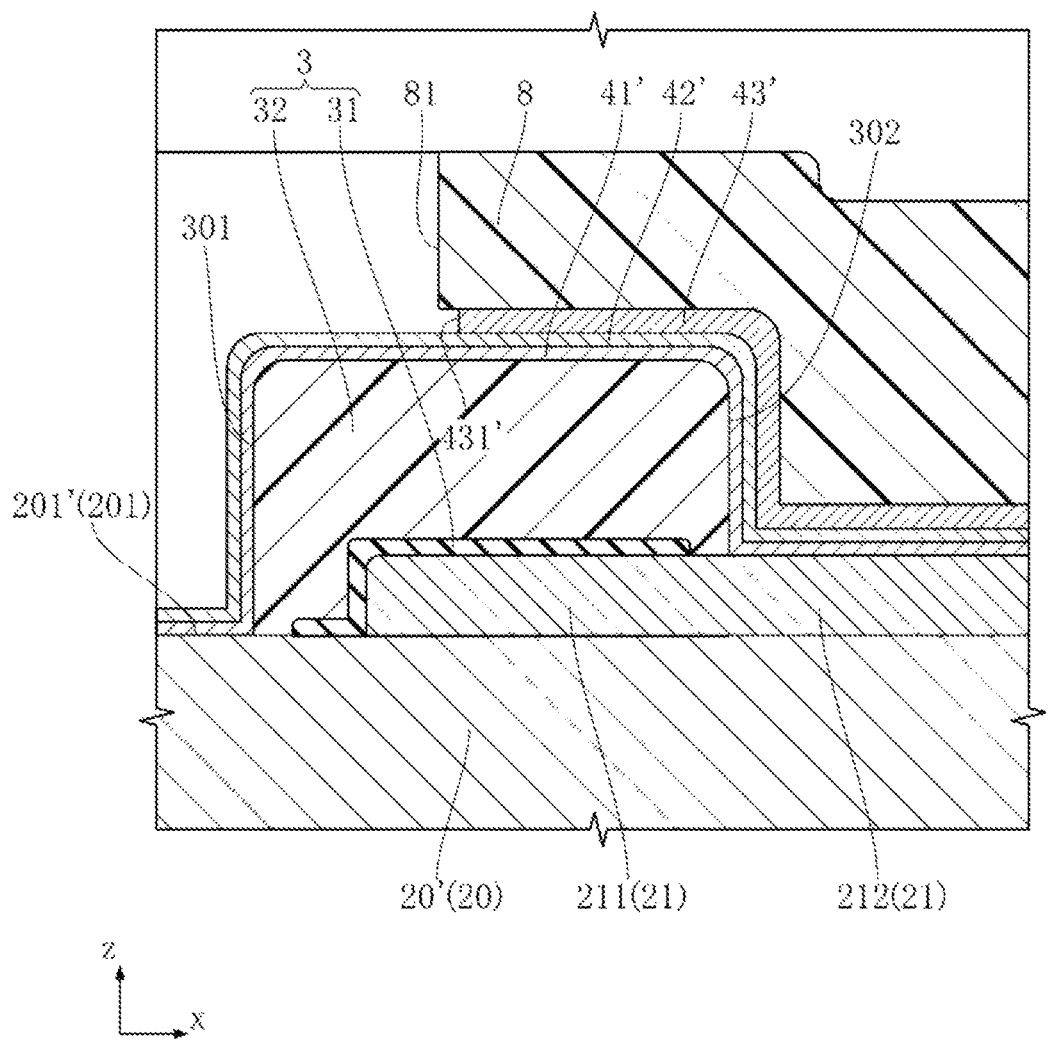
FIG. 24 is a partially enlarged cross-sectional view showing a step following FIG. 23.

Next, as shown in FIG. 24, a portion of the third metal layer material 43' is removed. Specifically, wet etching is performed on the third metal layer material 43' by using the resist 8 as a mask (first etching step). The wet etching process of the third metal layer material 43' is performed by using a chemical solution that dissolves the third metal layer material 43'. As a result, as shown in FIG. 24, in the third metal layer material 43', a part exposed from the resist 8 and a portion of a part covered with the resist 8 are removed to form an end edge 431'.

Figure 25:
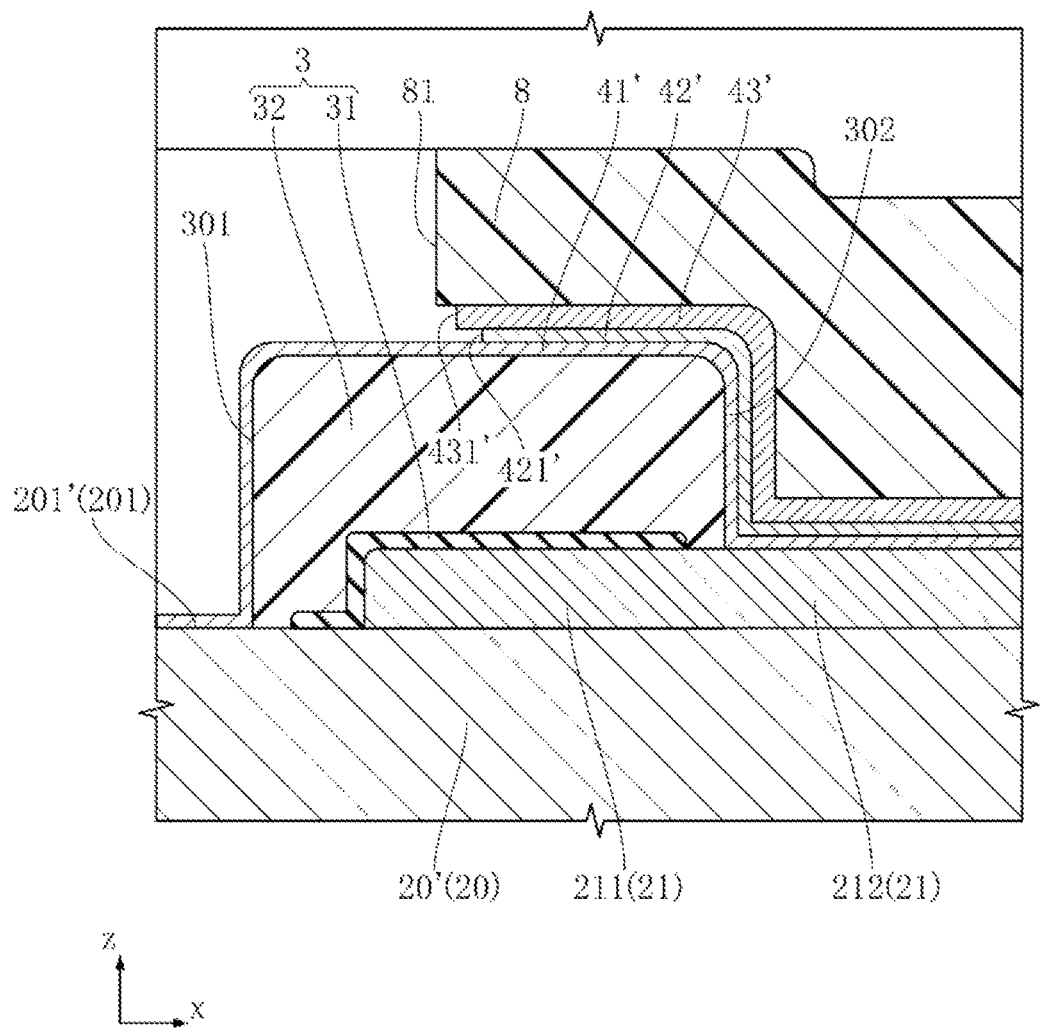
FIG. 25 is a partially enlarged cross-sectional view showing a step following FIG. 24.

Next, as shown in FIG. 25, a portion of the second metal layer material 42' is removed. Specifically, wet etching is performed on the second metal layer material 42' by using the resist 8 as a mask (second etching step). The wet etching process of the second metal layer material 42' is performed by using a chemical solution that dissolves the second metal layer material 42'. As a result, as shown in FIG. 25, in the second metal layer material 42', a part exposed from the third metal layer material 43' and a portion of a part covered with the third metal layer material 43' are removed to form an end edge 421'.

Figure 26:
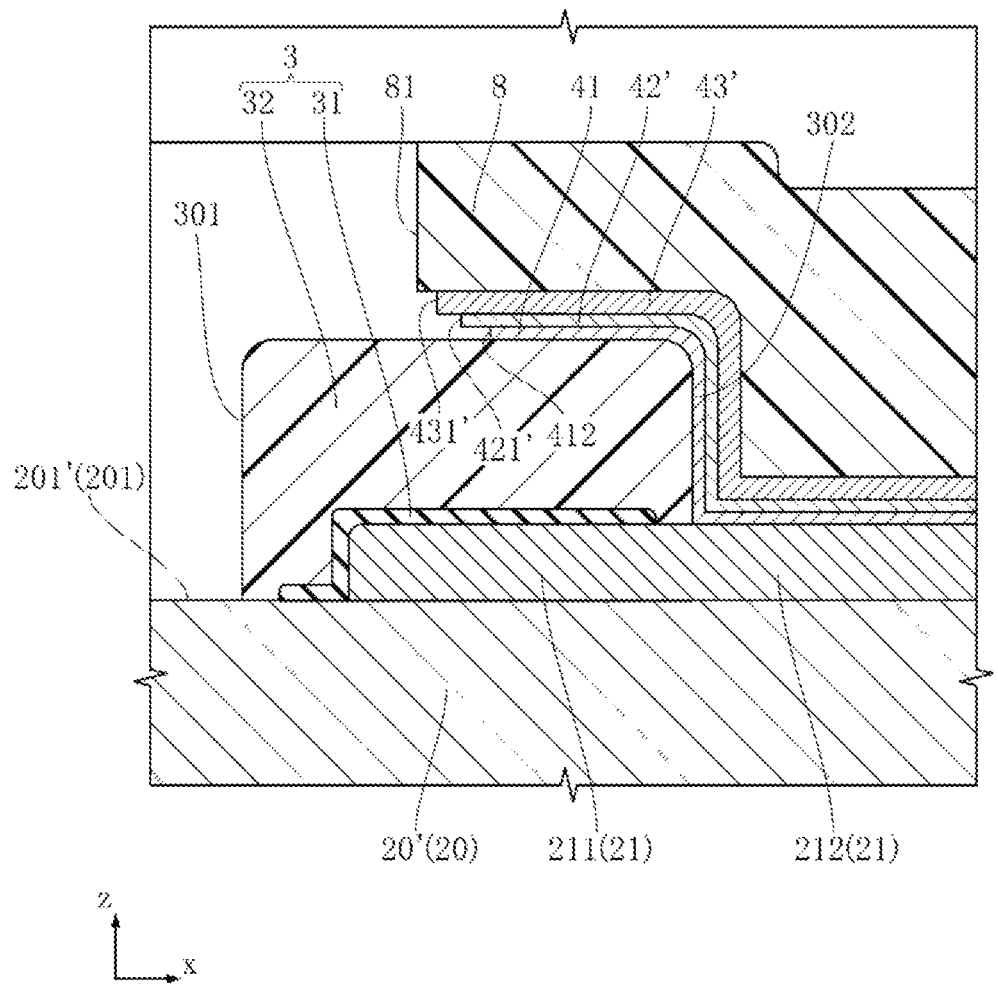
FIG. 26 is a partially enlarged cross-sectional view showing a step following FIG. 25.

Next, as shown in FIG. 26, a portion of the first metal layer material 41' is removed. Specifically, wet etching is performed on the first metal layer material 41' by using the resist 8 as a mask (third etching step). The wet etching process of the first metal layer material 41' is performed by using a chemical solution that dissolves the first metal layer material 41'. As a result, as shown in FIG. 26, in the first metal layer material 41', a part exposed from the second metal layer material 42' and a portion of a part covered with the second metal layer material 42' are removed to form the first metal layer 41 including the first end edge 412.

Figure 27:
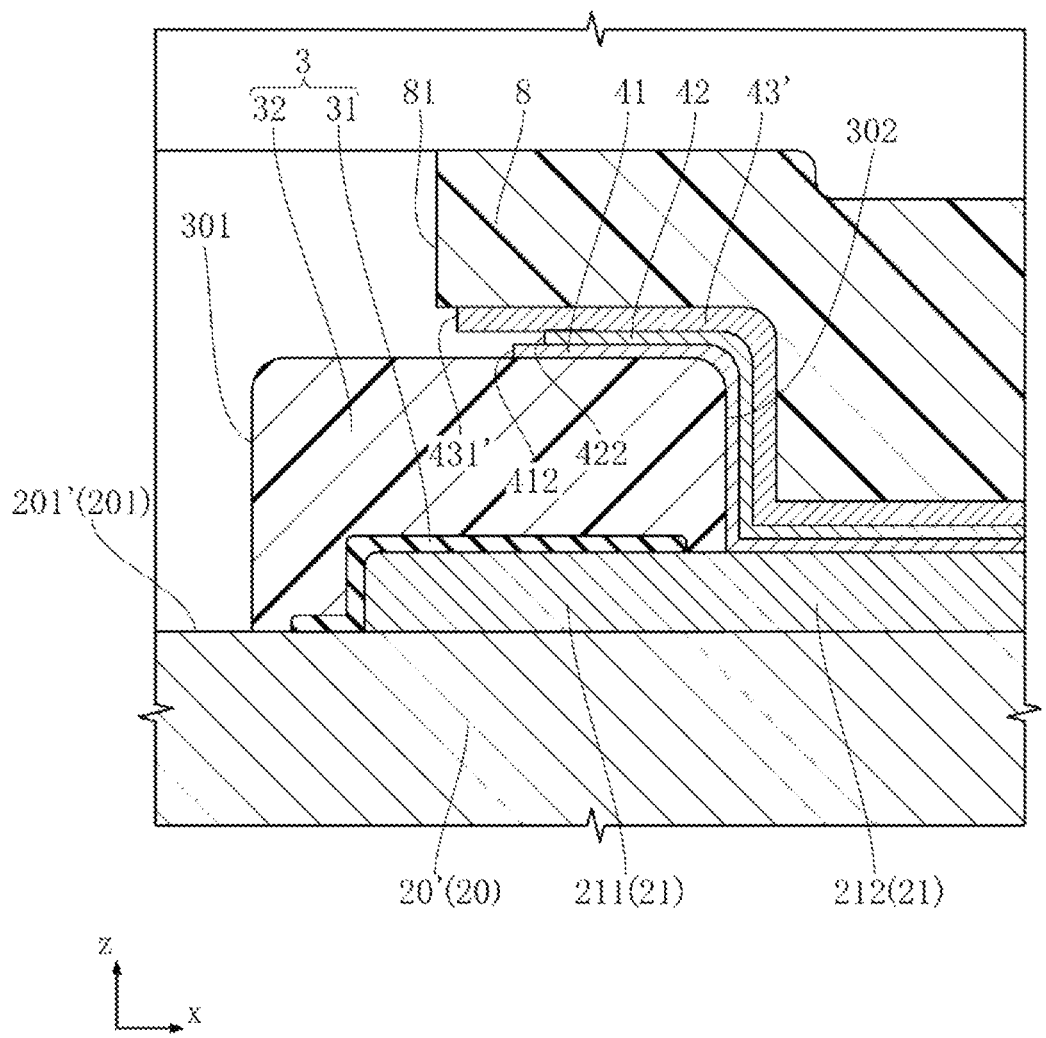
FIG. 27 is a partially enlarged cross-sectional view showing a step following FIG. 26.

Next, as shown in FIG. 27, a portion of the second metal layer material 42' is removed. Specifically, wet etching is performed on the second metal layer material 42' by using the resist 8 as a mask (fourth etching step). The wet etching process of the second metal layer material 42' is performed by using a chemical solution that dissolves the second metal layer material 42'. As a result, as shown in FIG. 27, in the second metal layer material 42', a part exposed from the first metal layer 41 and a portion of a part covered with the first metal layer 41 are removed to form the second metal layer 42 including the second end edge 422.

Figure 28:
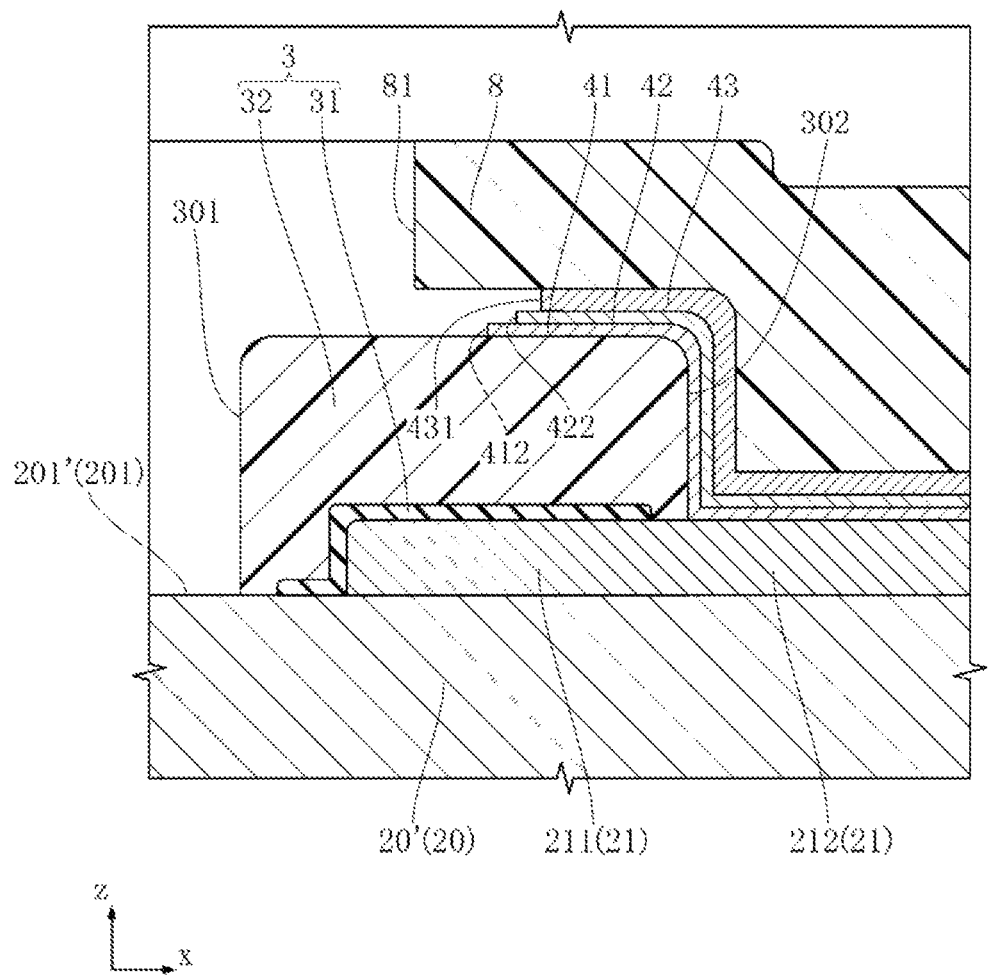
FIG. 28 is a partially enlarged cross-sectional view showing a step following FIG. 27.
Figure 29:
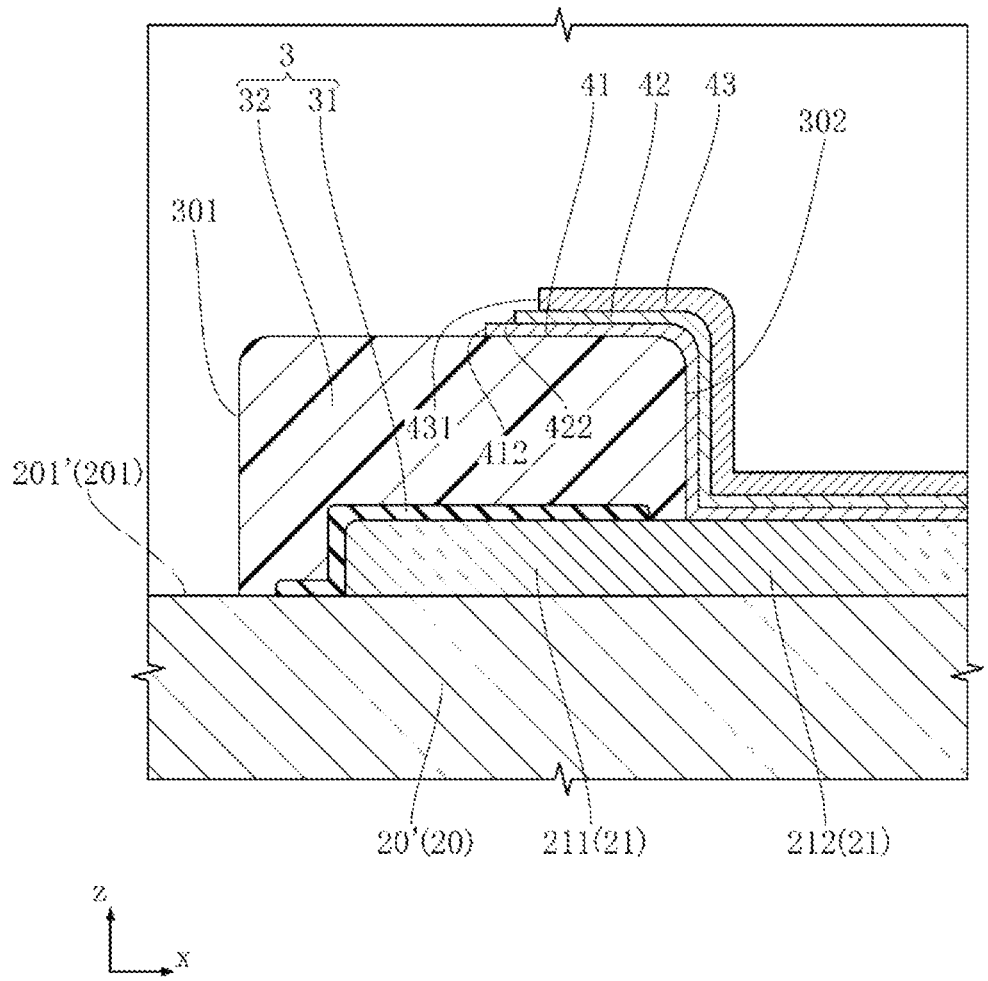
FIG. 29 is a partially enlarged cross-sectional view showing a step following FIG. 28.

Next, as shown in FIG. 28, a portion of the third metal layer material 43' is removed. Specifically, wet etching is performed on the third metal layer material 43' by using the resist 8 as a mask (fifth etching step). The wet etching process of the third metal layer material 43' is performed by using a chemical solution that dissolves the third metal layer material 43'. As a result, as shown in FIG. 28, in the third metal layer material 43', a part exposed from the second metal layer 42 and a portion of a part covered with the second metal layer 42 are removed to form the third metal layer 43 including the third end edge 431. In this way, the first metal layer 41, the second metal layer 42, and the third metal layer 43, which are laminated in a stepped manner, are formed. The positions of the first end edge 412, the second end edge 422, and the third end edge 431 (in FIG. 28, the position of each of the first end edge 412, the second end edge 422, and the third end edge 431 in the first direction x) may be adjusted by changing the etching conditions in each etching process. Next, as shown in FIG. 29, the resist 8 is removed.

Thereafter, the semiconductor layer 20' (the substrate 2') is cut along a plane perpendicular to the first direction x and a plane perpendicular to the second direction y to be divided into a plurality of semiconductor elements 2. Next, a lead frame having a shape including the first lead 1A, the second lead 1B, and the third lead 1C is provided, and bonding of the semiconductor element 2, boding of the conductive member 5, and wire bonding of the wire 65 to the lead frame are performed. Next, the sealing resin 7 is formed by molding. Next, the lead frame is appropriately cut to separate the first lead 1A, the second lead 1B, and the third lead 1C from one another. Through the above steps, the semiconductor device A10 shown in FIGS. 1 to 10 is manufactured.

Next, the operation and effects of the present embodiment will be described.

In the manufacture of the semiconductor device A10, the first insulating layer 31 and the second insulating layer 33 are formed on the side of the main surface 201' of the substrate 2'. In the step of forming the first insulating layer 31, the first annular portion 310 arranged over the peripheral edge portion 211 of the first electrode 21 as well as the main surface 201' is formed. In the step of forming the second insulating layer 33, the second annular portion 330, which overlaps with the first annular portion 310 in the thickness direction z and is made of a resin material, is arranged. As shown in FIGS. 15 and 17, the distance (the first distance D1) between the outer end boundary line 311 of the first annular portion 310 and the outer end boundary line 331 of the second annular portion 330 in the second direction y is larger at an end portion near the outer end boundary line 332 than a center portion in the first direction x. Further, the distance (the second distance D2) between the outer end boundary line 312 of the first annular portion 310 and the outer end boundary line 332 of the second annular portion 330 in the first direction x is larger at the end portion near the outer end boundary line 331 than the center portion in the second direction y. As a result, the second annular portion 330 is larger in volume than the other portions outside the corner portion of the outer end boundary line 331 and the outer end boundary line 332. With such a configuration, after the second annular portion 330 is heat-treated, even in a case where the second annular portion 330 shrinks at the corner portion of the outer end boundary line 331 and the outer end boundary line 332, the state of covering the first insulating layer 31 (the first annular portion 310), which is a lower layer, is maintained, which can prevent the first insulating layer 31 from being exposed. Therefore, it is possible to suppress the influence of shrinkage of the second annular portion 330 (the second insulating layer 33) which is the resin material portion. Further, in the second annular portion 330, the corner portion of the outer end boundary line 331 and the outer end boundary line 333 and the corner portion of the outer end boundary line 333 and the outer end boundary line 334 also have the same configuration as the corner portion of the above-described outer end boundary line 331 and outer end boundary line 332, and have the same effects as the corner portion of the outer end boundary line 331 and the outer end boundary line 333.

Further, the corner portion of the outer end boundary line 331 and the outer end boundary line 332, the corner portion of the outer end boundary line 331 and the outer end boundary line 333, and the corner portion of the outer end boundary line 333 and the outer end boundary line 334, the shapes of which have been devised as described above, are located near the corner portion of the semiconductor element 2 when viewed in the thickness direction z. With such a configuration, even when the semiconductor layer 20' is divided into a plurality of semiconductor elements 2 by cutting the semiconductor layer 20', it is possible to appropriately protect the corner portion of the first insulating layer 31 (the first annular portion 310) in the vicinity of a dividing line.

In the step of arranging the second annular portion 330 in the step of forming the second insulating layer 33, the outer end boundary line 331 includes the outer end boundary line first portion 331A and the outer end boundary line second portion 331B. The outer end boundary line first portion 331A extends linearly along the first direction x. The outer end boundary line second portion 331B is connected to the outer end boundary line first portion 331A and is located at the end portion near the outer end boundary line 332. The outer end boundary line second portion 331B is located outside the outer end boundary line first portion 331A in the second direction y. The outer end boundary line 332 includes the outer end boundary line first portion 332A and the outer end boundary line second portion 332B. The outer end boundary line first portion 332A extends linearly along the second direction y. The outer end boundary line second portion 332B is connected to both the outer end boundary line first portion 332A and the outer end boundary line second portion 331B and is located at the end portion near the outer end boundary line 331. The outer end boundary line second portion 332B is located outside the outer end boundary line first portion 332A in the first direction x. As a result, the corner portion (the outer end boundary line second portion 331B and the outer end boundary line second portion 332B) of the outer end boundary line 331 and the outer end boundary line 332 has a shape that protrudes outward in both the first direction x and the second direction y. Such a configuration can be relatively easily addressed by changing the shape of the corner portion of the second annular portion 330.

In the step of arranging the second annular portion 330 in the step of forming the second insulating layer 33, as shown in FIGS. 15 and 18, the distance (the third distance D3) between the inner end boundary line 325 of the first annular portion 310 and the inner end boundary line 345 of the second annular portion 330 in the second direction y is larger at an end portion near the inner end boundary line 346 than a center portion in the first direction x. Further, the distance (the fourth distance D4) between the inner end boundary line 326 of the first annular portion 310 and the inner end boundary line 346 of the second annular portion 330 in the first direction x is larger at the end portion near the inner end boundary line 345 than the center portion in the second direction y. As a result, the second annular portion 330 is larger in volume than the other portions inside the corner portion of the inner end boundary line 345 and the inner end boundary line 346. With such a configuration, after the second annular portion 330 is heat-treated, even in a case where the second annular portion 330 shrinks at the corner portion of the inner end boundary line 345 and the inner end boundary line 346, the state of covering the first insulating layer 31 (the first annular portion 310), which is a lower layer, is maintained, which can prevent the first insulating layer 31 from being exposed. Therefore, it is possible to suppress the influence of shrinkage of the second annular portion 330 (the second insulating layer 33) which is the resin material portion.

In the step of arranging the second annular portion 330 in the step of forming the second insulating layer 33, the inner end boundary line 345 includes the inner end boundary line first portion 345A and the inner end boundary line second portion 345B. The inner end boundary line first portion 345A extends linearly along the first direction x. The inner end boundary line second portion 345B is connected to the inner end boundary line first portion 345A and is located at the end portion near the inner end boundary line 346. The inner end boundary line second portion 345B is located inside the inner end boundary line first portion 345A in the second direction y. The inner end boundary line 346 includes the inner end boundary line first portion 346A and the inner end boundary line second portion 346B. The inner end boundary line first portion 346A extends linearly along the second direction y. The inner end boundary line second portion 346B is connected to both the inner end boundary line first portion 346A and the inner end boundary line second portion 345B and is located at the end portion near the inner end boundary line 345. The inner end boundary line second portion 346B is located inside the inner end boundary line first portion 346A in the first direction x. As a result, the corner portion (the inner end boundary line second portion 345B and the inner end boundary line second portion 346B) of the inner end boundary line 345 and the inner end boundary line 346 has a shape that protrudes inward in both the first direction x and the second direction y. Such a configuration can be relatively easily addressed by changing the shape of the corner portion of the second annular portion 330.

<First Modification of the First Embodiment>

Figure 30:
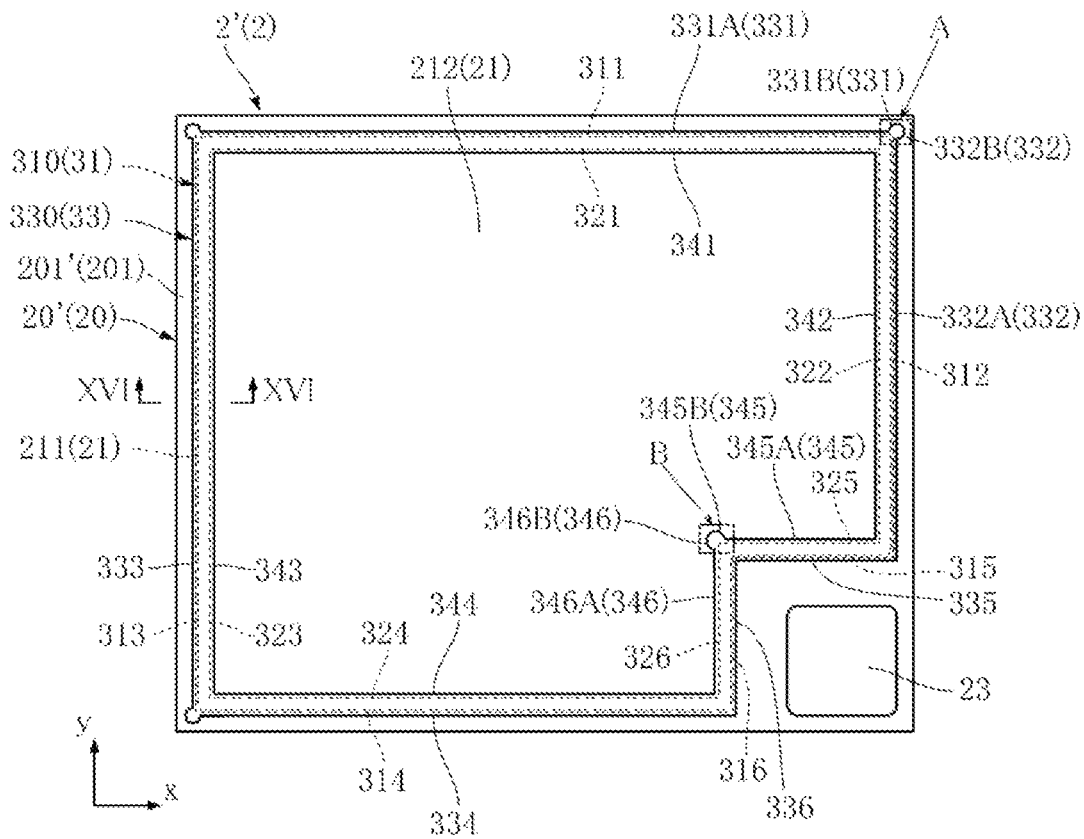
FIG. 30 is a plan view showing one step of a method of manufacturing a semiconductor device according to a first modification of the first embodiment of the present disclosure.

FIG. 30 shows one step of a method of manufacturing a semiconductor device according to a first modification of the first embodiment. Throughout the drawings after FIG. 30, the same or similar elements as those in the semiconductor device A10 of the above embodiment are denoted by the same reference numerals as those of the above embodiment, and explanation thereof will be omitted as appropriate.

In this modification, in the step of forming the second insulating layer 33 for manufacturing the semiconductor device, the shape of the second annular portion 330 when the second annular portion 330 is arranged is different from that of the above embodiment. As shown in FIG. 30, in the second annular portion 330 arranged on the side of the main surface 201' of the substrate 2', the shape of the corner portion of the outer end boundary line 331 and the outer end boundary line 332 (the upper right corner portion of the figure), the shape of the corner portion of the outer end boundary line 331 and the outer end boundary line 333 (the upper left corner portion of the figure), the shape of the corner portion of the outer end boundary line 333 and the outer end boundary line 334 (the lower left corner portion of the figure), and the shape of the corner portion of the inner end boundary line 345 and the inner end boundary line 346 are different from the configuration shown in FIG. 15.

Figure 31:
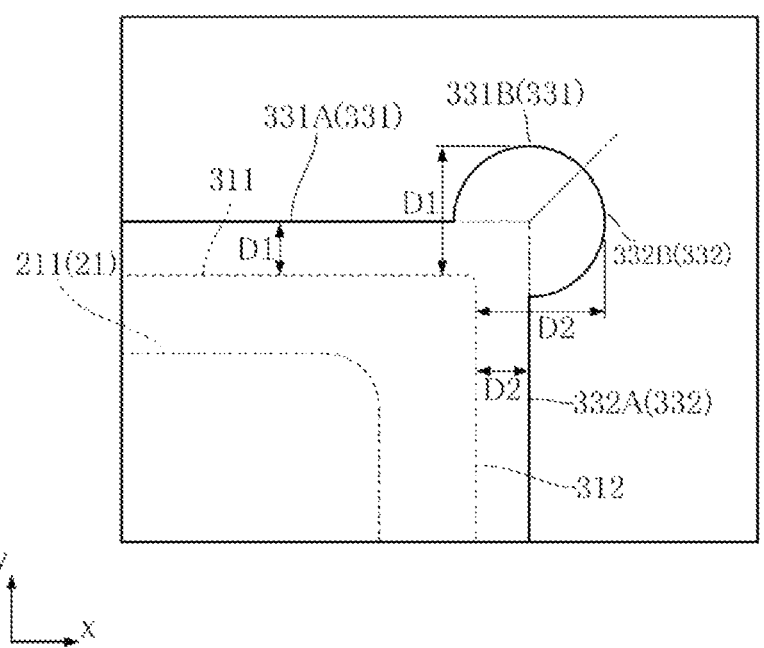
FIG. 31 is an enlarged view of portion A in FIG. 30.

As shown in FIG. 31, the outer end boundary line 331 includes the outer end boundary line first portion 331A and the outer end boundary line second portion 331B, but the outer end boundary line second portion 331B has a configuration different from that of the above embodiment. In this modification, the outer end boundary line second portion 331B has an arc shape, is connected to the linear outer end boundary line first portion 331A, and is located on the outside of the outer end boundary line first portion 331A in the second direction y. Therefore, with respect to the outer end boundary line 311 of the first annular portion 310 and the outer end boundary line 331 of the second annular portion 330, the distance (the first distance D1) between the outer end boundary line 311 and the outer end boundary line 331 in the second direction y is set to be larger at the end portion near the outer end boundary line 332 than the center portion in the first direction x.

The outer end boundary line 332 includes the outer end boundary line first portion 332A and the outer end boundary line second portion 332B, but the outer end boundary line second portion 332B has a configuration different from that of the above embodiment. In this modification, the outer end boundary line second portion 332B has an arc shape, is connected to the linear outer end boundary line first portion 332A, and is located outside the outer end boundary line first portion 332A in the first direction x. Therefore, with respect to the outer end boundary line 312 of the first annular portion 310 and the outer end boundary line 332 of the second annular portion 330, the distance (the second distance D2) between the outer end boundary line 312 and the outer end boundary line 332 in the first direction x is set to be larger at the end portion near the outer end boundary line 331 than the center portion in the second direction y. Further, the outer end boundary line second portion 332B is also connected to the outer end boundary line second portion 331B. In FIG. 31, a two-dot chain line inclined at an angle of 45 degrees with respect to the first direction x and the second direction y indicates a boundary between the outer end boundary line second portion 331B and the outer end boundary line second portion 332B. As a result, the corner portion (the outer end boundary line second portion 331B and the outer end boundary line second portion 332B) of the outer end boundary line 331 and the outer end boundary line 332 has a shape that protrudes outward in both the first direction x and the second direction y.

Although detailed illustration and description are omitted, the end portion of the outer end boundary line 331 near the outer end boundary line 333 has an arc shape and is located on the outside in the second direction y, similarly to the end portion (the outer end boundary line second portion 331B) of the outer end boundary line 331 near the outer end boundary line 332. Further, the end portion of the outer end boundary line 333 near the outer end boundary line 331 has an arc shape and is located on the outside in the first direction x, similarly to the end portion (the outer end boundary line second portion 332B) of the outer end boundary line 332 near the outer end boundary line 331. As a result, the corner portion of the outer end boundary line 331 and the outer end boundary line 333 (the upper left corner portion of FIG. 30) has a shape that protrudes outward in both the first direction x and the second direction y, similarly to the corner portion of the outer end boundary line 331 and the outer end boundary line 332.

Although detailed illustration and description are omitted, the end portion of the outer end boundary line 334 near the outer end boundary line 333 has an arc shape and is located on the outside in the second direction y, similarly to the end portion (the outer end boundary line second portion 331B) of the outer end boundary line 331 near the outer end boundary line 332. Further, the end portion of the outer end boundary line 333 near the outer end boundary line 334 has an arc shape and is located on the outside in the first direction x, similarly to the end portion (the outer end boundary line second portion 332B) of the outer end boundary line 332 near the outer end boundary line 331. As a result, the corner portion of the outer end boundary line 333 and the outer end boundary line 334 (the lower left corner portion of FIG. 30) has a shape that protrudes outward in both the first direction x and the second direction y, similarly to the corner portion of the outer end boundary line 331 and the outer end boundary line 332.

Figure 32:
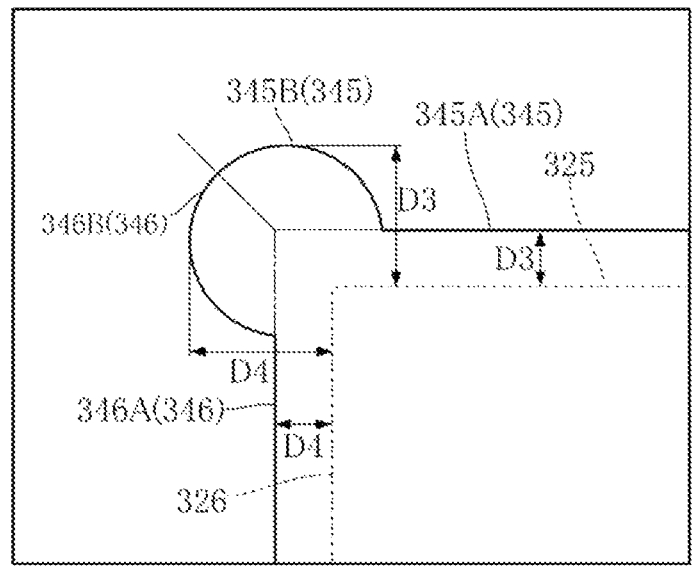
FIG. 32 is an enlarged view of portion B of FIG. 30.

As shown in FIG. 32, the inner end boundary line 345 includes the inner end boundary line first portion 345A and the inner end boundary line second portion 345B, but the inner end boundary line second portion 345B has a configuration different from that of the above embodiment. In this modification, the inner end boundary line second portion 345B has an arc shape, is connected to the linear inner end boundary line first portion 345A, and is located inside the inner end boundary line first portion 345A in the second direction y. Therefore, with respect to the inner end boundary line 325 of the first annular portion 310 and the inner end boundary line 345 of the second annular portion 330, the distance (the third distance D3) between the inner end boundary line 325 and the inner end boundary line 345 in the second direction y is set to be larger at the end portion near the inner end boundary line 346 than the center portion in the first direction x.

The inner end boundary line 346 includes the inner end boundary line first portion 346A and the inner end boundary line second portion 346B, but the inner end boundary line second portion 346B has a configuration different from that of the above embodiment. In this modification, the inner end boundary line second portion 346B has an arc shape, is connected to the linear inner end boundary line first portion 346A, and is located inside the inner end boundary line first portion 346A in the first direction x. Therefore, with respect to the inner end boundary line 326 of the first annular portion 310 and the inner end boundary line 346 of the second annular portion 330, the distance (the fourth distance D4) between the inner end boundary line 326 and the inner end boundary line 346 in the first direction x is set to be larger at the end portion near the inner end boundary line 345 than the center portion in the second direction y. Further, the inner end boundary line second portion 346B is also connected to the inner end boundary line second portion 345B. In FIG. 32, a two-dot chain line inclined at an angle of 45 degrees with respect to the first direction x and the second direction y indicates a boundary between the inner end boundary line second portion 345B and the inner end boundary line second portion 346B. As a result, the corner portion (the inner end boundary line second portion 345B and the inner end boundary line second portion 346B) of the inner end boundary line 345 and the inner end boundary line 346 has a shape that protrudes inward in both the first direction x and the second direction y.

In the method of manufacturing the semiconductor device of this modification, with respect to the second annular portion 330 arranged so as to overlap with the first annular portion 310 in the step of forming the second insulating layer 33, the distance (the first distance D1) between the outer end boundary line 311 of the first annular portion 310 and the outer end boundary line 331 of the second annular portion 330 in the second direction y is larger at the end portion near the outer end boundary line 332 than the center portion in the first direction x. Further, the distance (the second distance D2) between the outer end boundary line 312 of the first annular portion 310 and the outer end boundary line 332 of the second annular portion 330 in the first direction x is larger at the end portion near the outer end boundary line 331 than the center portion in the second direction y. As a result, the second annular portion 330 is larger in volume than the other portions outside the corner portion of the outer end boundary line 331 and the outer end boundary line 332. With such a configuration, after the second annular portion 330 is heat-treated, even in a case where the second annular portion 330 shrinks at the corner portion of the outer end boundary line 331 and the outer end boundary line 332, the state of covering the first insulating layer 31 (the first annular portion 310), which is a lower layer, is maintained, which can prevent the first insulating layer 31 from being exposed. Therefore, it is possible to suppress the influence of shrinkage of the second annular portion 330 (the second insulating layer 33) which is the resin material portion. In addition, in the range of the same configuration as that of the above embodiment, the same operation and effects as those of the above embodiment can be obtained.

<Second Modification of the First Embodiment>

Figure 33:
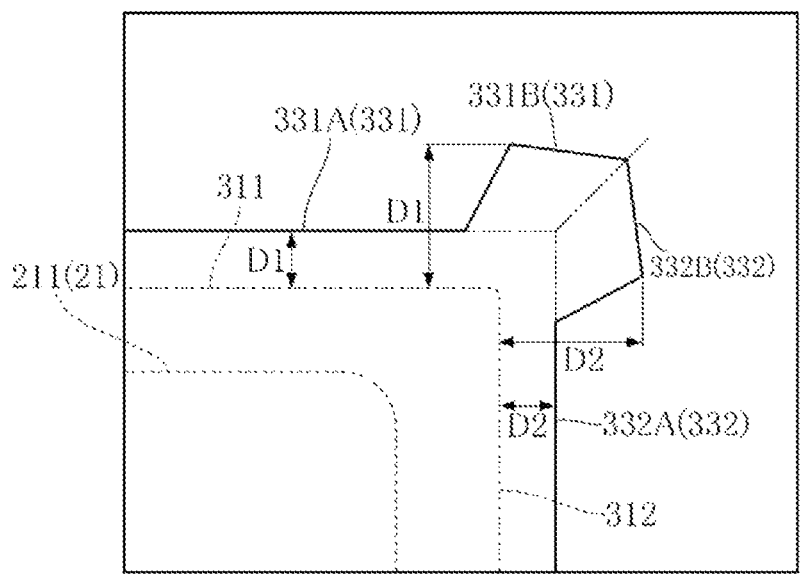
FIG. 33 is a plan view showing one step of a method of manufacturing a semiconductor device according to a second modification of the first embodiment of the present disclosure, which is a partially enlarged view similar to FIG. 31.
Figure 34:
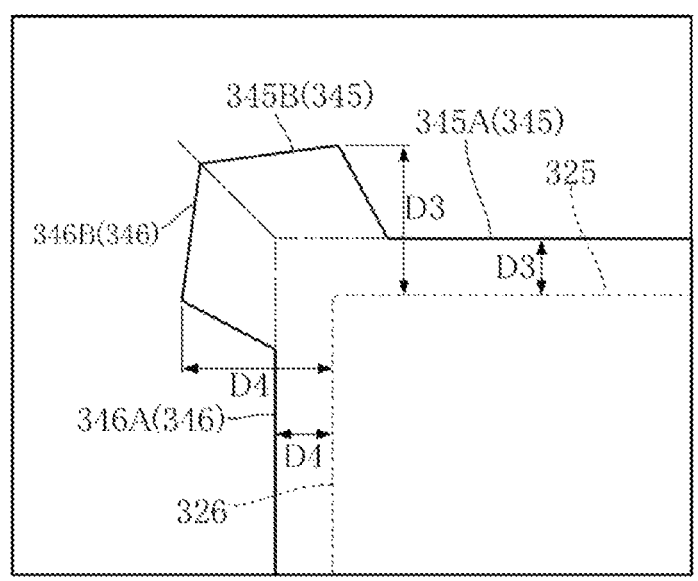
FIG. 34 is a plan view showing one step of the method of manufacturing the semiconductor device according to the second modification of the first embodiment of the present disclosure, which is a partially enlarged view similar to FIG. 32.

FIGS. 33 and 34 show one step of a method for manufacturing a semiconductor device according to a second modification of the first embodiment of the present disclosure.

In this modification, in a step of forming the second insulating layer 33 of the manufacture of the semiconductor device, the shape of the second annular portion 330 when the second annular portion 330 is arranged is different from that of the above embodiment.

As shown in FIG. 33, the outer end boundary line 331 includes the outer end boundary line first portion 331A and the outer end boundary line second portion 331B, but the outer end boundary line second portion 331B has a configuration different from that of the above embodiment. In this modification, the outer end boundary line second portion 331B forms a portion of a polygon (a pentagon in the depicted example), is connected to the linear outer end boundary line first portion 331A, and is located outside the outer end boundary line first portion 331A in the second direction y. Therefore, with respect to the outer end boundary line 311 of the first annular portion 310 and the outer end boundary line 331 of the second annular portion 330, the distance (the first distance D1) between the outer end boundary line 311 and the outer end boundary line 331 in the second direction y is set to be larger at the end portion near the outer end boundary line 332 than the center portion in the first direction x.

The outer end boundary line 332 includes the outer end boundary line first portion 332A and the outer end boundary line second portion 332B, but the outer end boundary line second portion 332B has a configuration different from that of the above embodiment. In this modification, the outer end boundary line second portion 332B forms a portion of a polygon (a pentagon in the depicted example), is connected to the linear outer end boundary line first portion 332A, and is located outside the outer end boundary line first portion 332A in the first direction x. Therefore, with respect to the outer end boundary line 312 of the first annular portion 310 and the outer end boundary line 332 of the second annular portion 330, the distance (the second distance D2) between the outer end boundary line 312 and the outer end boundary line 332 in the first direction x is set to be larger at the end portion near the outer end boundary line 331 than the center portion in the second direction y. Further, the outer end boundary line second portion 332B is also connected to the outer end boundary line second portion 331B. In FIG. 33, a two-dot chain line inclined at an angle of 45 degrees with respect to the first direction x and the second direction y indicates a boundary between the outer end boundary line second portion 331B and the outer end boundary line second portion 332B. As a result, the corner portion (the outer end boundary line second portion 331B and the outer end boundary line second portion 332B) of the outer end boundary line 331 and the outer end boundary line 332 has a shape that protrudes outward in both the first direction x and the second direction y.

Although detailed illustration and description are omitted, the end portion of the outer end boundary line 331 near the outer end boundary line 333 forms a portion of a polygon (a pentagon) and is located on the outside in the second direction y, similarly to the end portion (the outer end boundary line second portion 331B) of the outer end boundary line 331 near the outer end boundary line 332. Further, the end portion of the outer end boundary line 333 near the outer end boundary line 331 forms a portion of a polygon (a pentagon) and is located on the outside in the first direction x, similarly to the end portion (the outer end boundary line second portion 332B) of the outer end boundary line 332 near the outer end boundary line 331. As a result, the corner portion of the outer end boundary line 331 and the outer end boundary line 333 has a shape that protrudes outward in both the first direction x and the second direction y, similarly to the corner portion of the outer end boundary line 331 and the outer end boundary line 332.

Although detailed illustration and description are omitted, the end portion of the outer end boundary line 334 near the outer end boundary line 333 forms a portion of a polygon (a pentagon) and is located on the outside in the second direction y, similarly to the end portion (the outer end boundary line second portion 331B) of the outer end boundary line 331 near the outer end boundary line 332. Further, the end portion of the outer end boundary line 333 near the outer end boundary line 334 forms a portion of a polygon (a pentagon) and is located on the outside in the first direction x, similarly to the end portion (the outer end boundary line second portion 332B) of the outer end boundary line 332 near the outer end boundary line 331. As a result, the corner portion of the outer end boundary line 333 and the outer end boundary line 334 has a shape that protrudes outward in both the first direction x and the second direction y, similarly to the corner portion of the outer end boundary line 331 and the outer end boundary line 332.

As shown in FIG. 34, the inner end boundary line 345 includes the inner end boundary line first portion 345A and the inner end boundary line second portion 345B, but the inner end boundary line second portion 345B has a configuration different from that of the above embodiment. In this modification, the inner end boundary line second portion 345B forms a portion of a polygon (a pentagon in the depicted example), is connected to the linear inner end boundary line first portion 345A, and is located inside the inner end boundary line first portion 345A in the second direction y. Therefore, with respect to the inner end boundary line 325 of the first annular portion 310 and the inner end boundary line 345 of the second annular portion 330, the distance (the third distance D3) between the inner end boundary line 325 and the inner end boundary line 345 in the second direction y is set to be larger at the end portion near the inner end boundary line 346 than the center portion in the first direction x.

The inner end boundary line 346 includes the inner end boundary line first portion 346A and the inner end boundary line second portion 346B, but the inner end boundary line second portion 346B has a configuration different from that of the above embodiment. In this modification, the inner end boundary line second portion 346B forms a portion of a polygon (a pentagon in the depicted example), is connected to the linear inner end boundary line first portion 346A, and is located inside the inner end boundary line first portion 346A in the first direction x. Therefore, with respect to the inner end boundary line 326 of the first annular portion 310 and the inner end boundary line 346 of the second annular portion 330, the distance (the fourth distance D4) between the inner end boundary line 326 and the inner end boundary line 346 in the first direction x is set to be larger at the end portion near the inner end boundary line 345 than the center portion in the second direction y. Further, the inner end boundary line second portion 346B is also connected to the inner end boundary line second portion 345B. In FIG. 34, a two-dot chain line inclined at an angle of 45 degrees with respect to the first direction x and the second direction y indicates a boundary between the inner end boundary line second portion 345B and the inner end boundary line second portion 346B. As a result, the corner portion (the inner end boundary line second portion 345B and the inner end boundary line second portion 346B) of the inner end boundary line 345 and the inner end boundary line 346 has a shape that protrudes inward in both the first direction x and the second direction y.

In the method for manufacturing the semiconductor device of this modification, with respect to the second annular portion 330 arranged so as to overlap with the first annular portion 310 in the step of forming the second insulating layer 33, the distance (the first distance D1) between the outer end boundary line 311 of the first annular portion 310 and the outer end boundary line 331 of the second annular portion 330 in the second direction y is larger at the end portion near the outer end boundary line 332 than the center portion in the first direction x. Further, the distance (the second distance D2) between the outer end boundary line 312 of the first annular portion 310 and the outer end boundary line 332 of the second annular portion 330 in the first direction x is larger at the end portion near the outer end boundary line 331 than the center portion in the second direction y. As a result, the second annular portion 330 is larger in volume than the other portions outside the corner portion of the outer end boundary line 331 and the outer end boundary line 332. With such a configuration, after the second annular portion 330 is heat-treated, even in a case where the second annular portion 330 shrinks at the corner portion of the outer end boundary line 331 and the outer end boundary line 332, the state of covering the first insulating layer 31 (the first annular portion 310), which is a lower layer, is maintained, which can prevent the first insulating layer 31 from being exposed. Therefore, it is possible to suppress the influence of shrinkage of the second annular portion 330 (the second insulating layer 33) which is the resin material portion. In addition, in the range of the same configuration as that of the above embodiment, the same operation and effects as those of the above embodiment can be obtained.

<Third Modification of the First Embodiment>

Figure 35:
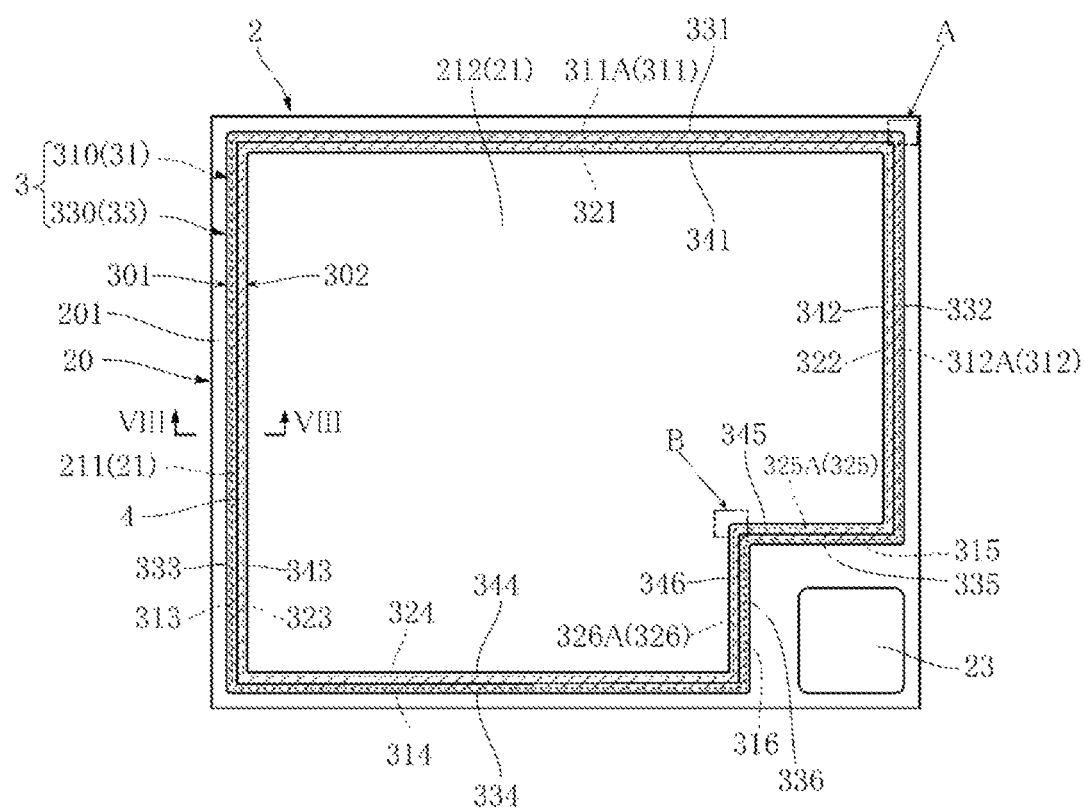
FIG. 35 is a plan view showing a semiconductor element in a semiconductor device according to a third modification of the first embodiment of the present disclosure.
Figure 35:
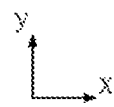

FIG. 35 shows a semiconductor element in a semiconductor device according to a third modification of the first embodiment of the present disclosure. This modification is different from the above embodiment in the configuration of the first insulating layer 31 (the first annular portion 310) and the second insulating layer 33 (the second annular portion 330).

Figure 36:
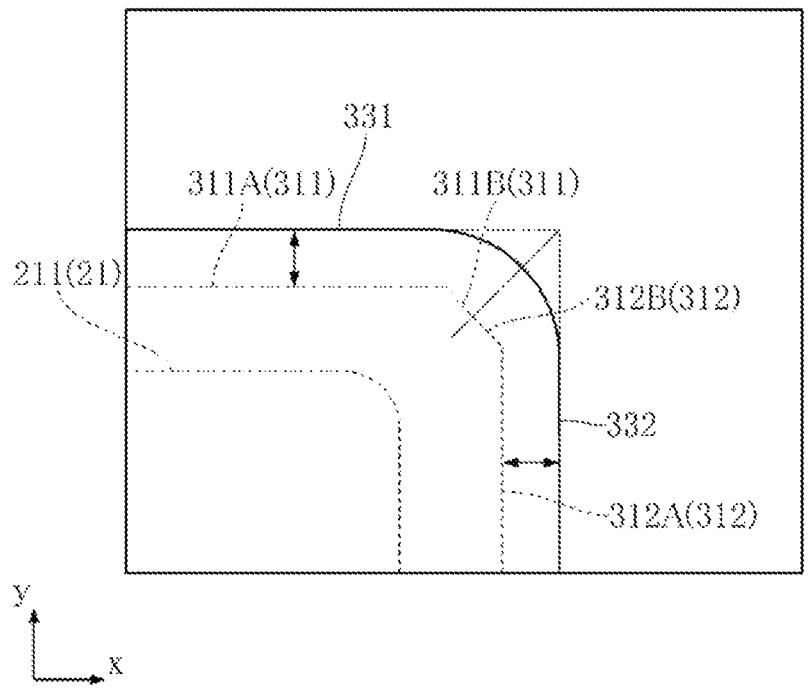
FIG. 36 is an enlarged view of portion A in FIG. 35.

In the first annular portion 310, the shapes of the end portions of the outer end boundary lines 311 to 314 and the inner end boundary lines 325 and 326 are different from those of the above embodiment. As shown in FIGS. 35 and 36, the outer end boundary line 311 includes an outer end boundary line first portion 311A and an outer end boundary line second portion 311B. The outer end boundary line first portion 311A extends linearly along the first direction x and occupies most of the outer end boundary line 311 except the end portion thereof. The outer end boundary line second portion 311B is connected to the outer end boundary line first portion 311A and is located near the outer end boundary line 312 in the first direction x. The outer end boundary line second portion 311B is located inside the outer end boundary line first portion 311A in the second direction y. In the depicted example, the outer end boundary line second portion 311B is inclined at an angle of 45 degrees with respect to the outer end boundary line first portion 311A when viewed in the thickness direction z.

Figure 39:
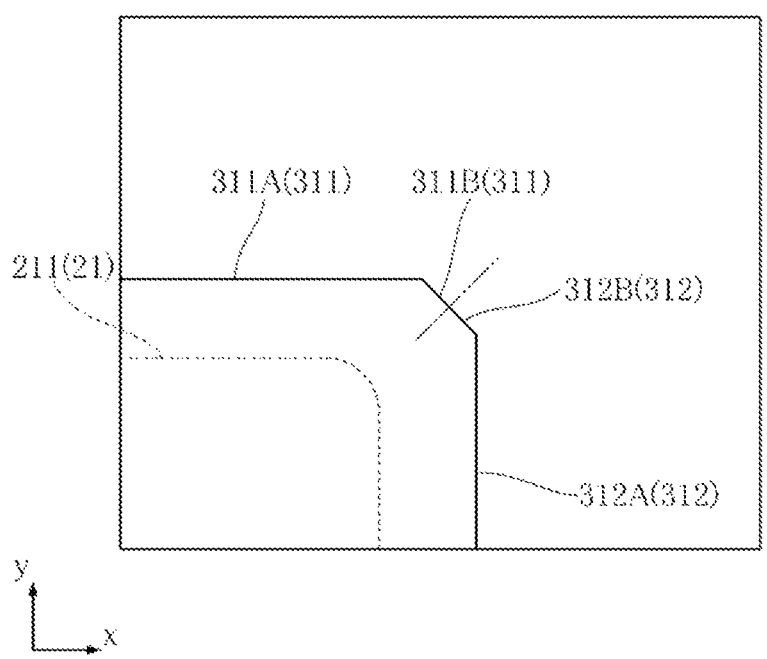
FIG. 39 is an enlarged view of portion A in FIG. 38.
Figure 42:
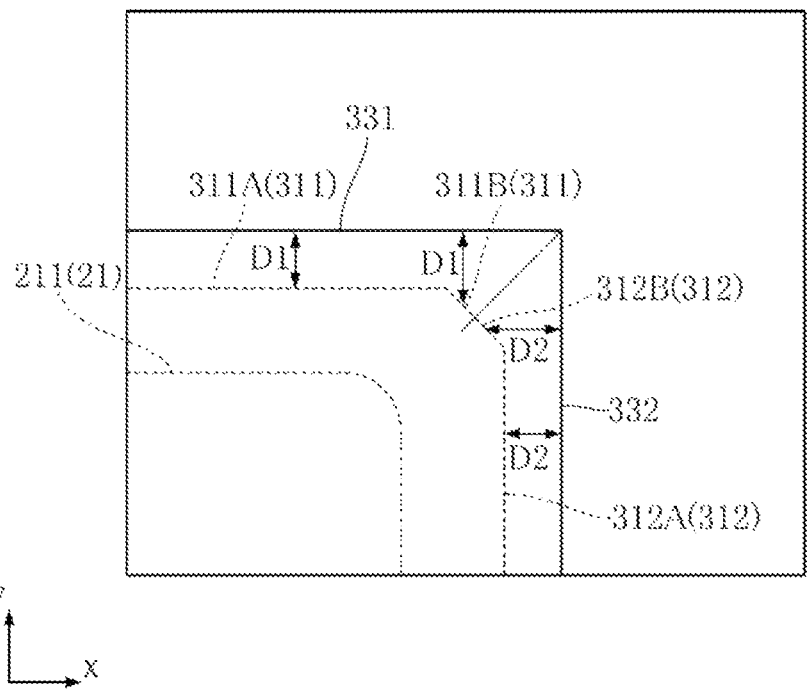
FIG. 42 is an enlarged view of portion A of FIG. 41.

The outer end boundary line 312 includes an outer end boundary line first portion 312A and an outer end boundary line second portion 312B. The outer end boundary line first portion 312A extends linearly along the second direction y and occupies most of the outer end boundary line 312 except the end portion thereof. The outer end boundary line second portion 312B is connected to the outer end boundary line first portion 312A and is located near the outer end boundary line 311 in the second direction y. The outer end boundary line second portion 312B is located inside the outer end boundary line first portion 312A in the first direction x. Further, the outer end boundary line second portion 312B is also connected to the outer end boundary line second portion 311B. In the depicted example, the outer end boundary line second portion 312B is inclined at an angle of 45 degrees with respect to the outer end boundary line first portion 311A when viewed in the thickness direction z. In FIG. 36, a two-dot chain line orthogonal to the outer end boundary line second portion 311B and the outer end boundary line second portion 312B indicates a boundary between the outer end boundary line second portion 311B and the outer end boundary line second portion 312B. With such a configuration, the corner portion (the outer end boundary line second portion 311B and the outer end boundary line second portion 312B) of the outer end boundary line 311 and the outer end boundary line 312 has a shape that enters inside in both the first direction x and the second direction y. In FIGS. 39 and 42, which will be described later, as in FIG. 36, a two-dot chain line orthogonal to the outer end boundary line second portion 311B and the outer end boundary line second portion 312B indicates a boundary between the outer end boundary line second portion 311B and the outer end boundary line second portion 312B.

Although detailed illustration and description are omitted, the end portion of the outer end boundary line 311 near the outer end boundary line 313 is located on the inside in the second direction y, similarly to the end portion (the outer end boundary line second portion 311B) of the outer end boundary line 311 near the outer end boundary line 312. Further, the end portion of the outer end boundary line 313 near the outer end boundary line 311 is located on the inside in the first direction x, similarly to the end portion (the outer end boundary line second portion 312B) of the outer end boundary line 312 near the outer end boundary line 311. As a result, the corner portion of the outer end boundary line 311 and the outer end boundary line 313 (the upper left corner portion of FIG. 35) has a shape that enters inside in both the first direction x and the second direction y, similarly to the corner portion of the outer end boundary line 311 and the outer end boundary line 312.

Although detailed illustration and description are omitted, the end portion of the outer end boundary line 314 near the outer end boundary line 313 is located on the inside in the second direction y, similarly to the end portion (the outer end boundary line second portion 311B) of the outer end boundary line 311 near the outer end boundary line 312. Further, the end portion of the outer end boundary line 313 near the outer end boundary line 314 is located on the inside in the first direction x, similarly to the end portion (the outer end boundary line second portion 312B) of the outer end boundary line 312 near the outer end boundary line 311. As a result, the corner portion of the outer end boundary line 313 and the outer end boundary line 314 (the lower left corner portion in FIG. 35) has a shape that enters inside in both the first direction x and the second direction y, similarly to the corner portion of the outer end boundary line 311 and the outer end boundary line 312.

Figure 37:
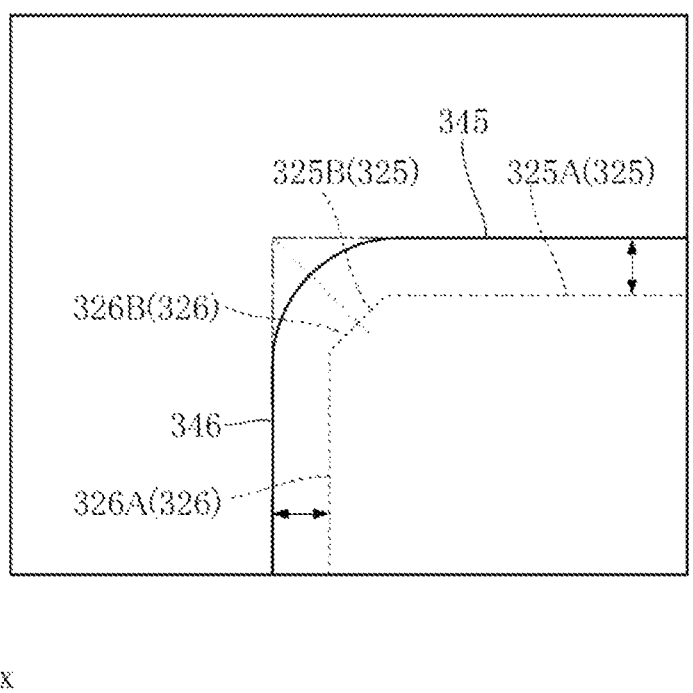
FIG. 37 is an enlarged view of portion B of FIG. 35.

As shown in FIGS. 35 and 37, the inner end boundary line 325 includes an inner end boundary line first portion 325A and an inner end boundary line second portion 325B. The inner end boundary line first portion 325A extends linearly along the first direction x and occupies most of the inner end boundary line 325 except for the end portion thereof. The inner end boundary line second portion 325B is connected to the inner end boundary line first portion 325A and is located near the inner end boundary line 326 in the first direction x. The inner end boundary line 325 field is located outside the inner end boundary line first portion 325A in the second direction y. In the depicted example, the inner end boundary line second portion 325B is inclined at an angle of 45 degrees with respect to the inner end boundary line first portion 325A when viewed in the thickness direction z.

Figure 40:
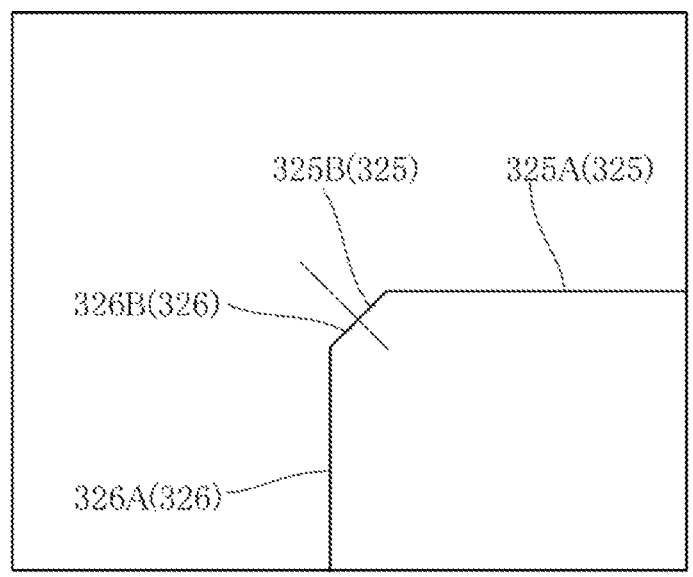
FIG. 40 is an enlarged view of portion B of FIG. 38.
Figure 43:
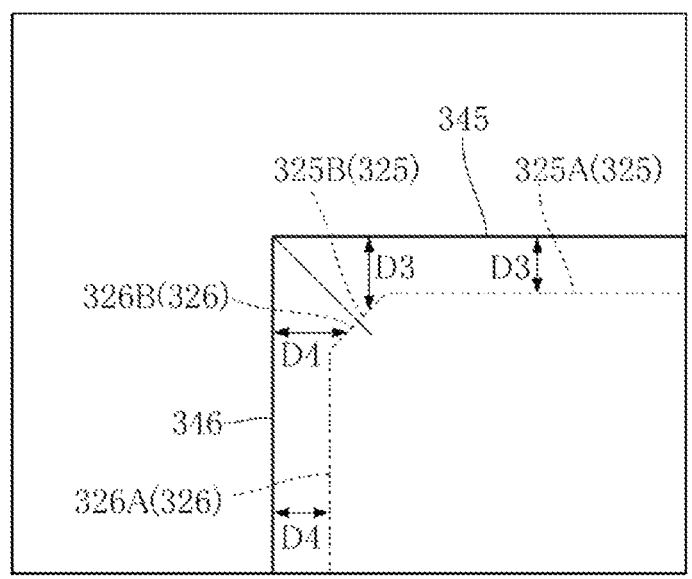
FIG. 43 is an enlarged view of portion B of FIG. 41.

The inner end boundary line 326 includes an inner end boundary line first portion 326A and an inner end boundary line second portion 326B. The inner end boundary line first portion 326A extends linearly along the second direction y and occupies most of the inner end boundary line 326 except for the end portion thereof. The inner end boundary line second portion 326B is connected to the inner end boundary line first portion 326A and is located near the inner end boundary line 325 in the second direction y. The inner end boundary line second portion 326B is located outside the inner end boundary line first portion 326A in the first direction x. Further, the inner end boundary line second portion 326B is also connected to the inner end boundary line second portion 325B. In the depicted example, the inner end boundary line second portion 326B is inclined at an angle of 45 degrees with respect to the inner end boundary line first portion 326A when viewed in the thickness direction z. In FIG. 37, a two-dot chain line orthogonal to the inner end boundary line second portion 325B and the inner end boundary line second portion 326B indicates a boundary between the inner end boundary line second portion 325B and the inner end boundary line second portion 326B. With such a configuration, the corner portion (the inner end boundary line second portion 325B and the inner end boundary line second portion 326B) of the inner end boundary line 325 and the inner end boundary line 326 has a shape that enters outside in both the first direction x and the second direction y. In FIGS. 40 and 43, which will be described later, as in FIG. 37, a two-dot chain line orthogonal to the inner end boundary line second portion 325B and the inner end boundary line second portion 326B indicates a boundary between the inner end boundary line second portion 325B and the inner end boundary line second portion 326B.

As shown in FIG. 35, in the second annular portion 330, the outer end boundary lines 331 to 336 and the inner end boundary lines 341 to 346 each extend substantially linearly. As shown in FIGS. 35 and 36, the corner portion of the outer end boundary line 331 and the outer end boundary line 332, the corner portion of the outer end boundary line 331 and the outer end boundary line 333, and the corner portion of the outer end boundary line 333 and the outer end boundary line 334 are connected in a shape with rounded corners when viewed in the thickness direction z. As shown in FIGS. 35 and 37, the corner portion of the inner end boundary line 345 and the inner end boundary line 346 is connected in a shape with a rounded corner when viewed in the thickness direction z.

In this modification, in the step of forming the first insulating layer 31 and the step of forming the second insulating layer 33 in the manufacture of the semiconductor device, the shape of the first annular portion 310 and the shape of the second annular portion 330 are different from those of the above embodiment.

Figure 38:
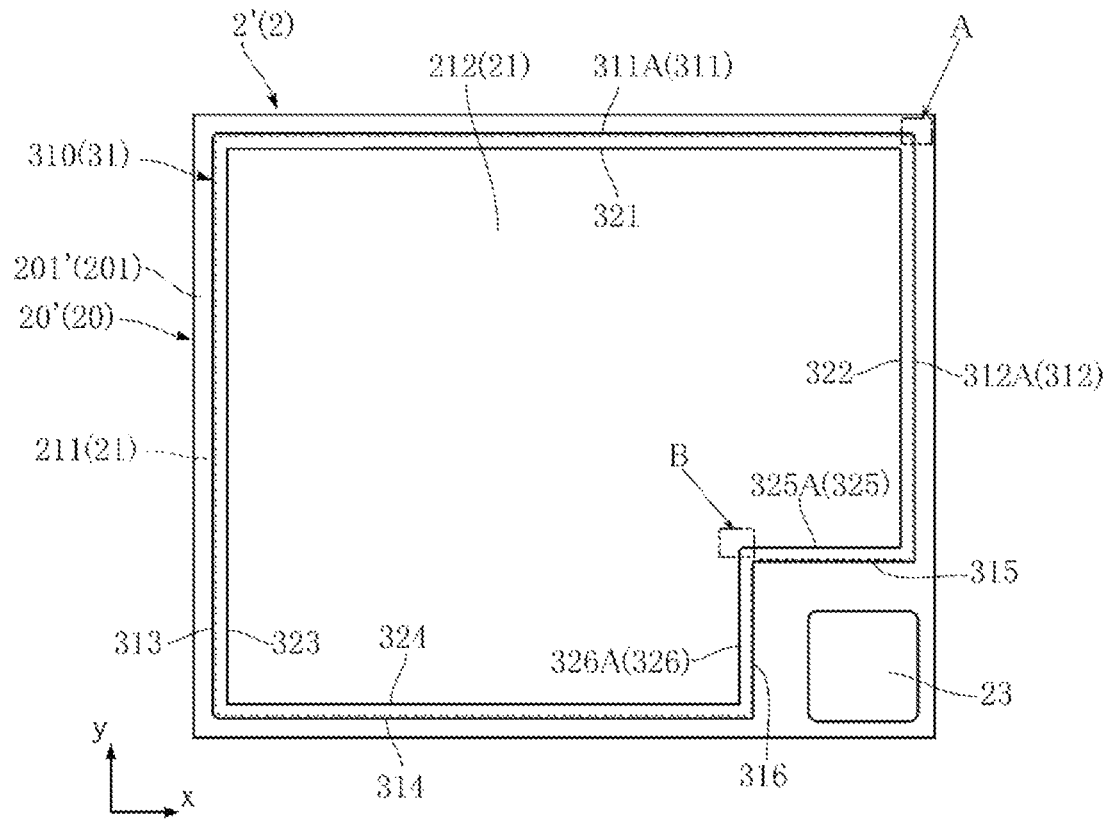
FIG. 38 is a plan view showing one step of a method of manufacturing the semiconductor device according to the third modification of the first embodiment of the present disclosure.

FIG. 38 shows the first annular portion 310 arranged on the side of the main surface 201' of the substrate 2' in the step of forming the first insulating layer 31. The first annular portion 310 is different from the configuration shown in FIG. 13 in the shape of the corner portion of the outer end boundary line 311 and the outer end boundary line 312 (the upper right corner portion of the figure), the shape of the corner portion of the outer end boundary line 311 and the outer end boundary line 313 (the upper left corner portion of the figure), the shape of the corner portion of the outer end boundary line 313 and the outer end boundary line 314 (the lower left corner portion of the figure), and the shape of the corner portion of the inner end boundary line 325 and the inner end boundary line 326. The shapes of the corner portions (the corner portion of the outer end boundary line 311 and the outer end boundary line 313, the corner portion of the inner end boundary line 325 and the inner end boundary line 326, etc.) of the first annular portion 310 shown in FIGS. 38 to 40 are similar to the shapes of the corner portions of the first annular portion 310 described with reference to FIGS. 35 to 37.

Figure 41:
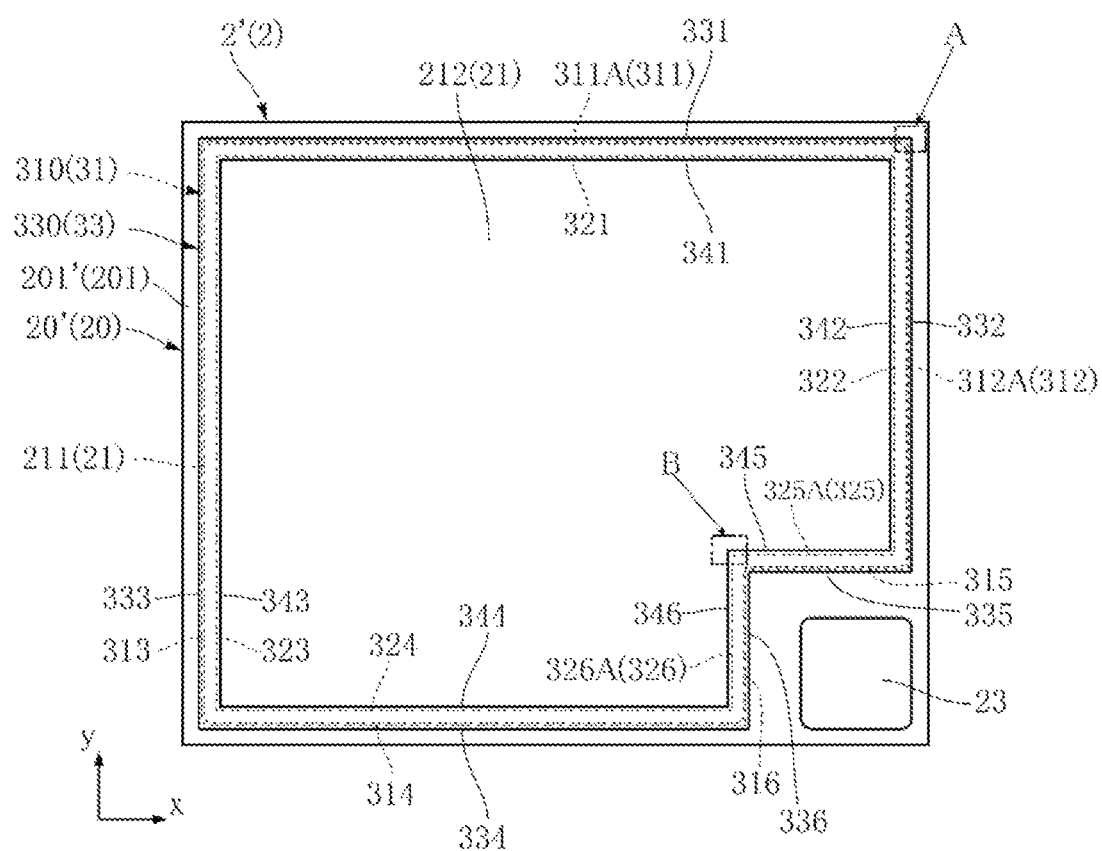
FIG. 41 is a plan view showing a step following FIG. 38.

FIG. 41 shows the second annular portion 330 arranged on the substrate 2' by the step of arranging the second annular portion 330 in the step of forming the second insulating layer 33. In this modification, the shape of the second annular portion 330 arranged on the substrate 2' is different from that of the above embodiment. Specifically, the second annular portion 330 arranged on the side of the main surface 201' of the substrate 2' is different from the configuration shown in FIG. 15 in the shape of the corner portion of the outer end boundary line 331 and the outer end boundary line 332 (the upper right corner portion of FIG. 41), the shape of the corner portion of the outer end boundary line 331 and the outer end boundary line 333 (the upper left corner portion of the figure), the shape of the corner portion of the outer end boundary line 333 and the outer end boundary line 334 (the lower left corner portion of the figure), and the shape of the corner portion of the inner end boundary line 345 and the inner end boundary line 346.

As shown in FIGS. 41 and 42, the outer end boundary lines 331 to 336 each extend linearly. As shown in FIGS. 41 and 43, the inner end boundary lines 341 to 346 each extend linearly. Then, at the corner portion of the outer end boundary line 331 and the outer end boundary line 332, the corner portion of the outer end boundary line 331 and the outer end boundary line 333, the corner portion of the outer end boundary line 333 and the outer end boundary line 334, and the corner portion of the inner end boundary line 345 and the inner end boundary line 346, the boundary lines (straight lines) constituting the respective corner portions are connected at right angles to each other. Therefore, as shown in FIG. 42, with respect to the outer end boundary line 311 of the first annular portion 310 and the outer end boundary line 331 of the second annular portion 330, the distance (the first distance D1) between the outer end boundary line 311 and the outer end boundary line 331 in the second direction y is set to be larger at the end portion near the outer end boundary line 332 than the center portion in the first direction x. With respect to the outer end boundary line 312 and the outer end boundary line 332, the distance (the second distance D2) between the outer end boundary line 312 and the outer end boundary line 332 in the first direction x is set to be larger at the end portion near the outer end boundary line 331 than the center portion in the second direction y. Further, as shown in FIG. 43, with respect to the inner end boundary line 325 of the first annular portion 310 and the inner end boundary line 345 of the second annular portion 330, the distance (the third distance D3) between the inner end boundary line 325 and the inner end boundary line 345 in the second direction y is set to be larger at the end portion near the inner end boundary line 346 than the center portion in the first direction x. With respect to the inner end boundary line 326 and the inner end boundary line 346, the distance (the fourth distance D4) between the inner end boundary line 326 and the inner end boundary line 346 in the first direction x is set to be larger at the end portion near the inner end boundary line 345 than the center portion in the second direction y.

According to the method for manufacturing the semiconductor device of this modification, after the second annular portion 330 is heat-treated, even in a case where the second annular portion 330 shrinks at the corner portion of the outer end boundary line 331 and the outer end boundary line 332, the state of covering the first insulating layer 31 (the first annular portion 310), which is a lower layer, is maintained, which may prevent the first insulating layer 31 from being exposed (see FIGS. 36 and 37). Therefore, it is possible to suppress the influence of shrinkage of the second annular portion 330 (the second insulating layer 33) which is the resin material portion. In addition, in the range of the same configuration as that of the above embodiments, the same operation and effects as those of the above embodiments may be obtained.

The semiconductor device and the method of manufacturing the semiconductor device according to the present disclosure is not limited to the above-described embodiments. The specific configurations of various parts of the semiconductor device according to the present disclosure and the specific processing of various steps of the method of manufacturing the semiconductor device according to the present disclosure may be freely changed in design.

The present disclosure includes the configurations related to the following Supplementary Notes.

[Supplementary Note 1]

A semiconductor device including:

a semiconductor element (2) that includes an element main body (20) having an element main surface (201) facing one side in a thickness direction (z), and a first electrode (21) arranged on the element main surface (201);

a first insulating layer (31) that is arranged over a peripheral edge portion of the first electrode (21) and the element main surface (201) and includes a first annular portion (310) formed in an annular shape when viewed in the thickness direction (z); and a second insulating layer (33) that is laminated on the first insulating layer (31), is made of a resin material, and includes a second annular portion (330) overlapping with the first annular portion (310) when viewed in the thickness direction (z), wherein the first annular portion (310) includes a first outer end boundary line (311) extending in a first direction (x) orthogonal to the thickness direction (z), and a second outer end boundary line (312) connected to the first outer end boundary line (311) and extending in a second direction (y) orthogonal to both the thickness direction (z) and the first direction (x), wherein the second annular portion (330) includes a third outer end boundary line (331) located outside the first outer end boundary line (311) in the second direction (y) and a fourth outer end boundary line (332) located outside the second outer end boundary line (312) in the first direction (z), when viewed in the thickness direction (z), wherein an end portion of the third outer end boundary line (331) near the fourth outer end boundary line (332) protrudes outward in the second direction (y) as compared with a center portion in the first direction (x), and wherein an end portion of the fourth outer end boundary line (332) near the third outer end boundary line (331) protrudes outward in the first direction (x) as compared with a center portion in the second direction (y).

[Supplementary Note 2]

The semiconductor device of Supplementary Note 1, wherein the first annular portion (310) includes a first inner end boundary line (321) located inside the first outer end boundary line (311) in the second direction (y) and a second inner end boundary line (322) connected to the first inner end boundary line (321) and located inside the second outer end boundary line (312) in the first direction (x), when viewed in the thickness direction (z), and wherein the second annular portion (330) includes a third inner end boundary line (341) located inside the first inner end boundary line (321) in the second direction (y) and a fourth inner end boundary line (342) connected to the third inner end boundary line (341) and located inside the second inner end boundary line (322) in the first direction (x), when viewed in the thickness direction (z).

[Supplementary Note 3]

The semiconductor device of Supplementary Note 2, wherein the first annular portion (310) includes a fifth inner end boundary line (325) that is connected to the second inner end boundary line (322), is located inside the second inner end boundary line (322) in the first direction (x) when viewed in the thickness direction (z), and extends in the first direction (x), and a sixth inner end boundary line (326) that is connected to the fifth inner end boundary line (325), is located on an opposite side of the first inner end boundary line (321) with respect to the fifth inner end boundary line (325) in the second direction (y), and extends in the second direction (y), wherein the second annular portion (330) includes a seventh inner end boundary line (345) connected to the fourth inner end boundary line (342) and located inside the fifth inner end boundary line (325) in the second direction (y) when viewed in the thickness direction (z), and an eighth inner end boundary line (346) located inside the sixth inner end boundary line (326) in the first direction (x) when viewed in the thickness direction (z), wherein an end portion of the seventh inner end boundary line (345) near the eighth inner end boundary line (346) protrudes inward in the second direction (y) as compared with a center portion in the first direction (x), and wherein an end portion of the eighth inner end boundary line (346) near the seventh inner end boundary line (345) protrudes inward in the first direction (x) as compared with a center portion in the second direction (y).

[Supplementary Note 4]

The semiconductor device of Supplementary Note 3, wherein the first annular portion (310) includes a fifth outer end boundary line (315) located outside the fifth inner end boundary line (325) in the second direction (y) and a sixth outer end boundary line (316) connected to the fifth outer end boundary line (315) and located outside the sixth inner end boundary line (326) in the first direction (x), when viewed in the thickness direction (z), and wherein the second annular portion (330) includes a seventh outer end boundary line (335) located outside the fifth outer end boundary line (315) in the second direction (y) and an eighth outer end boundary line (336) connected to the seventh outer end boundary line (335) and located outside the sixth outer end boundary line (316) in the second direction (y), when viewed in the thickness direction (z).

[Supplementary Note 5]

The semiconductor device of any one of Supplementary Notes 1 to 4, wherein a thickness of the second insulating layer (33) is larger than a thickness of the first insulating layer (31).

[Supplementary Note 6]

The semiconductor device of any one of Supplementary Notes 1 to 5, wherein the second insulating layer (33) is made of a polyimide resin.

[Supplementary Note 7]

A method of manufacturing a semiconductor device, including:

a step of providing a substrate (2') that includes a semiconductor layer (20') having a main surface (201') facing one side in a thickness direction (z), and a first electrode (21) arranged on the main surface (201');

a step of forming a first insulating layer (31) on the side of the main surface (201') of the substrate (2'); and a step of forming a second insulating layer (33) on the side of the main surface (201') of the substrate (2'), wherein in the step of forming the first insulating layer (31), a first annular portion (310) arranged over a peripheral edge portion (211) of the first electrode (21) and the main surface (201') and formed in an annular shape when viewed in the thickness direction (z) is formed, wherein the step of forming the second insulating layer (33) includes a step of arranging a second annular portion (330) that is formed in an annular portion overlapping with the first annular portion (310) when viewed in the thickness direction (z) and is made of a resin material, and a step of heating the second annular portion (330), wherein the first annular portion (310) includes a first outer end boundary line (311) extending in a first direction (x) orthogonal to the thickness direction (z), and a second outer end boundary line (312) connected to the first outer end boundary line (311) and extending in a second direction (y) orthogonal to both the thickness direction (z) and the first direction (x), wherein the second annular portion (330) includes a third outer end boundary line (331) located outside the first outer end boundary line (311) in the second direction (y), and a fourth outer end boundary line (332) located outside the second outer end boundary line (312) in the first direction, when viewed in the thickness direction (z), wherein a first distance (D1), which is a distance between the first outer end boundary line (311) and the third outer end boundary line (331) in the second direction (y), is set to be larger at an end portion near the fourth outer end boundary line (332) than a center portion in the first direction (x), and wherein a second distance (D2), which is a distance between the second outer end boundary line (312) and the fourth outer end boundary line (332) in the first direction (x), is set to be larger at an end portion near the third outer end boundary line (331) than a center portion in the second direction (y).

[Supplementary Note 8]

The method of Supplementary Note 7, wherein the third outer end boundary line (331) includes a third outer end boundary line first portion (331A) extending linearly along the first direction (x) and a third outer end boundary line second portion (331B) connected to the third outer end boundary line first portion (331A) and located outside the third outer end boundary line first portion (331A) in the second direction (y) and near the fourth outer end boundary line (332) in the first direction (x), and wherein the fourth outer end boundary line (332) includes a fourth outer end boundary line first portion (332A) extending linearly along the second direction (y) and a fourth outer end boundary line second portion (332B) connected to both the fourth outer end boundary line first portion (332A) and the third outer end boundary line second portion (331B) and located outside the fourth outer end boundary line first portion (332A) in the first direction (x).

[Supplementary Note 9]

The method of Supplementary Note 8, wherein the third outer end boundary line second portion (331B) includes a third outer end boundary line straight line portion (331c) extending linearly along the first direction (x) and a third outer end boundary line connecting portion (331d) connected to both the third outer end boundary line first portion (331A) and the third outer end boundary line straight line portion (331c), and wherein the fourth outer end boundary line second portion (332B) includes a fourth outer end boundary line straight line portion (332c) connected to the third outer end boundary line straight line portion (331c) and extending linearly along the second direction (y) and a fourth outer end boundary line connecting portion (332d) connected to both the fourth outer end boundary line first portion (332A) and the fourth outer end boundary line straight line portion (332c).

[Supplementary Note 10]

The method of Supplementary Note 7, wherein the first outer end boundary line (311) includes a first outer end boundary line first portion (311A) extending linearly along the first direction (x) and a first outer end boundary line second portion (311B) connected to the first outer end boundary line first portion (311A) and located inside the first outer end boundary line first portion (311A) in the second direction (y) and near the second outer end boundary line (312) in the first direction (x), and wherein the second outer end boundary line (312) includes a second outer end boundary line first portion (312A) extending linearly along the second direction (y) and a second outer end boundary line second portion (312B) connected to both the second outer end boundary line first portion (312A) and the first outer end boundary line second portion (311B) and located inside the second outer end boundary line first portion (312A) in the first direction (x).

[Supplementary Note 11]

The method of any one of Supplementary Notes 7 to 10, wherein the first annular portion (310) includes a first inner end boundary line (321) located inside the first outer end boundary line (311) in the second direction (y) and a second inner end boundary line (322) connected to the first inner end boundary line (321) and located inside the second outer end boundary line (312) in the first direction (x), when viewed in the thickness direction (z), and wherein the second annular portion (330) includes a third inner end boundary line (341) located inside the first inner end boundary line (321) in the second direction (y) and a fourth inner end boundary line (342) connected to the third inner end boundary line (341) and located inside the second inner end boundary line (322) in the first direction (x), when viewed in the thickness direction (z).

[Supplementary Note 12]

The method of Supplementary Note 11, wherein the first annular portion (310) includes a fifth inner end boundary line (325) that is connected to the second inner end boundary line (322), is located inside the second inner end boundary line (322) in the first direction (x) when viewed in the thickness direction (z), and extends in the first direction (x), and a sixth inner end boundary line (326) that is connected to the fifth inner end boundary line (325), is located on an opposite side of the first inner end boundary line (321) with respect to the fifth inner end boundary line (325) in the second direction (y), and extends in the second direction (y), wherein the second annular portion (330) includes a seventh inner end boundary line (345) connected to the fourth inner end boundary line (342) and located inside the fifth inner end boundary line (325) in the second direction (y) when viewed in the thickness direction (z), and an eighth inner end boundary line (346) located inside the sixth inner end boundary line (326) in the first direction (x) when viewed in the thickness direction (z), wherein a third distance (D3), which is a distance between the fifth inner end boundary line (325) and the seventh inner end boundary line (345) in the second direction (y), is set to be larger at an end portion near the eighth inner end boundary line (346) than a center portion in the first direction (x), and wherein a fourth distance (D4), which is a distance between the sixth inner end boundary line (326) and the eighth inner end boundary line (346) in the first direction (x), is set to be larger at an end portion near the seventh inner end boundary line (345) than a center portion in the second direction (y).

[Supplementary Note 13]

The method of Supplementary Note 12, wherein the seventh inner end boundary line (345) includes a seventh inner end boundary line first portion (345A) extending linearly along the first direction (x) and a seventh inner end boundary line second portion (345B) connected to the seventh inner end boundary line first portion (345A) and located inside the seventh inner end boundary line first portion (345A) in the second direction (y) and near the eighth inner end boundary line (346) in the first direction (x), and wherein the eighth inner end boundary line (346) includes an eighth inner end boundary line first portion (346A) extending linearly along the second direction (y) and an eighth inner end boundary line second portion (346B) connected to both the eighth inner end boundary line first portion (346A) and the seventh inner end boundary line second portion (345B) and located inside the eighth inner end boundary line first portion (346A) in the first direction (x).

[Supplementary Note 14]

The method of Supplementary Note 13, wherein the seventh inner end boundary line second portion (345B) includes a seventh inner end boundary line straight line portion (345c) extending linearly along the first direction (x) and a seventh inner end boundary line connecting portion (345d) connected to both the seventh inner end boundary line first portion (345A) and the seventh inner end boundary line straight line portion (345c), and wherein the eighth inner end boundary line second portion (346B) includes an eighth inner end boundary line straight line portion (346c) connected to the seventh inner end boundary line straight line portion (345c) and extending linearly along the second direction (y) and an eighth inner end boundary line connecting portion (346d) connected to both the eighth inner end boundary line first portion (346A) and the eighth inner end boundary line straight line portion (346c).

[Supplementary Note 15]

The method of Supplementary Note 12, wherein the fifth inner end boundary line (325) includes a fifth inner end boundary line first portion (325A) extending linearly along the first direction (x) and a fifth inner end boundary line second portion (325B) connected to the fifth inner end boundary line first portion (325A) and located outside the fifth inner end boundary line first portion (325A) in the second direction (y) and near the sixth inner end boundary line (326) in the first direction (x), and wherein the sixth inner end boundary line (326) includes a sixth inner end boundary line first portion (326A) extending linearly along the second direction (y) and a sixth inner end boundary line second portion (326B) connected to both the sixth inner end boundary line first portion (326A) and the fifth inner end boundary line second portion (325B) and located outside the sixth inner end boundary line first portion (326A) in the first direction (x).

[Supplementary Note 16]

The method of any one of Supplementary Notes 12 to 15, wherein the first annular portion (310) includes a fifth outer end boundary line (315) located outside the fifth inner end boundary line (325) in the second direction (y) and a sixth outer end boundary line (316) connected to the fifth outer end boundary line (315) and located outside the sixth inner end boundary line (326) in the first direction (x), when viewed in the thickness direction (z), and wherein the second annular portion (330) includes a seventh outer end boundary line (335) located outside the fifth outer end boundary line (315) in the second direction (y) and an eighth outer end boundary line (336) connected to the seventh outer end boundary line (335) and located outside the sixth outer end boundary line (316) in the second direction (y), when viewed in the thickness direction (z).

[Supplementary Note 17]

The method of any one of Supplementary Notes 7 to 16, wherein a thickness of the second insulating layer (33) is larger than a thickness of the first insulating layer (31).

[Supplementary Note 18]

The method of any one of Supplementary Notes 7 to 17, wherein the second insulating layer (33) is made of a polyimide resin.

According to a semiconductor device of the present disclosure, it is possible to suppress an influence of shrinkage of a second annular portion which is a resin material portion.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
a semiconductor element that includes an element main body having an element main surface facing one side in a thickness direction, and a first electrode arranged on the element main surface;
a first insulating layer that is arranged over a peripheral edge portion of the first electrode and the element main surface and includes a first annular portion formed in an annular shape when viewed in the thickness direction; and
a second insulating layer that is laminated on the first insulating layer, is made of a resin material, and includes a second annular portion overlapping with the first annular portion when viewed in the thickness direction,
wherein the first annular portion includes a first outer end boundary line extending in a first direction orthogonal to the thickness direction, and a second outer end boundary line connected to the first outer end boundary line and extending in a second direction orthogonal to both the thickness direction and the first direction,
wherein the second annular portion includes a third outer end boundary line located outside the first outer end boundary line in the second direction and a fourth outer end boundary line located outside the second outer end boundary line in the first direction, when viewed in the thickness direction,
wherein the third outer end boundary line includes:
a center portion in the first direction; and
an end portion near the fourth outer end boundary line;
wherein the end portion of the third outer end boundary line protrudes outward in the second direction as compared with the center portion of the third outer end boundary line,
wherein the fourth outer end boundary line includes:
a center portion in the second direction; and
an end portion near the third outer end boundary line;
wherein the end portion of the fourth outer end boundary line protrudes outward in the first direction as compared with the center portion of the fourth outer end boundary line,
wherein the first annular portion includes a first inner end boundary line located inside the first outer end boundary line in the second direction and a second inner end boundary line connected to the first inner end boundary line and located inside the second outer end boundary line in the first direction, when viewed in the thickness direction, and
wherein the second annular portion includes a third inner end boundary line located inside the first inner end boundary line in the second direction and a fourth inner end boundary line connected to the third inner end boundary line and located inside the second inner end boundary line in the first direction, when viewed in the thickness direction.

2. The semiconductor device of claim 1, wherein the first annular portion includes a fifth inner end boundary line that is connected to the second inner end boundary line, is located inside the second inner end boundary line in the first direction when viewed in the thickness direction, and extends in the first direction, and a sixth inner end boundary line that is connected to the fifth inner end boundary line, is located on an opposite side of the first inner end boundary line with respect to the fifth inner end boundary line in the second direction, and extends in the second direction,
wherein the second annular portion includes a seventh inner end boundary line connected to the fourth inner end boundary line and located inside the fifth inner end boundary line in the second direction when viewed in the thickness direction, and an eighth inner end boundary line located inside the sixth inner end boundary line in the first direction when viewed in the thickness direction,
wherein the seventh inner end boundary line includes:
a center portion in the first direction; and
an end portion near the eighth inner end boundary line;
wherein the end portion of the seventh inner end boundary line protrudes outward in the second direction as compared with the center portion of the seventh inner end boundary line, and
wherein the eighth inner end boundary line includes:
a center portion in the second direction; and
an end portion near the seventh inner end boundary line;
wherein the end portion of the eighth inner end boundary line protrudes outward in the first direction as compared with the center portion of the eighth inner end boundary line.

3. The semiconductor device of claim 2, wherein the first annular portion includes a fifth outer end boundary line located outside the fifth inner end boundary line in the second direction and a sixth outer end boundary line connected to the fifth outer end boundary line and located outside the sixth inner end boundary line in the first direction, when viewed in the thickness direction, and
wherein the second annular portion includes a seventh outer end boundary line located outside the fifth outer end boundary line in the second direction and an eighth outer end boundary line connected to the seventh outer end boundary line and located outside the sixth outer end boundary line in the second direction, when viewed in the thickness direction.

4. The semiconductor device of claim 1, wherein a thickness of the second insulating layer is larger than a thickness of the first insulating layer.

5. The semiconductor device of claim 1, wherein the second insulating layer is made of a polyimide resin.

6. A method of manufacturing a semiconductor device, comprising:
providing a substrate that includes a semiconductor layer having a main surface facing one side in a thickness direction, and a first electrode arranged on the main surface;
forming a first insulating layer on the side of the main surface of the substrate; and
forming a second insulating layer on the side of the main surface of the substrate,
wherein in the forming the first insulating layer, a first annular portion arranged over a peripheral edge portion of the first electrode and the main surface and formed in an annular shape when viewed in the thickness direction is formed,
wherein the forming the second insulating layer includes:
arranging a second annular portion that is formed in an annular portion overlapping with the first annular portion when viewed in the thickness direction and is made of a resin material; and
heating the second annular portion,
wherein the first annular portion includes a first outer end boundary line extending in a first direction orthogonal to the thickness direction, and a second outer end boundary line connected to the first outer end boundary line and extending in a second direction orthogonal to both the thickness direction and the first direction, wherein the second annular portion includes a third outer end boundary line located outside the first outer end boundary line in the second direction, and a fourth outer end boundary line located outside the second outer end boundary line in the first direction, when viewed in the thickness direction, wherein the third outer end boundary line includes:
a center portion in the first direction; and
an end portion near the fourth outer end boundary line;

wherein a first distance, which is a distance between the first outer end boundary line and the third outer end boundary line in the second direction, is set to be larger at the end portion of the third outer end boundary line than at the center portion of the third outer end boundary line in the first direction, wherein the fourth outer end boundary line includes:
a center portion in the second direction; and
an end portion near the third outer end boundary line:

wherein a second distance, which is a distance between the second outer end boundary line and the fourth outer end boundary line in the first direction, is set to be larger at the end portion of the fourth outer end boundary line than at the center portion of the fourth outer end boundary line in the second direction, wherein the first annular portion includes a first inner end boundary line located inside the first outer end boundary line in the second direction and a second inner end boundary line connected to the first inner end boundary line and located inside the second outer end boundary line in the first direction, when viewed in the thickness direction, and wherein the second annular portion includes a third inner end boundary line located inside the first inner end boundary line in the second direction and a fourth inner end boundary line connected to the third inner end boundary line and located inside the second inner end boundary line in the first direction, when viewed in the thickness direction.

7. The method of claim 6, wherein the third outer end boundary line includes a third outer end boundary line first portion extending linearly along the first direction, and a third outer end boundary line second portion connected to the third outer end boundary line first portion and located outside the third outer end boundary line first portion in the second direction and near the fourth outer end boundary line in the first direction, and wherein the fourth outer end boundary line includes a fourth outer end boundary line first portion extending linearly along the second direction, and a fourth outer end boundary line second portion connected to both the fourth outer end boundary line first portion and the third outer end boundary line second portion and located outside the fourth outer end boundary line first portion in the first direction.

8. The method of claim 7, wherein the third outer end boundary line second portion includes a third outer end boundary line straight line portion extending linearly along the first direction and a third outer end boundary line connecting portion connected to both the third outer end boundary line first portion and the third outer end boundary line straight line portion, and wherein the fourth outer end boundary line second portion includes a fourth outer end boundary line straight line portion connected to the third outer end boundary line straight line portion and extending linearly along the second direction, and a fourth outer end boundary line connecting portion connected to both the fourth outer end boundary line first portion and the fourth outer end boundary line straight line portion.

9. The method of claim 6, wherein the first outer end boundary line includes a first outer end boundary line first portion extending linearly along the first direction, and a first outer end boundary line second portion connected to the first outer end boundary line first portion and located inside the first outer end boundary line first portion in the second direction and near the second outer end boundary line in the first direction, and wherein the second outer end boundary line includes a second outer end boundary line first portion extending linearly along the second direction, and a second outer end boundary line second portion connected to both the second outer end boundary line first portion and the first outer end boundary line second portion and located inside the second outer end boundary line first portion in the first direction.

10. The method of claim 6, wherein the first annular portion includes a fifth inner end boundary line that is connected to the second inner end boundary line, is located inside the second inner end boundary line in the first direction when viewed in the thickness direction, and extends in the first direction, and a sixth inner end boundary line that is connected to the fifth inner end boundary line, is located on an opposite side of the first inner end boundary line with respect to the fifth inner end boundary line in the second direction, and extends in the second direction, wherein the second annular portion includes a seventh inner end boundary line connected to the fourth inner end boundary line and located inside the fifth inner end boundary line in the second direction when viewed in the thickness direction, and an eighth inner end boundary line located inside the sixth inner end boundary line in the first direction when viewed in the thickness direction, wherein the seventh inner end boundary line includes:
a center portion in the first direction; and
an end portion near the eighth inner end boundary line;

wherein a third distance, which is a distance between the fifth inner end boundary line and the seventh inner end boundary line in the second direction, is set to be larger at the end portion of the seventh inner end boundary line than at the center portion of the seventh inner end boundary line in the first direction, and wherein the eighth inner end boundary line includes:
a center portion in the second direction: and
an end portion near the seventh inner end boundary line;

wherein a fourth distance, which is a distance between the sixth inner end boundary line and the eighth inner end boundary line in the first direction, is set to be larger at the end portion of the eighth inner end boundary line than at the center portion of the eighth inner end boundary line in the second direction.

11. The method of claim 10, wherein the seventh inner end boundary line includes a seventh inner end boundary line first portion extending linearly along the first direction, and a seventh inner end boundary line second portion connected to the seventh inner end boundary line first portion and located inside the seventh inner end boundary line first portion in the second direction and near the eighth inner end boundary line in the first direction, and wherein the eighth inner end boundary line includes an eighth inner end boundary line first portion extending linearly along the second direction, and an eighth inner end boundary line second portion connected to both the eighth inner end boundary line first portion and the seventh inner end boundary line second portion and located inside the eighth inner end boundary line first portion in the first direction.

12. The method of claim 11, wherein the seventh inner end boundary line second portion includes a seventh inner end boundary line straight line portion extending linearly along the first direction, and a seventh inner end boundary line connecting portion connected to both the seventh inner end boundary line first portion and the seventh inner end boundary line straight line portion, and
   wherein the eighth inner end boundary line second portion includes an eighth inner end boundary line straight line portion connected to the seventh inner end boundary line straight line portion and extending linearly along the second direction, and an eighth inner end boundary line connecting portion connected to both the eighth inner end boundary line first portion and the eighth inner end boundary line straight line portion.

13. The method of claim 10, wherein the fifth inner end boundary line includes a fifth inner end boundary line first portion extending linearly along the first direction, and a fifth inner end boundary line second portion connected to the fifth inner end boundary line first portion and located outside the fifth inner end boundary line first portion in the second direction and near the sixth inner end boundary line in the first direction, and
   wherein the sixth inner end boundary line includes a sixth inner end boundary line first portion extending linearly along the second direction, and a sixth inner end boundary line second portion connected to both the sixth inner end boundary line first portion and the fifth inner end boundary line second portion and located outside the sixth inner end boundary line first portion in the first direction.

14. The method of claim 10, wherein the first annular portion includes a fifth outer end boundary line located outside the fifth inner end boundary line in the second direction, and a sixth outer end boundary line connected to the fifth outer end boundary line and located outside the sixth inner end boundary line in the first direction, when viewed in the thickness direction, and
   wherein the second annular portion includes a seventh outer end boundary line located outside the fifth outer end boundary line in the second direction, and an eighth outer end boundary line connected to the seventh outer end boundary line and located outside the sixth outer end boundary line in the second direction, when viewed in the thickness direction.

15. The method of claim 6, wherein a thickness of the second insulating layer is larger than a thickness of the first insulating layer.

16. The method of claim 6, wherein the second insulating layer is made of a polyimide resin.

* * * * *